United States Patent
Le et al.

(10) Patent No.: US 9,062,830 B2
(45) Date of Patent: Jun. 23, 2015

(54) HIGH EFFICIENCY SOLID STATE LAMP AND BULB

(75) Inventors: Long Larry Le, Morrisville, NC (US);
Paul Pickard, Morrisville, NC (US);
James Michael Lay, Cary, NC (US);
Tao Tong, Oxnard, CA (US); Ronan Letoquin, Fremont, CA (US); Bernd Keller, Santa Barbara, CA (US); Eric Tarsa, Goleta, CA (US); Mark Youmans, Goleta, CA (US); Theodore Lowes, Lompoc, CA (US); Nicholas W. Medendorp, Jr., Raleigh, NC (US);
Antony Van De Ven, Sai Kung (HK);
Gerald Negley, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/028,946

(22) Filed: Feb. 16, 2011

(65) Prior Publication Data

US 2011/0215699 A1    Sep. 8, 2011

Related U.S. Application Data

(63) Continuation-in-part of application No. 12/889,719, filed on Sep. 24, 2010, and a continuation-in-part of application No. 12/975,820, filed on Dec. 22, 2010.

(60) Provisional application No. 61/339,516, filed on Mar. 3, 2010, provisional application No. 61/339,515, filed (Continued)

(51) Int. Cl.
*H01J 61/52*     (2006.01)
*H01J 1/62*      (2006.01)
(Continued)

(52) U.S. Cl.
CPC . *F21K 9/135* (2013.01); *F21V 3/00* (2013.01); *F21K 9/56* (2013.01); *F21Y 2101/02* (2013.01);
(Continued)

(58) Field of Classification Search
CPC ....... F21V 29/22; F21V 29/2206; F21V 7/20;
F21V 13/08; F21K 9/135; F21K 9/56; F21K 9/00–9/137; H01L 21/00; H01L 33/64;
F21Y 2101/02
USPC .................. 362/84, 293, 294, 311.06; 313/46
See application file for complete search history.

(56) References Cited

U.S. PATENT DOCUMENTS 3,143,592 A    8/1964 August ........................ 174/16.3
3,581,162 A    5/1971 Wheatley
(Continued)

FOREIGN PATENT DOCUMENTS

CN    1425117       6/2003
CN    1465106 A    12/2003
(Continued)

OTHER PUBLICATIONS

International Search Report and Written Opinion for PCT/US2011/000400 mailed May 2, 2011.
(Continued)

*Primary Examiner* — Sikha Roy
(74) *Attorney, Agent, or Firm* — Koppel, Patrick, Heybl & Philpott

(57) ABSTRACT

Solid state lamps and bulbs comprising different combinations and arrangements of a light source, one or more wavelength conversion materials, regions or layers which are positioned separately or remotely with respect to the light source, and a separate diffuser. These are arranged on a heat sink in a manner that allows for the fabrication of lamps and bulbs that are efficient, reliable and cost effective and can provide an essentially omnidirectional emission pattern, even with a light source comprised of a co-planar arrangement of LEDs. Additionally, this arrangement allows aesthetic masking or concealment of the appearance of the conversion regions or layers when the lamp is not illuminated. Various embodiments of the invention may be used to address many of the difficulties associated with utilizing efficient solid state light sources such as LEDs in the fabrication of lamps or bulbs suitable for direct replacement of traditional incandescent bulbs. Embodiments of the invention can be arranged to fit recognized standard size profiles such as those ascribed to commonly used lamps such as incandescent light bulbs, while still providing emission patterns that comply with ENERGY STAR® standards.

45 Claims, 13 Drawing Sheets

Related U.S. Application Data on Mar. 3, 2010, provisional application No. 61/366,437, filed on Jul. 21, 2010, provisional application No. 61/424,665, filed on Dec. 19, 2010, provisional application No. 61/424,670, filed on Dec. 19, 2010, provisional application No. 61/434,355, filed on Jan. 19, 2011, provisional application No. 61/435,326, filed on Jan. 23, 2011, provisional application No. 61/435,759, filed on Jan. 24, 2011.

(51) Int. Cl.
| | |
|---|---|
| F21K 99/00 | (2010.01) |
| F21V 3/00 | (2015.01) |
| F21Y 101/02 | (2006.01) |
| H01L 33/64 | (2010.01) |
| F21V 29/77 | (2015.01) |

(52) U.S. Cl.
CPC ....... *H01L 33/642* (2013.01); *H01L 2924/0002* (2013.01); *H01L 2224/48091* (2013.01); *H01L 2224/48247* (2013.01); *H01L 2224/73265* (2013.01); *F21V 29/773* (2015.01)

(56) References Cited

U.S. PATENT DOCUMENTS

| | | | |
|---|---|---|---|
| 4,204,246 A | 5/1980 | Arii et al. ................ 361/699 |
| 5,463,280 A | 10/1995 | Johnson | |
| 5,561,346 A | 10/1996 | Byrne | |
| 5,585,783 A | 12/1996 | Hall | |
| 5,655,830 A | 8/1997 | Ruskouski | |
| 5,688,042 A | 11/1997 | Madadi et al. | |
| 5,806,965 A | 9/1998 | Deese | |
| 5,890,794 A | 4/1999 | Abtahi et al. | |
| 5,947,588 A | 9/1999 | Huang | |
| 5,949,347 A | 9/1999 | Wu | |
| 6,220,722 B1 | 4/2001 | Begemann | |
| 6,227,679 B1 | 5/2001 | Zhang et al. | |
| 6,234,648 B1 | 5/2001 | Borner et al. | |
| 6,250,774 B1 | 6/2001 | Begemann et al. | |
| 6,270,722 B1 | 8/2001 | Yang et al. ................ 422/37 |
| 6,276,822 B1 | 8/2001 | Bedrosian et al. | |
| 6,350,041 B1 | 2/2002 | Tarsa | |
| 6,404,131 B1* | 6/2002 | Kawano et al. .......... 315/82 |
| 6,465,961 B1 | 10/2002 | Cao ........................ 5/58 |
| 6,517,221 B1 | 2/2003 | Xie ........................ 362/373 |
| 6,523,978 B1 | 2/2003 | Huang | |
| 6,550,953 B1 | 4/2003 | Ichikawa et al. | |
| 6,634,770 B2 | 10/2003 | Cao | |
| 6,659,632 B2 | 12/2003 | Chen | |
| 6,709,132 B2 | 3/2004 | Ishibashi | |
| 6,746,885 B2 | 6/2004 | Cao ........................ 438/26 |
| 6,803,607 B1 | 10/2004 | Chan et al. | |
| 6,848,819 B1 | 2/2005 | Arndt et al. | |
| 6,864,513 B2 | 3/2005 | Lin et al. | |
| 6,910,794 B2 | 6/2005 | Rice ........................ 362/547 |
| 6,948,829 B2 | 9/2005 | Verdes et al. | |
| 6,982,518 B2 | 1/2006 | Chou et al. | |
| 7,048,412 B2 | 5/2006 | Martin et al. | |
| 7,080,924 B2 | 7/2006 | Tseng et al. | |
| 7,086,756 B2 | 8/2006 | Maxik | |
| 7,086,767 B2 | 8/2006 | Sidwell et al. | |
| 7,094,362 B2 | 8/2006 | Setlur et al. ............. 252/301 |
| 7,140,753 B2 | 11/2006 | Wang et al. .............. 251/294 |
| 7,144,135 B2 | 12/2006 | Martin et al. | |
| 7,160,012 B2 | 1/2007 | Hilscher et al. .......... 362/555 |
| 7,165,866 B2 | 1/2007 | Li | |
| 7,172,314 B2 | 2/2007 | Currie et al. | |
| 7,213,940 B1 | 5/2007 | Van De Ven et al. | |
| D546,980 S | 7/2007 | Lo et al. | |
| 7,270,446 B2 | 9/2007 | Chang et al. ............. 362/294 |
| D553,267 S | 10/2007 | Yuen | |
| 7,350,936 B2* | 4/2008 | Ducharme et al. ....... 362/231 |
| 7,354,174 B1 | 4/2008 | Yan | |
| 7,377,674 B2 | 5/2008 | Klinkman et al. ........ 362/484 |
| 7,396,142 B2 | 7/2008 | Laizure, Jr. et al. | |
| 7,405,857 B2 | 7/2008 | Ma et al. ................. 359/261 |
| D581,556 S * | 11/2008 | To et al. .................. D26/2 |
| 7,545,782 B2 | 6/2009 | Ng et al. .................. 362/555 |
| 7,547,124 B2 | 6/2009 | Chang et al. ............. 362/373 |
| 7,600,882 B1* | 10/2009 | Morejon et al. ........... 362/84 |
| 7,607,802 B2 | 10/2009 | Kang et al. ............... 362/294 |
| 7,614,759 B2 | 11/2009 | Negley | |
| 7,618,157 B1 | 11/2009 | Galvez et al. | |
| 7,663,315 B1 | 2/2010 | Hulse | |
| 7,686,478 B1 | 3/2010 | Hulse | |
| 7,726,836 B2 | 6/2010 | Chen | |
| 7,740,365 B2 | 6/2010 | Huttner et al. ............ 362/97 |
| 7,753,568 B2 | 7/2010 | Hu et al. .................. 362/373 |
| 7,810,954 B2 | 10/2010 | Kolodin .................... 362/277 |
| 7,824,065 B2 | 11/2010 | Maxik | |
| D629,928 S | 12/2010 | Chen et al. | |
| 7,884,538 B2 | 2/2011 | Mitsuishi et al. .......... 313/502 |
| 7,976,335 B2 | 7/2011 | Weber et al. .............. 439/487 |
| 8,021,025 B2 | 9/2011 | Lee | |
| 8,235,571 B2 | 8/2012 | Park ......................... 362/555 |
| 8,253,316 B2 | 8/2012 | Sun et al. | |
| 8,272,762 B2 | 9/2012 | Maxik et al. | |
| 8,274,241 B2 | 9/2012 | Guest et al. .............. 315/294 |
| 8,277,082 B2 | 10/2012 | Dassanayake et al. | |
| 8,282,250 B1 | 10/2012 | Dassanayake et al. | |
| 8,292,468 B2 | 10/2012 | Narendran et al. | |
| 8,309,969 B2 | 11/2012 | Suehiro et al. ............ 257/79 |
| 8,322,896 B2 | 12/2012 | Falicoff et al. | |
| 8,348,470 B2 | 1/2013 | Liu et al. ................. 362/294 |
| 8,371,722 B2 | 2/2013 | Carroll | |
| 8,400,051 B2 | 3/2013 | Hakata et al. | |
| 8,410,512 B2 | 4/2013 | Andrews .................. 257/99 |
| 8,415,865 B2 | 4/2013 | Liang et al. | |
| 8,421,320 B2 | 4/2013 | Chuang | |
| 8,421,321 B2 | 4/2013 | Chuang | |
| 8,421,322 B2 | 4/2013 | Carroll et al. | |
| 8,449,154 B2 | 5/2013 | Uemoto et al. | |
| 8,502,468 B2 | 8/2013 | Li et al. | |
| 8,568,009 B2 | 10/2013 | Chiang et al. ............ 362/563 |
| 8,641,237 B2 | 2/2014 | Chuang | |
| 8,653,723 B2 | 2/2014 | Cao et al. | |
| 8,696,168 B2 | 4/2014 | Li et al. | |
| 8,740,415 B2 | 6/2014 | Wheelock | |
| 8,750,671 B1 | 6/2014 | Kelly et al. | |
| 8,752,984 B2 | 6/2014 | Lenk et al. | |
| 8,760,042 B2 | 6/2014 | Sakai et al. | |
| 2002/0047516 A1 | 4/2002 | Iwasa et al. .............. 313/512 |
| 2003/0021113 A1 | 1/2003 | Begemann | |
| 2003/0038291 A1 | 2/2003 | Cao | |
| 2004/0159846 A1 | 8/2004 | Doxsee | |
| 2004/0201990 A1 | 10/2004 | Meyer | |
| 2004/0223315 A1 | 11/2004 | Suehiro et al. ........... 362/84 |
| 2005/0068776 A1* | 3/2005 | Ge ........................... 362/296 |
| 2005/0168990 A1 | 8/2005 | Nagata et al. ............ 362/294 |
| 2005/0174780 A1 | 8/2005 | Park ......................... 362/294 |
| 2005/0184638 A1 | 8/2005 | Mueller et al. ........... 313/485 |
| 2005/0242711 A1 | 11/2005 | Bloomfield | |
| 2005/0276053 A1 | 12/2005 | Nortrup et al. ........... 362/294 |
| 2006/0097245 A1 | 5/2006 | Aanegola et al. ........ 257/26 |
| 2006/0097385 A1* | 5/2006 | Negley ..................... 257/722 |
| 2006/0105482 A1 | 5/2006 | Alferink et al. .......... 438/22 |
| 2006/0138435 A1 | 6/2006 | Tarsa et al. .............. 257/89 |
| 2006/0152140 A1 | 7/2006 | Brandes ................... 313/503 |
| 2006/0180774 A1 | 8/2006 | Endo ........................ 250/485.1 |
| 2006/0227558 A1* | 10/2006 | Osawa et al. ............. 362/351 |
| 2007/0090737 A1 | 4/2007 | Hu et al. .................. 313/11 |
| 2007/0139938 A1 | 6/2007 | Petroski | |
| 2007/0139949 A1 | 6/2007 | Tanda et al. ............. 362/551 |
| 2007/0158668 A1 | 7/2007 | Tarsa et al. ............... 257/98 |
| 2007/0206375 A1 | 9/2007 | Lys et al. | |
| 2007/0215890 A1 | 9/2007 | Harbers et al. ........... 257/98 |
| 2007/0223219 A1 | 9/2007 | Medendorp | |
| 2007/0263405 A1 | 11/2007 | Ng et al. .................. 362/555 |
| 2007/0267976 A1 | 11/2007 | Bohler et al. ............ 315/112 |
| 2007/0274080 A1 | 11/2007 | Negley et al. ............ 362/341 |
| 2007/0285924 A1 | 12/2007 | Morris et al. ............ 362/264 |
| 2007/0297183 A1 | 12/2007 | Coushaine | |

(56) References Cited

U.S. PATENT DOCUMENTS

| | | |
|---|---|---|
| 2008/0037257 A1 | 2/2008 | Bolta |
| 2008/0055908 A1 | 3/2008 | Wu et al. .................. 362/294 |
| 2008/0062694 A1 | 3/2008 | Lai et al. .................. 362/294 |
| 2008/0080165 A1 | 4/2008 | Kim et al. |
| 2008/0093615 A1 | 4/2008 | Lin et al. .................... 257/98 |
| 2008/0106893 A1* | 5/2008 | Johnson et al. ............ 362/228 |
| 2008/0117620 A1 | 5/2008 | Hama et al. ................. 362/84 |
| 2008/0128735 A1 | 6/2008 | Yoo et al. |
| 2008/0149166 A1 | 6/2008 | Beeson et al. .............. 136/248 |
| 2008/0173884 A1 | 7/2008 | Chitnis et al. ............... 257/98 |
| 2008/0179611 A1 | 7/2008 | Chitnis et al. ............... 257/98 |
| 2008/0232119 A1 | 9/2008 | Ribarich .................... 362/373 |
| 2008/0285279 A1 | 11/2008 | Ng et al. ................... 362/294 |
| 2008/0308825 A1 | 12/2008 | Chakraborty et al. ......... 257/98 |
| 2009/0001399 A1 | 1/2009 | Diana et al. .................... 23/98 |
| 2009/0015137 A1 | 1/2009 | Su et al. .................... 313/503 |
| 2009/0040760 A1 | 2/2009 | Chen et al. ................. 362/249 |
| 2009/0046473 A1 | 2/2009 | Tsai et al. .................. 362/373 |
| 2009/0058256 A1 | 3/2009 | Mitsuishi et al. ............ 313/487 |
| 2009/0059559 A1 | 3/2009 | Pabst |
| 2009/0086492 A1 | 4/2009 | Meyer |
| 2009/0095960 A1 | 4/2009 | Murayama .................... 257/79 |
| 2009/0101930 A1 | 4/2009 | Li |
| 2009/0103293 A1 | 4/2009 | Harbers et al. |
| 2009/0103296 A1 | 4/2009 | Harbers et al. |
| 2009/0116217 A1 | 5/2009 | Teng et al. |
| 2009/0175041 A1 | 7/2009 | Yuen et al. |
| 2009/0184618 A1 | 7/2009 | Hakata et al. |
| 2009/0190353 A1 | 7/2009 | Barker ....................... 362/249 |
| 2009/0195186 A1* | 8/2009 | Guest et al. ................. 315/294 |
| 2009/0201679 A1 | 8/2009 | Konaka ...................... 362/235 |
| 2009/0217970 A1 | 9/2009 | Zimmerman et al. ......... 136/252 |
| 2009/0262516 A1* | 10/2009 | Li ............................. 362/84 |
| 2009/0273924 A1 | 11/2009 | Chiang ....................... 362/241 |
| 2009/0283779 A1 | 11/2009 | Negley et al. ................. 257/88 |
| 2009/0296387 A1 | 12/2009 | Reisenauer et al. .......... 362/235 |
| 2009/0316073 A1 | 12/2009 | Chen et al. .................. 349/64 |
| 2009/0316383 A1 | 12/2009 | Son |
| 2009/0322197 A1 | 12/2009 | Helbing |
| 2009/0322208 A1 | 12/2009 | Shaikevitch et al. ......... 313/503 |
| 2009/0322800 A1* | 12/2009 | Atkins ....................... 345/690 |
| 2009/0323333 A1 | 12/2009 | Chang |
| 2010/0014839 A1 | 1/2010 | Benoy et al. ................ 386/117 |
| 2010/0020547 A1 | 1/2010 | Olsson ....................... 362/311 |
| 2010/0025700 A1 | 2/2010 | Jung et al. |
| 2010/0026185 A1 | 2/2010 | Betsuda et al. ............... 315/32 |
| 2010/0027258 A1 | 2/2010 | Maxik et al. ................. 362/240 |
| 2010/0038660 A1 | 2/2010 | Shuja ......................... 257/98 |
| 2010/0046231 A1 | 2/2010 | Medinis ...................... 362/294 |
| 2010/0060144 A1 | 3/2010 | Justel et al. ................. 313/503 |
| 2010/0091487 A1* | 4/2010 | Shin ........................... 362/235 |
| 2010/0096967 A1 | 4/2010 | Marinus et al. ............... 313/46 |
| 2010/0102707 A1 | 4/2010 | Fukuda et al. ............... 313/503 |
| 2010/0134047 A1 | 6/2010 | Hasnain |
| 2010/0140655 A1 | 6/2010 | Shi ............................ 257/99 |
| 2010/0149783 A1 | 6/2010 | Takenaka et al. ............. 362/84 |
| 2010/0149814 A1 | 6/2010 | Zhai et al. .................... 257/88 |
| 2010/0155763 A1 | 6/2010 | Donofrio |
| 2010/0170075 A1 | 7/2010 | Kanade et al. ................. 29/428 |
| 2010/0177522 A1 | 7/2010 | Lee ........................... 362/373 |
| 2010/0201284 A1 | 8/2010 | Kraus |
| 2010/0207502 A1 | 8/2010 | Cao et al. ..................... 313/46 |
| 2010/0219735 A1* | 9/2010 | Sakai et al. ................... 313/46 |
| 2010/0232134 A1 | 9/2010 | Tran .......................... 362/84 |
| 2010/0264799 A1 | 10/2010 | Liu et al. ..................... 313/46 |
| 2010/0314985 A1 | 12/2010 | Premysler .................... 313/46 |
| 2010/0327745 A1 | 12/2010 | Dassanayake et al. |
| 2010/0328925 A1 | 12/2010 | Hoelen et al. ................. 362/84 |
| 2011/0037368 A1 | 2/2011 | Huang ........................ 313/46 |
| 2011/0074271 A1 | 3/2011 | Takeshi et al. ................ 313/46 |
| 2011/0074296 A1 | 3/2011 | Shen et al. |
| 2011/0080096 A1 | 4/2011 | Dudik et al. ................. 315/112 |
| 2011/0080740 A1* | 4/2011 | Allen et al. .................. 362/294 |
| 2011/0089804 A1 | 4/2011 | Mahalingam et al. ........ 313/46 |
| 2011/0089830 A1 | 4/2011 | Pickard et al. ................ 315/32 |
| 2011/0095686 A1 | 4/2011 | Falicoff et al. ................. 315/35 |
| 2011/0133222 A1 | 6/2011 | Allen et al. .................... 257/88 |
| 2011/0175528 A1* | 7/2011 | Rains et al. ................... 315/51 |
| 2011/0176316 A1 | 7/2011 | Phipps et al. |
| 2011/0205733 A1 | 8/2011 | Lenderink et al. ........... 362/231 |
| 2011/0215696 A1 | 9/2011 | Tong et al. ................... 313/46 |
| 2011/0216523 A1 | 9/2011 | Tong et al. ................... 362/84 |
| 2011/0242816 A1 | 10/2011 | Chowdhury et al. ......... 362/294 |
| 2011/0267835 A1 | 11/2011 | Boonekamp et al. ......... 362/555 |
| 2011/0273072 A1 | 11/2011 | Oki ............................. 313/46 |
| 2011/0298371 A1 | 12/2011 | Brandes et al. ................ 315/32 |
| 2012/0040585 A1 | 2/2012 | Huang |
| 2012/0155059 A1 | 6/2012 | Hoelen et al. ................. 362/84 |
| 2012/0161626 A1 | 6/2012 | Van De Ven et al. ......... 315/35 |
| 2012/0320591 A1 | 12/2012 | Liao et al. ................... 362/249 |
| 2013/0049018 A1 | 2/2013 | Ramer et al. ................. 257/81 |
| 2013/0063945 A1 | 3/2013 | Wu et al. ..................... 362/249 |
| 2013/0249374 A1 | 9/2013 | Le et al. ...................... 313/12 |

FOREIGN PATENT DOCUMENTS

| | | |
|---|---|---|
| CN | 1802533 | 7/2006 |
| CN | 101262032 | 9/2008 |
| CN | 1013388887 A | 1/2009 |
| CN | 101641623 | 2/2010 |
| DE | 10251955 A1 | 5/2004 |
| DE | 102004051382 | 4/2006 |
| DE | 102006061164 | 6/2008 |
| DE | 10 2007 037862 A1 | 10/2008 |
| DE | 202008013667 | 12/2008 |
| DE | 102011004718 | 8/2012 |
| EP | 0876085 A2 | 11/1998 |
| EP | 0890059 A1 | 1/1999 |
| EP | 0876085 | 11/1999 |
| EP | 1058221 A2 | 12/2000 |
| EP | 1881259 | 1/2008 |
| EP | 2146135 A2 | 1/2010 |
| EP | 2154420 | 2/2010 |
| EP | 2469154 | 6/2012 |
| FR | 2941346 | 7/2010 |
| GB | 2345954 A | 7/2000 |
| GB | 2 366 610 A | 3/2002 |
| GB | 2366610 | 3/2002 |
| GB | 2366610 A | 3/2002 |
| JP | H03081903 | 4/1991 |
| JP | H06283006 | 10/1994 |
| JP | H09265807 | 10/1997 |
| JP | H11177149 | 7/1999 |
| JP | 11-213730 A | 8/1999 |
| JP | H11260125 | 9/1999 |
| JP | 2000022222 | 1/2000 |
| JP | 2000173304 | 6/2000 |
| JP | 2001118403 | 4/2001 |
| JP | 2003515899 | 5/2003 |
| JP | 2004146225 | 5/2004 |
| JP | 2004241318 | 8/2004 |
| JP | 2005-093097 A | 4/2005 |
| JP | 20051008700 | 4/2005 |
| JP | 2005244226 | 9/2005 |
| JP | 2005-286267 A | 10/2005 |
| JP | 2005277127 | 10/2005 |
| JP | 2006019676 | 1/2006 |
| JP | 2006108661 | 4/2006 |
| JP | 2008091140 | 4/2006 |
| JP | 2006065558 | 6/2006 |
| JP | 2006148147 | 6/2006 |
| JP | 2006156187 | 6/2006 |
| JP | 20066159187 | 6/2006 |
| JP | WO2006065558 | 6/2006 |
| JP | 200640850 A | 9/2006 |
| JP | 2006525648 | 11/2006 |
| JP | 2006331683 | 12/2006 |
| JP | 200759930 | 3/2007 |
| JP | 2007059911 | 3/2007 |
| JP | 3138653 | 12/2007 |
| JP | 2008505448 | 2/2008 |
| JP | 2008091140 | 4/2008 |
| JP | 2008108835 | 5/2008 |
| JP | 2008523639 | 7/2008 |

(56) References Cited

FOREIGN PATENT DOCUMENTS

| | | |
|---|---|---|
| JP | 2008187195 | 8/2008 |
| JP | 2008262765 | 10/2008 |
| JP | 200828183 | 11/2008 |
| JP | 2008288409 | 11/2008 |
| JP | 2008300117 | 12/2008 |
| JP | 2008300203 | 12/2008 |
| JP | 2008300570 | 12/2008 |
| JP | 2009-016058 A | 1/2009 |
| JP | 2009016058 | 1/2009 |
| JP | 2009016153 | 1/2009 |
| JP | 2009021264 | 1/2009 |
| JP | 2009117346 | 5/2009 |
| JP | WO2009093163 | 7/2009 |
| JP | 3153766 | 8/2009 |
| JP | U3153766 | 8/2009 |
| JP | WO2009119038 | 10/2009 |
| JP | 2009266780 | 11/2009 |
| JP | 2009277586 | 11/2009 |
| JP | 2009295299 | 12/2009 |
| JP | 2010016223 | 1/2010 |
| JP | 2010040494 | 2/2010 |
| JP | 2010050473 | 3/2010 |
| JP | 2010129300 | 6/2010 |
| JP | 2010267826 | 11/2010 |
| KR | 3020110008445 | 3/2001 |
| KR | 100944181 | 2/2010 |
| KR | 1020100037353 | 4/2010 |
| KR | 100980588 B1 | 9/2010 |
| TW | D134005 | 3/2010 |
| TW | 100300960 | 3/2011 |
| TW | D141681 | 7/2011 |
| WO | WO 2000/017569 A1 | 3/2000 |
| WO | WO0124583 A1 | 4/2001 |
| WO | WO 01/40702 A1 | 6/2001 |
| WO | WO0160119 A2 | 8/2001 |
| WO | WO2004100213 A2 | 5/2004 |
| WO | WO2004100213 | 11/2004 |
| WO | WO2005107420 A2 | 11/2005 |
| WO | WO2006059535 A2 | 6/2006 |
| WO | WO2006065558 | 6/2006 |
| WO | WO 2007/130358 A2 | 11/2007 |
| WO | WO2007146566 A2 | 12/2007 |
| WO | WO 2008/018002 A2 | 2/2008 |
| WO | WO2008018002 | 2/2008 |
| WO | WO2008134056 A1 | 4/2008 |
| WO | WO 2008/052318 A1 | 5/2008 |
| WO | WO 2008/117211 A1 | 10/2008 |
| WO | WO 2008/146229 A2 | 12/2008 |
| WO | WO2008146229 | 12/2008 |
| WO | WO 2009/024952 A2 | 2/2009 |
| WO | WO2009052099 | 4/2009 |
| WO | WO 2009/091562 A2 | 7/2009 |
| WO | WO 2009/093163 A2 | 7/2009 |
| WO | WO2009091562 | 7/2009 |
| WO | WO2009093163 | 7/2009 |
| WO | WO2009093163 A2 | 7/2009 |
| WO | WO 2009/107052 A1 | 9/2009 |
| WO | WO2009107052 | 9/2009 |
| WO | WO 2009/119038 A2 | 10/2009 |
| WO | WO 2009/128004 A1 | 10/2009 |
| WO | WO2009119038 | 10/2009 |
| WO | WO2009125314 A2 | 10/2009 |
| WO | WO2009131627 | 10/2009 |
| WO | WO2009143047 A2 | 11/2009 |
| WO | WO 2009/158422 A1 | 12/2009 |
| WO | WO2009148543 | 12/2009 |
| WO | WO2009158422 | 12/2009 |
| WO | WO2009158422 A1 | 12/2009 |
| WO | WO 2010/012999 A2 | 2/2010 |
| WO | WO2010012999 | 2/2010 |
| WO | WO2010013893 | 2/2010 |
| WO | WO2010052640 | 5/2010 |
| WO | WO 2010/119618 A1 | 10/2010 |
| WO | WO 2010/128419 A1 | 11/2010 |
| WO | WO2011100193 | 8/2011 |
| WO | WO2011109091 A1 | 9/2011 |
| WO | WO2011109098 | 9/2011 |
| WO | WO2012011279 | 1/2012 |
| WO | WO2012031533 | 3/2012 |

OTHER PUBLICATIONS

Cree XLAMP®XP-G LED, Product Info and Data Sheet, 14 Pages.
Cree XLAMP® XP-E LED, Product Info and Data Sheet, 20 Pages.
International Search Report and Written Opinion for PCT/US2011/000403 mailed Aug. 23, 2011.
International Search Report and Written Opinion for PCT/US2011/000404 mailed Aug. 25, 2011.
International Search Report and Written Opinion for PCT/US2011/000398 mailed Aug. 30, 2011.
International Search Report and Written Opinion for PCT/US2011/000406 mailed Sep. 15, 2011.
International Search Report and Written Opinion for PCT Application No. PCT/US2011/000391 mailed Oct. 6, 2011.
International Search Report and Written Opinion for PCT Application No. PCT/US2011/000402 mailed Sep. 30, 2011.
International Search Report and Written Opinion, PCT/US2009/063804, Mailed on Feb. 26, 2010.
U.S. Appl. No. 12/566,195, Van De Ven, filed Sep. 24, 2009.
U.S. Appl. No. 12/704,730, Van De Ven, filed Feb. 12, 2010.
C.Crane Geobulb®—II LED Light Bulb. Item #2SW, Description, p. 1-2.
C.Crane Geobulb®—II LED Light Bulb, Item #2SW, Specs, p. 1-2.
Cree LR4, 4" Recessed Architectural Downlight, Product Info p. 1-2.
Cree LR6, 6" Recessed Downlight Module, Product Info, p. 1-2.
U.S. Appl. No. 12/901,405, filed Oct. 8, 2010, Tong.
U.S. Appl. No. 61/339,515, filed Mar. 3, 2010, Tong.
U.S. Appl. No. 12/848,825, filed Aug. 2, 2010, Tong.
U.S. Appl. No. 12/975,820, Van De Ven.
U.S. Appl. No. 13/029,063, filed Feb. 16, 2011, Hussell.
U.S. Appl. No. 61/424,670, filed Dec. 19, 2010, Zonojie Yuan.
U.S. Appl. No. 11/656,759, filed Jan. 22, 2007 Chitnis.
U.S. Appl. No. 11/899,790, filed Sep. 7, 2007 Chitnis.
U.S. Appl. No. 11/473,089, filed Jun. 21, 2006 Tarsa.
U.S. Appl. No. 61/435,759, filed Jan. 24, 2011 Le.
U.S. Appl. No. 61/339,516, filed Mar. 3, 2010 Tong.
International Search Report and Written Opinion for PCT Application No. PCT/US2011/000397 mailed May 24, 2011.
International Search Report and Written Opinion for PCT Application No. PCT/US2010/003146 mailed Jun. 7, 2011.
Decision for Final Rejection for Japanese Patent Application No. 2001-542133 mailed Jun. 28, 2011.
International Search Report and Written Opinion for PCT Application No. PCT/US2011/000399 mailed Jul. 12, 2011.
Decision to Refuse a European Patent Application for EP 09 152 962.8 dated Jul. 6, 2011.
International Search Report and Written Opinion for PCT Patent Application No. PCT/US2011/000405 mailed Nov. 2, 2011.
International Search Report and Written Opinion for PCT/US2011/000407 mailed Nov. 16, 2011.
Office Action of the IPO for Taiwan Patent Application No. TW 100300962 issued Nov. 21, 2011.
Office Action of the IPO for Taiwan Patent Application No. TW 100300961 issued Nov. 16, 2011.
Office Action of the IPO for Taiwan Patent Application No. TW 100300960 issued Nov. 15, 2011.
Office Action of the IPO for Taiwan Patent Application No. TW 100302770 issued Jan. 13, 2012.
Notice to Submit a Response from Korean Design Patent Application No. 30-2011-0024961, dated Sep. 10, 2012.
Notice to Submit A Response from Korean Patent Application No. 30-2011-0008448, dated Apr. 16, 2012.
Notice to Submit A Response from Korean Patent Application No. 30-2011-0008445, dated Apr. 16, 2012.
Notice to Submit A Response from Korean Patent Application No. 30-2011-0008446, dated Apr. 16, 2012.
Office Action for Taiwanese Patent Application No. 100300961, dated May 7, 2012.

(56) References Cited

OTHER PUBLICATIONS

Office Action from Taiwanese Patent Application No. 100300960, dated May 7, 2012.
International Search Report and Written Opinion from PCT Application No. PCT/US2012/044705 dated Oct. 9, 2012.
Notice to Submit a Response from Korean Patent Application No. 30-2011-0008446, dated Oct. 22, 2012.
International Search Report and Written Opinion from PCT Application No. PCT/US2011/000389, dated May 6, 2013.
International Search Report and Written Opinion from PCT Application No. PCT/US2011/000390, dated May 6, 2013.
International Preliminary Report on Patentability from PCT/US2011/00389, dated May 8, 2013.
International Preliminary Report on Patentability from PCT/US2011/000390, dated May 8, 2013.
Reasons for Rejection from Japanese Patent Appl. No. 2011-198454. dated Mar. 7, 2013.
Search Report and Written Opinion from PCT Application No. PCT/US2012/072108, dated Feb 27, 2013.
Office Action from U.S. Appl. No. 13/029,025, dated Jul. 16, 2013.
Office Action from U.S. Appl. No. 13/430,478, dated Jun. 18, 2013.
Office Action from U.S. Appl. No. 12/901,405, dated Jul. 1, 2013.
Office Action from U.S. Appl. No. 13/018,291, dated Oct. 10, 2012.
Response to OA from U.S. Appl. No. 13/018,291, filed Jan. 7, 2013.
Office Action from U.S. Appl. No. 13/022,490, dated Nov. 7, 2012.
Response to OA from U.S. Appl. No. 13/022,490, filed Feb. 1, 2013.
Office Action from U.S. Appl. No. 13/034,501, dated Dec. 3, 2012.
Response to OA from U.S. Appl. No. 13/034,501, filed Apr. 3, 2013.
Office Action from U.S. Appl. No. 13/029,005, dated Jan. 24, 2013.
Office Action from U.S. Appl. No. 12/901,405, dated Jan. 9, 2013.
Response to OA from U.S. Appl. No. 12/901,405, filed Apr. 29, 2013.
Office Action from U.S. Appl. No. 12/985,275, dated Feb. 28, 2013.
Response to OA from U.S. Appl. No. 12/985,275, filed May 28, 2013.
Office Action from U.S. Appl. No. 13/018,291, dated Mar. 20, 2013.
Response to OA from U.S. Appl. No. 13/018,291, filed May 20, 2013.
Office Action from U.S. Appl. No. 13/022,490, dated Apr. 2, 2013.
Office Action from U.S. Appl. No. 13/018,291, dated May 31, 2013.
Office Action from U.S. Appl. No. 12/636,958, dated Jul. 19, 2012.
Response to OA from U.S. Appl. No. 12/636,958, filed Nov. 19, 2012.
Office Action from U.S. Appl. No. 13/054,501, dated May 31, 2013.
Office Action from U.S. Appl. No. 13/028,913, dated Apr. 29, 2013.
Office Action from U.S. Appl. No. 13/029,005, dated Jan. 4, 2013.
Response to OA from U.S. Appl. No. 13/029,005, filed Apr. 17, 2013.
Office Action from U.S. Appl. No. 12/848,825, dated Nov. 5, 2012.
Response to CA from U.S. Appl. No. 12/848,825, filed Feb. 5, 2013.
Office Action from U.S. Appl. No. 13/029,035, dated Jun. 11, 2013.
Notice of Reasons for Rejection from Japanese Patent Appl No. 2012-543086, dated Aug. 27, 2013.
Decision of Dismissal of Amendment, Decision of Rejection from Japanese Patent Appl. No. 2011-231319, dated Oct. 15, 2013.
Office Action from Japanese Patent Appl. No. 2012-556063, dated Oct. 11, 2013.
Office Action from Japanese Patent Appl. No. 2012-556066, dated Oct. 25, 2013.
Office Action from Japanese Patent Appl. No. 2012-556065, dated Oct. 25, 2013.
Office Action from Japanese Patent Appl No. 2012-556066, dated Mar. 14, 2014.
Office Action from Japanese Patent appl. No. 2012-556063, dated Jan. 28, 2014.
Comments on the Written Opinion and Amendment of the Application from European Patent appl. No. 12740244.4, dated Feb. 20, 2014.
International Search Report and Written Opinion from PCT/US2013/057712 dated Feb. 4, 2014.
Office Action from U.S. Appl. No. 11/149,999, dated Jan. 15, 2014.
Office Action from U.S. Appl. No. 13/034,501, dated Jan. 23, 2014.
First Office Action from Chinese Patent Appl. No. 201080062056.X, dated Feb. 12, 2014.
Office Action from U.S. Appl. No. 13/028,913, dated Feb. 19, 2014.
Office Action from U.S. Appl. No. 13/028,863, dated Mar. 4, 2014.
Office Action from U.S. Appl. No. 13/430,478, dated Feb. 21, 2014.
Office Action from U.S. Appl. No. 13/358,901, dated Mar. 6, 2014.
Office Action from U.S. Appl. No. 13/018,291, dated Mar. 7, 2014.
Office Action from U.S. Appl. No. 13/029,025, dated Mar. 19, 2014.
Office Action from U.S. Appl. No. 13/029,063, dated Apr. 1, 2014.
Office Action from U.S. Appl. No. 12/985,275, dated Apr. 10, 2014.
Office Action from U.S. Appl. No. 13/029,068, dated Apr. 24, 2014.
Office Action from U.S. Appl. No. 13/034,501, dated May 5, 2014.
Office Action from U.S. Appl. No. 13/022,490, dated May 6, 2014.
Office Action from U.S. Appl. No. 13/028,863, dated May 9, 2014.
First Office Action from Chinese Patent Application No. 2011800207069, dated May 5, 2014.
First Office Action from Chinese Patent Application No. 201180022606, dated May 4, 2014.
First Office Action from Chinese Patent Appl. No. 201180020709.2, dated May 4, 2014.
Office Action from U.S. Appl. No. 13/028,913, dated May 22, 2014.
Office Action from U.S. Appl. No. 13/029,066, dated Jun. 13, 2014.
Office Action from U.S. Appl. No. 13/018,245, dated Jun. 10, 2014.
Decision to Grant from Japanese Patent Appl. No. 2012-556066, dated Jul. 4, 2014.
Decision of Rejection from Japanese Patent Appl. No. 2012-556064, dated Jun. 6, 2014.
First Office Action from Chinese Patent Appl. No. 2011800223837, dated Jul. 24, 2014.
Office Action from European Patent Appl. No. 11710906.6-1757, dated Sep. 10, 2014.
First Office Action from Chinese Patent Appl. No. 2011800223856, dated Aug. 1, 2014.
First Office Action from Chinese Patent Appl. No. 2011800226248, dated Aug. 25, 2014.
Official Action from European Patent Appl. No. 11710348.1-1757, dated Oct. 9, 2014.
Office Action from Japanese Patent Appl. No. 2012-556065, dated Aug. 5, 2014.
Office Action from Japanese Patent Appl. No. 2012-556062, dated Aug. 5, 2014.
Notice of Reasons for Rejection from Japanese Patent Appl. No. 2012-543086, dated Dec. 24, 2013.
Office Action from Japanese Patent Appl. No. 2012-556062, dated Dec. 20, 2013.
International Preliminary Report on Patentability and Written Opinion from PCT/US2012/044705 dated Jan. 7, 2014.
Office Action from Japanese Patent Appl. No. 2012-556064, dated Oct. 29, 2013.
Office Action from U.S. Appl. No. 13/029,063, dated Oct. 23, 2013.
Office Action from U.S. Appl. No. 13/029,068, dated Nov. 15, 2013.
Office Action from U.S. Appl. No. 13/029,025, dated Dec. 6, 2013.
First Office Action and Search Report from Chinese Patent Appl. No. 201180022620X, dated Jul. 1, 2014.
Office Action from U.S. Appl. No. 13/358,901, dated Jul. 15, 2014.
Response to OA from U.S. Appl. No. 13/358,901, filed Aug. 21, 2014.
Office Action from U.S. Appl. No. 13/340,478, dated Jul. 23, 2014.
Office Action from U.S. Appl. No. 14/014,272, dated Jul. 29, 2014.
Office Action from U.S. Appl. No. 13/029,025, dated Aug. 6, 2014.
Office Action from U.S. Appl. No. 12/985,275, dated Aug. 7, 2014.
Office Action from U.S. Appl. No. 12/901,405, dated Aug. 7, 2014.
Second Office Action from Chinese Appl. No. 201080062056.X, dated Sep. 29, 2014.
First Office Action and Search Report from Chinese Appl. No. 2011800223856, dated Aug. 1, 2014.
Communication from European Appl. No. 12816621.2-1757, dated Sep. 25, 2014.
Pretrial Report from Japanese Patent Appl. No. 2011-231319, dated Apr. 14, 2014.
Office Action from U.S. Appl. No. 13/022,490, dated Oct. 17, 2013.
Office Action from U.S. Appl. No. 11/149,999, dated May 13, 2013.
Response to OA from U.S. Appl. No. 11/149,999, filed Sep. 13, 2013.
Office Action from U.S. Appl. No. 12/985,275, dated Aug. 27, 2013.
Office Action from U.S. Appl. No. 13/358,901, dated Oct. 9, 2013.

(56) References Cited

OTHER PUBLICATIONS

Office Action from U.S. Appl. No. 13/028,863, dated Jul. 30, 2013.
Office Action from U.S. Appl. No. 13/607,300, dated Nov. 19, 2014.
Office Action from U.S. Appl. No. 13/029,025, dated Dec. 11, 2014.
Office Action from U.S. Appl. No. 13/018,245, dated Dec. 11, 2014.
Office Action from U.S. Appl. No. 13/029,068, dated Dec. 23, 2014.
Office Action from U.S. Appl. No. 12/985,275, dated Dec. 29, 2014.
Office Action from U.S. Appl. No. 13/029,068, dated Sep. 26, 2014.
Response to OA from U.S. Appl. No. 13/029,068, filed Nov. 18, 2014.
Office Action from U.S. Appl. No. 13/358,901, dated Oct. 31, 2014.
Office Action from U.S. Appl. No. 13/430,478, dated Nov. 5, 2014.
Office Action from U.S. Appl. No. 13/034,501, dated Nov. 5, 2014.
Office Action from U.S. Appl. No. 13/028,863, dated Nov. 10, 2014.
Decision to Grant from Japanese Appl. No. 2012-556062, dated Nov. 27, 2014.
Second Office Action from Chinese Patent Appl. No. 2011800207069, dated Dec. 5, 2014.
First Office Action from Chinese Appl. No. 201180022626.7, dated Nov. 15. 2014.
Second Office Action from Chinese Appl. No. 201180022606X, dated Dec. 23, 2014.
Appeal Decision from Japanese Appl. No. 2911-231319, dated Jan. 13, 2015.
Decision of Dismissal of Amendment, Decision of Rejection from Japanese Patent Appl. No. 2011-231319. dated Oct. 15, 2013.
Office Action from Japanese Patent Appl, No. 2012-556063, dated Oct 11, 2013.
Office Action from Japanese Patent Appl, No. 2012-556066, dated Oct. 25, 2013.
Office Action from Japanese Patent Appl. No. 2012-556065, dated Oct 25, 2013.
Office Action from U.S. Appl. No. 13/028,913, dated Nov. 4, 2013.
Summons to Oral Proceedings from European Patent Appl. No. 09152962/2166580, dated Jan, 29. 2015.
First Office Action from Chinese Patent Appl. No. 2011800225832, dated Jan, 20, 2015.
First Office Action from Chinese Patent Appl. No. 2011800226214, dated Dec. 25. 2014.
Examination Report from European Patent Appl. No. 11 710 906.6-1757, dated Feb. 18. 2015.
Second Office Action and Search Report from Chinese Patent Appl. No. 2011800207092, dated Jan. 22, 2015.
Examination Report from European Patent Appl. No. 11 710 348.Jan. 1757, dated Feb. 18, 2015.
Examination Report from European Patent Appl. No. 12 740 244.4 - 1757, dated Feb. 9, 2015.
Office Action from U.S. Appl. No. 13/029.063, dated Jan. 13, 2015.
Office Action from U.S. Appl. No. 14/014.272, dated Jan. 14, 2015.
Response to OA from U.S. Appl. No. 14/014,272, filed Mar. 3, 2015.
Office Action from U.S. Appl. No. 12/901,405, dated Feb. 4, 2015.

\* cited by examiner

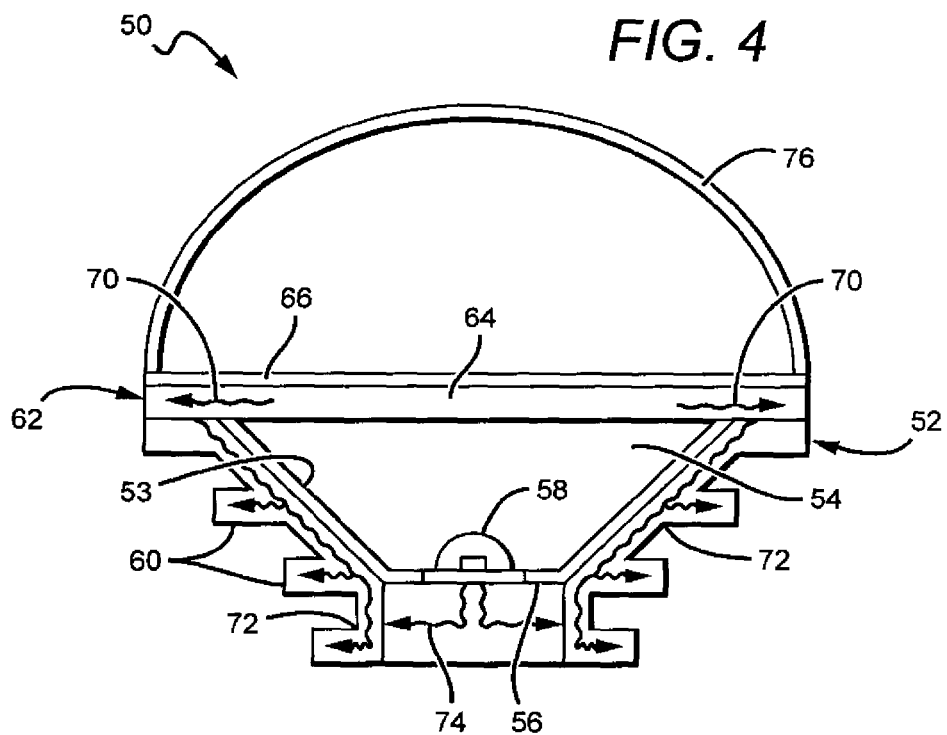
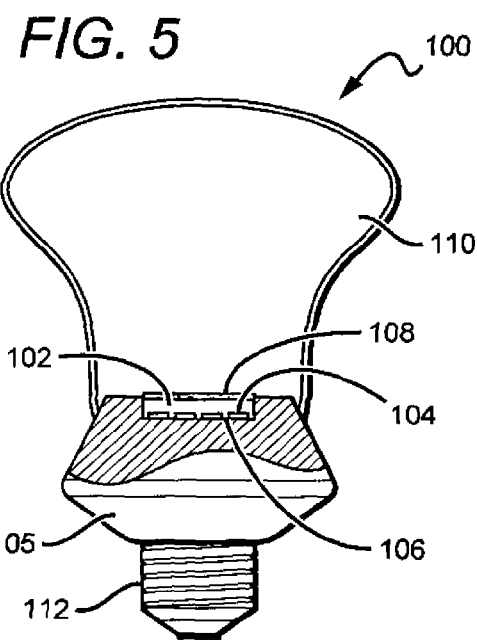
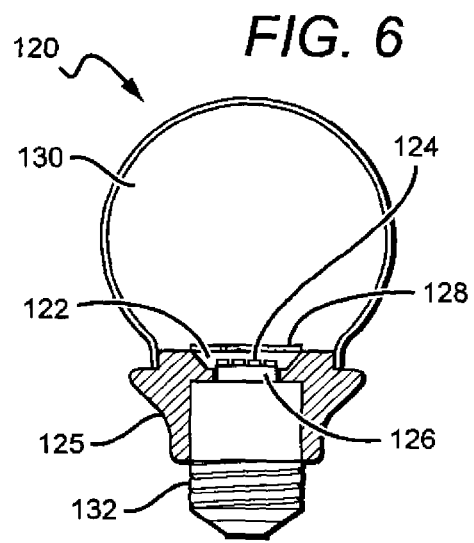

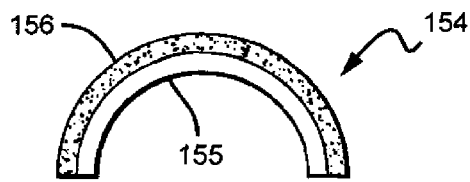
FIG. 7
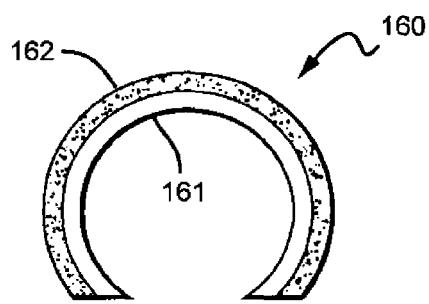
FIG. 8
FIG. 9
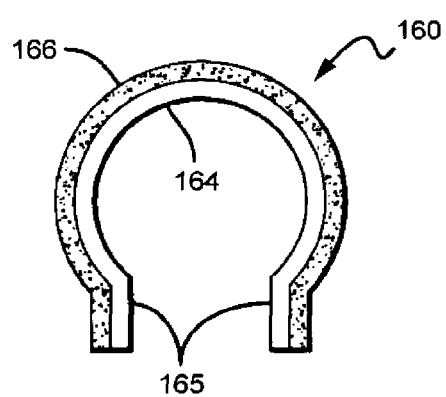
FIG. 10
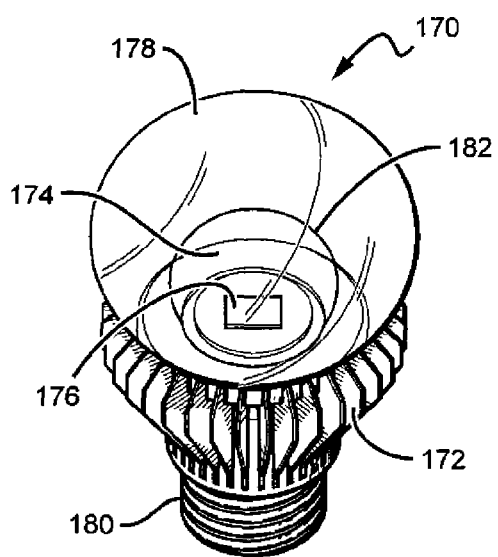
FIG. 11
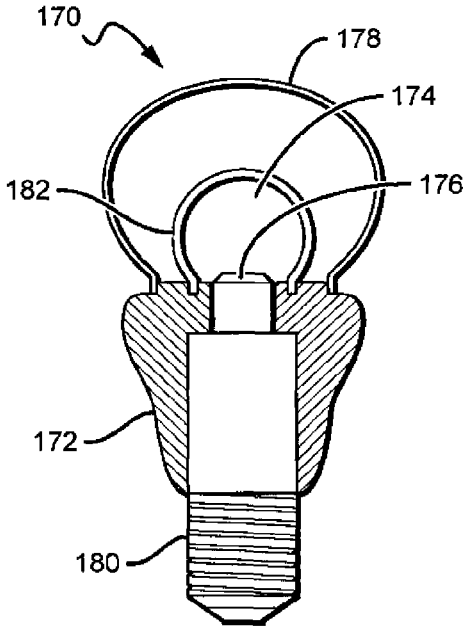
FIG. 12

| V5-HS+Globe24+MS2B_B2(Band Coating) | | |
|---|---|---|
| | RESULT | E-STAR |
| FORWARD FLUX (<90°) | 54.4% | |
| BACKWARD FLUX (>90°) | 45.6% | |
| FLUX > 135° | 10.2% | >5% |
| MAX TO AVG. DIFF. 0° TO 135° | 10.4% | <20% |
| MIN TO AVG. DIFF. 0° TO 135° | 16.9% | <20% |
| MEAS. 0°, 45°, 90° AZIMUTHS | NO | YES |

610

| Forward Source + Non-uniform Diffuser (87% Eff.) | | |
|---|---|---|
| | RESULT | E-STAR |
| FORWARD FLUX (<90°) | 53.0% | |
| BACKWARD FLUX (>90°) | 47.0% | |
| FLUX > 135° | 9.6% | >5% |
| MAX TO AVG. DIFF. 0° TO 135° | 5.6% | <20% |
| MIN TO AVG. DIFF. 0° TO 135° | 14.7% | <20% |
| MEAS. 0°, 45°, 90° AZIMUTHS | NO | YES |

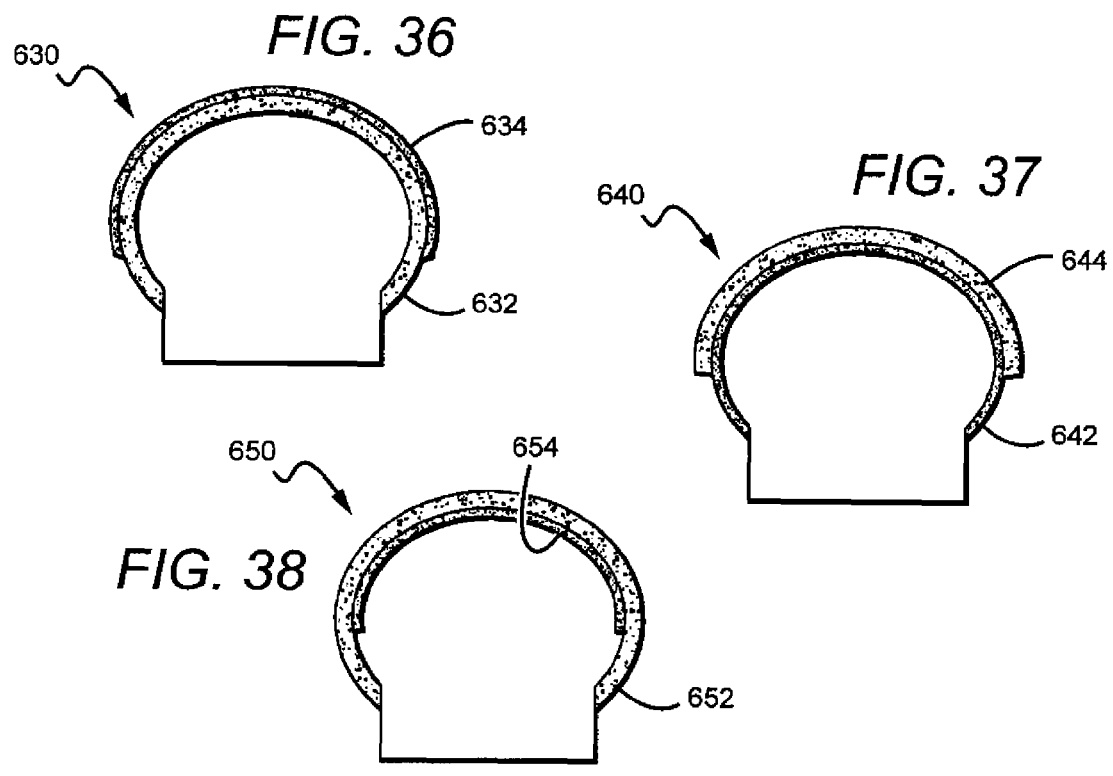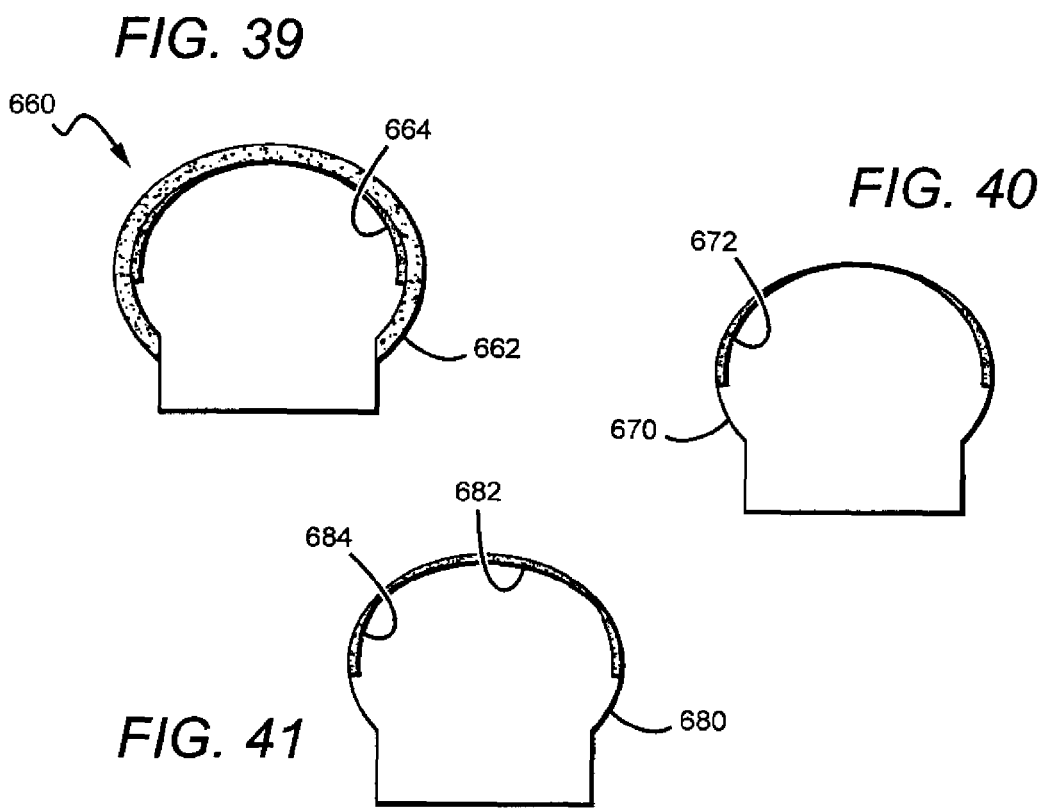

US 9,062,830 B2

HIGH EFFICIENCY SOLID STATE LAMP AND BULB

This application claims the benefit of U.S. Provisional Patent Application Ser. No. 61/339,516, filed on Mar. 3, 2010, U.S. Provisional Patent Application Ser. No. 61/339,515, filed on Mar. 3, 2010, U.S. Provisional Patent Application Ser. No. 61/366,437, filed on Sep. 24, 2010, U.S. Provisional Application Ser. No. 61/424,665, filed on Dec. 19, 2010, U.S. Provisional Application Ser. No. 61/424,670, filed on Dec. 19, 2010, U.S. Provisional Patent Application Ser. No. 61/434,355, filed on Jan. 19, 2011, U.S. Provisional Patent Application Ser. No. 61/435,326, filed on Jan. 23, 2011, and U.S. Provisional Patent Application Ser. No. 61/435,759, filed on Jan. 24, 2011. This application is also a continuation-in-part from, and claims the benefit of, U.S. patent application Ser. No. 12/889,719, filed on Sep. 24, 2010, and U.S. patent application Ser. No. 12/975,820, filed on Dec. 22, 2010.

BACKGROUND OF THE INVENTION

1. Field of the Invention

This invention relates to solid state lamps and bulbs and in particular to efficient and reliable light emitting diode (LED) based lamps and bulbs capable of producing omnidirectional emission patterns.

2. Description of the Related Art

Incandescent or filament-based lamps or bulbs are commonly used as light sources for both residential and commercial facilities. However, such lamps are highly inefficient light sources, with as much as 95% of the input energy lost, primarily in the form of heat or infrared energy. One common alternative to incandescent lamps, so-called compact fluorescent lamps (CFLs), are more effective at converting electricity into light but require the use of toxic materials which, along with its various compounds, can cause both chronic and acute poisoning and can lead to environmental pollution. One solution for improving the efficiency of lamps or bulbs is to use solid state devices such as light emitting diodes (LED or LEDs), rather than metal filaments, to produce light.

Light emitting diodes generally comprise one or more active layers of semiconductor material sandwiched between oppositely doped layers. When a bias is applied across the doped layers, holes and electrons are injected into the active layer where they recombine to generate light. Light is emitted from the active layer and from various surfaces of the LED.

In order to use an LED chip in a circuit or other like arrangement, it is known to enclose an LED chip in a package to provide environmental and/or mechanical protection, color selection, light focusing and the like. An LED package also includes electrical leads, contacts or traces for electrically connecting the LED package to an external circuit. In a typical LED package 10 illustrated in FIG. 1, a single LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup may be filled with an encapsulant material 16 which may contain a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12.

FIG. 2 shows another embodiment of a conventional LED package comprising one or more LED chips 22 mounted onto a carrier such as a printed circuit board (PCB) carrier, substrate or submount 23. A metal reflector 24 mounted on the submount 23 surrounds the LED chip(s) 22 and reflects light emitted by the LED chips 22 away from the package 20. The reflector 24 also provides mechanical protection to the LED chips 22. One or more wire bond connections 27 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond.

LED chips, such as those found in the LED package 20 of FIG. 2 can be coated by conversion material comprising one or more phosphors, with the phosphors absorbing at least some of the LED light. The LED chip can emit a different wavelength of light such that it emits a combination of light from the LED and the phosphor. The LED chip(s) can be coated with a phosphor using many different methods, with one suitable method being described in U.S. patent application Ser. Nos. 11/656,759 and 11/899,790, both to Chitnis et al. and both entitled "Wafer Level Phosphor Coating Method and Devices Fabricated Utilizing Method". Alternatively, the LEDs can be coated using other methods such as electrophoretic deposition (EPD), with a suitable EPD method described in U.S. patent application Ser. No. 11/473,089 to Tarsa et al. entitled "Close Loop Electrophoretic Deposition of Semiconductor Devices".

Lamps have also been developed utilizing solid state light sources, such as LEDs, in combination with a conversion material that is separated from or remote to the LEDs. Such arrangements are disclosed in U.S. Pat. No. 6,350,041 to Tarsa et al., entitled "High Output Radial Dispersing Lamp Using a Solid State Light Source." The lamps described in this patent can comprise a solid state light source that transmits light through a separator to a disperser having a phosphor. The disperser can disperse the light in a desired pattern and/or changes its color by converting at least some of the light to a different wavelength through a phosphor or other conversion material. In some embodiments the separator spaces the light source a sufficient distance from the disperser such that heat from the light source will not transfer to the disperser when the light source is carrying elevated currents necessary for room illumination. Additional remote phosphor techniques are described in U.S. Pat. No. 7,614,759 to Negley et al., entitled "Lighting Device."

One potential disadvantage of lamps incorporating remote phosphors is that they can have undesirable visual or aesthetic characteristics. For example, when a lamp is not generating light the lamp can have a surface color that is different from the typical white or clear appearance of the standard Edison bulb. In some instances the lamp can have a yellow or orange appearance, primarily resulting from the phosphor conversion material, such as yellow/green and red phosphors. This appearance can be considered undesirable for many applications where it can cause aesthetic issues with the surrounding architectural elements when the light is not illuminated. This can have a negative impact on the overall consumer acceptance of these types of lamps.

Further, compared to conformal or adjacent phosphor arrangements where heat generated in the phosphor layer during the conversion process may be conducted or dissipated via the nearby chip or substrate surfaces, remote phosphor arrangements can be subject to inadequate thermally conductive heat dissipation paths. Without an effective heat dissipation pathway, thermally isolated remote phosphors may suffer from elevated operating temperatures that in some instances can be even higher than the temperature in comparable conformal coated layers. This can offset some or all of the benefit achieved by placing the phosphor remotely with respect to the chip. Stated differently, remote phosphor placement relative to the LED chip can reduce or eliminate direct heating of the phosphor layer due to heat generated within the LED chip during operation, but the resulting phosphor temperature decrease may be offset in part or entirely due to heat generated in the phosphor layer itself during the light conversion process and lack of a suitable thermal path to dissipate this generated heat.

Another issue affecting the implementation and acceptance of lamps utilizing solid state light sources relates to the nature of the light emitted by the light source itself. Angular uniformity, also referred to as luminous intensity distribution, is also important for solid state light sources that are to replace standard incandescent bulbs. The geometric relationship between the filament of a standard incandescent bulb and the glass envelope, in combination with the fact that no electronics or heat sink is needed, allow light from an incandescent bulb to shine in a relatively omnidirectional pattern. That is, the luminous intensity of the bulb is distributed relatively evenly across angles in the vertical plane for a vertically oriented bulb from the top of the bulb to the screw base, with only the base itself presenting a significant light obstruction.

In order to fabricate efficient lamps or bulbs based on LED light sources (and associated conversion layers), it is typically desirable to place the LED chips or packages in a co-planar arrangement. This facilitates manufacture and can reduce manufacturing costs by allowing the use of conventional production equipment and processes. However, co-planar arrangements of LED chips typically produce a forward directed light intensity profile (e.g., a Lambertian profile). Such beam profiles are generally not desired in applications where the solid-state lamp or bulb is intended to replace a conventional lamp such as a traditional incandescent bulb, which has a much more omni-directional beam pattern. While it is possible to mount the LED light sources or packages in a three-dimensional arrangement, such arrangements are generally difficult and expensive to fabricate. Solid state light sources also typically include electronic circuitry and a heat sink, which may obstruct the light in some directions.

SUMMARY OF THE INVENTION

In certain embodiments, the present invention relates to a lighting unit using solid state light sources that conform to the shape of industry standard lighting units, such as A19 incandescent or fluorescent light sources, that provide certain improved performance characteristics for such lighting units, such as compliance with ENERGY STAR® performance requirements. These lighting units can be achieved by using various combinations of solid state light sources, such as light emitting diodes, a wavelength conversion material, such as a phosphor, a diffuser element and a thermal management element. In certain embodiments, the solid state light source comprises at least one light emitting diode emitting light of a first wavelength, e.g., blue light, and at least one light emitting diode emitting light of a second wavelength, e.g., red light. The wavelength conversion material comprises a remote wavelength conversion element over the solid state light source. The wavelength conversion element comprises at least one phosphor that interacts with the at least one of the first and second wavelengths of light to produce light of at least a third wavelength, e.g., yellow light. The diffuser element is remote from the wavelength conversion element and acts to produce more uniform light emission. The thermal management element comprises a heat sink unit that provides heat removal and comprises a shape that fits within an envelope of a standard incandescent or fluorescent light source, such as an A19 light bulb.

In certain embodiments, the present invention provides lamps and bulbs generally comprising different combinations and arrangement of a light source, one or more wavelength conversion materials, regions or layers which are positioned separately or remotely with respect to the light source, and a separate diffusing layer. This arrangement allows for the fabrication of lamps and bulbs that are efficient, reliable and cost effective and can provide an essentially omni-directional emission pattern, even with a light source comprised of a co-planar arrangement of LEDs. Additionally, this arrangement allows aesthetic masking or concealment of the appearance of the conversion regions or layers when the lamp is not illuminated. Various embodiments of the invention may be used to address many of the difficulties associated with utilizing efficient solid state light sources such as LEDs in the fabrication of lamps or bulbs suitable for direct replacement of traditional incandescent bulbs. Embodiments of the invention can be arranged to fit recognized standard size profiles such as those ascribed to commonly used lamps such as incandescent light bulbs, thereby facilitating direct replacement of such bulbs.

One embodiment of a lighting device according to the present invention comprises a light source on a heat sink. A diffuser is also included on the heat sink and spaced apart from the light source. A wavelength conversion material is included on the heat sink and disposed between the light source and the diffuser and spaced from the light source and the diffuser. The lamp is arranged to fit within the A19 envelope while emitting a substantially uniform emission pattern.

Another embodiment of a lighting device according to the present invention comprises a light source on a heat sink. Like the embodiment above, a diffuser is included on the heat sink and spaced apart from the light source. A wavelength conversion material is included on the heat sink and disposed between the light source and the diffuser and spaced from the light source and the diffuser. The heat sink comprises a plurality of heat fins each having a lower angled portion that angles out from the central axis of the lighting device, and an upper portion that angles back toward the central axis, wherein the lighting device emits a substantially uniform emission patter.

One embodiment of a solid state lamp according to the present invention comprises a heat sink with a plurality of heat fins and a solid state light source mounted on the heat sink. A phosphor carrier is included on the heat sink, over and spaced apart from the light source. A diffuser is also included on the heat sink, over and spaced apart from the phosphor carrier. The phosphor carrier and the diffuser are substantially frusto-spherical such that the phosphor carrier and diffuser provide a double-dome structure, wherein the lamp fits within a standard size profile, and emits a substantially uniform emission pattern.

These and other aspects and advantages of the invention will become apparent from the following detailed description and the accompanying drawings which illustrate by way of example the features of the invention.

BRIEF DESCRIPTION OF THE DRAWINGS

FIG. 4 is a sectional view of one embodiment of a lamp according to the present invention;

FIG. 5 is a sectional view of one embodiment of a lamp according to the present invention;

FIG. 6 is a sectional view of one embodiment of a lamp according to the present invention;

FIG. 7-10 are sectional views of different embodiments of a phosphor carrier according to the present invention;

FIG. 11 is a perspective view of one embodiment of a lamp according to the present invention;

FIG. 12 is a sectional view of the lamp shown in FIG. 11;

FIGS. 36 through 41 show different embodiments of diffuser domes according to the present invention.

DETAILED DESCRIPTION OF THE INVENTION

Figure 1:
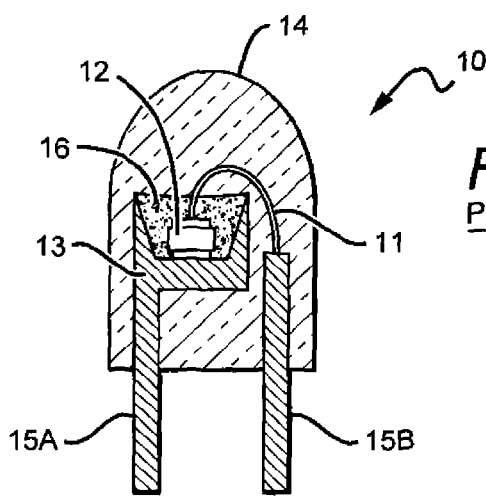
FIG. 1 shows a sectional view of one embodiment of a prior art LED package.
Figure 2:
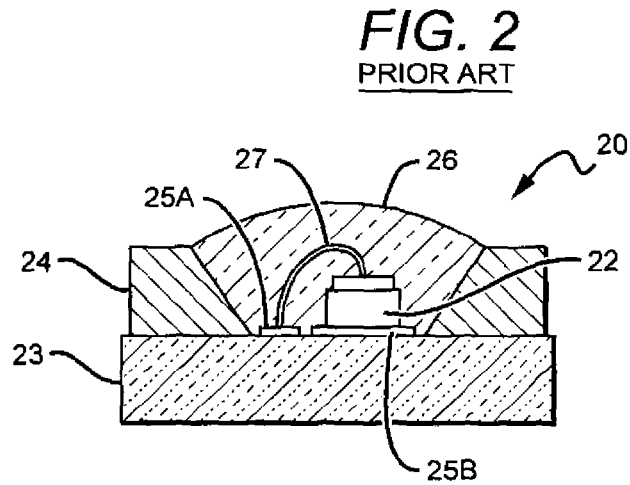
FIG. 2 shows a sectional view of another embodiment of a prior art LED package.

The present invention is directed to different embodiments of lamp or bulb structures that are efficient, reliable and cost effective, and that in some embodiments can provide an essentially omnidirectional emission pattern from directional emitting light sources, such as forward emitting light sources. The present invention is also directed to lamp structures using solid state emitters with remote conversion materials (or phosphors) and remote diffusing elements or diffuser. In some embodiments, the diffuser not only serves to mask the phosphor from the view by the lamp user, but can also disperse or redistribute the light from the remote phosphor and/or the lamp's light source into a desired emission pattern. In some embodiments the diffuser dome can be arranged to disperse forward directed emission pattern into a more omnidirectional pattern useful for general lighting applications. The diffuser can be used in embodiments having two-dimensional as well as three-dimensional shaped remote conversion materials, with a combination of features capable of transforming forward directed emission from an LED light source into a beam profile comparable with standard incandescent bulbs.

Some embodiments of lamps can have a dome-shaped (or frusto-spherical shaped) three dimensional conversion material (phosphor carrier) over and spaced apart from the light source. A dome-shaped diffuser can also be included that is spaced apart from and over the conversion material, such that the lamp exhibits a double-dome structure. The spaces between the various structures can comprise light mixing chambers that can promote not only dispersion of, but also color uniformity of the lamp emission. The space between the light source and conversion material, as well as the space between the conversion material, can serve as light mixing chambers. Other embodiments can comprise additional conversion materials or diffusers that can form additional mixing chambers. The order of the dome conversion materials and dome shaped diffusers can be different such that some embodiments can have a diffuser inside a conversion material, with the spaces between forming light mixing chambers. These are only a few of the many different conversion material and diffuser arrangements according to the present invention.

Some lamp embodiments according to the present invention can comprise a light source having a co-planar arrangement of one or more LED chips or packages, with the emitters being mounted on a flat or planar surface. In other embodiments, the LED chips can be non co-planar, such as being on a pedestal or other three-dimensional structure. Co-planar light sources can reduce the complexity of the emitter arrangement, making them both easier and cheaper to manufacture. Co-planar light sources, however, tend to emit primarily in the forward direction such as in a Lambertian emission pattern. In different embodiments it can be desirable to emit a light pattern mimicking that of conventional incandescent light bulbs that can provide near uniform emission intensity and color uniformity at different emission angles. Different embodiments of the present invention can comprise features that can transform the emission pattern from the non-uniform to substantially uniform within a range of viewing angles.

In some embodiments, a conversion layer or region can comprise a phosphor carrier having a thermally conductive material that is at least partially transparent to light from the light source, and at least one phosphor material each of which absorbs light from the light source and emits a different wavelength of light. The diffuser can comprise a scattering film/particles and associated carrier such as a glass enclosure, and can serve to scatter or redirect at least some of the light emitted by the light source and/or phosphor carrier to provide a desired beam profile. The properties of the diffuser, such as geometry, scattering properties of the scattering layer, surface roughness or smoothness, and spatial distribution of the scattering layer properties may be used to control various lamp properties such as color uniformity and light intensity distribution as a function of viewing angle. By masking the phosphor carrier and other internal lamp features the diffuser provides a desired overall lamp appearance when the lamp or bulb is not illuminated.

A heat sink structure can be included which can be in thermal contact with the light source and with the phosphor carrier, and other lamp elements to dissipate heat into the surrounding ambient. Electronic circuits may also be included to provide electrical power to the light source and other capabilities such as dimming, etc., and the circuits may include a means by which to apply power to the lamp, such as an Edison socket, etc.

Figure 3:
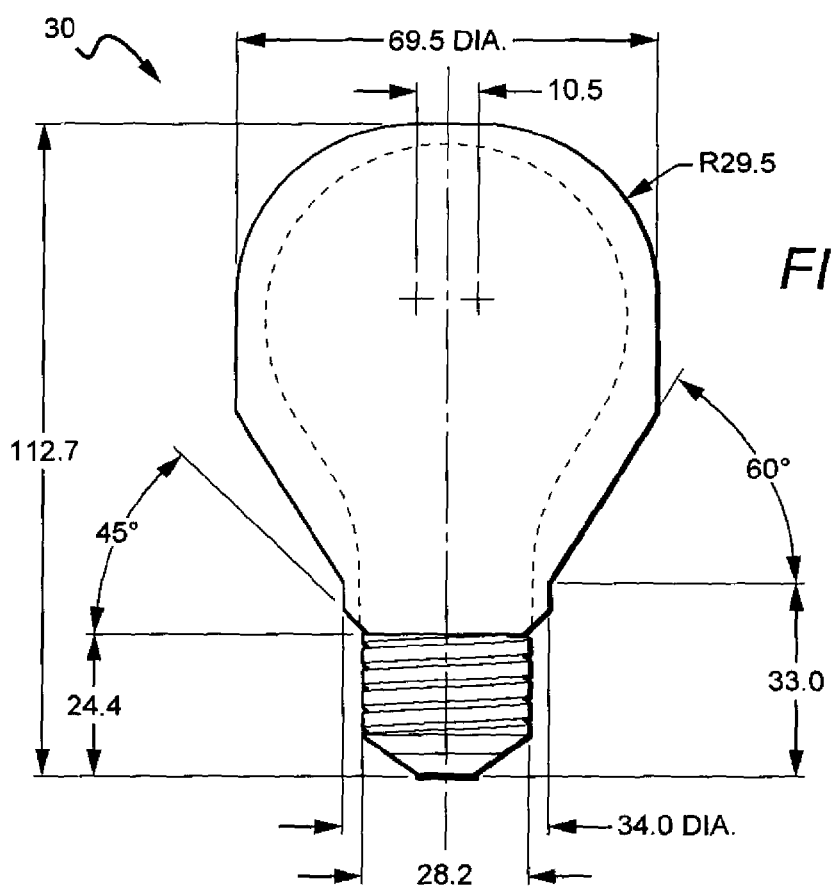
FIG. 3 shows the size specifications for an A19 replacement bulb.

Different embodiments of the lamps can have many different shapes and sizes, with some embodiments having dimensions to fit into standard size envelopes, such as the A19 size envelope 30 as shown in FIG. 3. This makes the lamps particularly useful as replacements for conventional incandescent and fluorescent lamps or bulbs, with lamps according to the present invention experiencing the reduced energy consumption and long life provided from their solid state light sources. The lamps according to the present invention can also fit other types of standard size profiles including but not limited to A21 and A23.

In some embodiments the light sources can comprise solid state light sources, such as different types of LEDs, LED chips or LED packages. In some embodiments a single LED chip or package can be used, while in others multiple LED chips or packages can be arranged in different types of arrays. By having the phosphor thermally isolated from LED chips and with good thermal dissipation, the LED chips can be driven by higher current levels without causing detrimental effects to the conversion efficiency of the phosphor and its long term reliability. This can allow for the flexibility to overdrive the LED chips to lower the number of LEDs needed to produce the desired luminous flux. This in turn can reduce the cost on complexity of the lamps. These LED packages can comprise LEDs encapsulated with a material that can withstand the elevated luminous flux or can comprise unencapsulated LEDs.

Some LED lamps according to the present invention can have a correlated color temperature (CCT) from about 1200K to 3500K, while others can emit light with a luminous intensity distribution that varies by not more than 10% from 0 to 150 degrees from the top of the lamp. In other embodiments, lamps can emit light with a luminous intensity distribution that varies by not more than 20% from 0 to 135 degrees. In some embodiments, at least 5% of the total flux from the lamps is in the 135-180 degree zone. Other embodiments can emit light having a luminous intensity distribution that varies by not more than 30% from 0 to 120 degrees. In some embodiments, the LED lamp has a color spatial uniformity of such that chromaticity with change in viewing angle varies by no more than 0.004 from a weighted average point. Other lamps can conform to the operational requirements for luminous efficacy, color spatial uniformity, light distribution, color rendering index, dimensions and base type for a 60-watt incandescent replacement bulb.

As described in more detail below, the LED lamps according to the present invention can have many different types of emitters that emit different wavelength spectrums of light. In some embodiments, a lighting unit according to the principles of the present invention emits light in at least three peak wavelengths, e.g., blue, yellow and red. At least a first wavelength is emitted by the solid state light source, such as blue light, and at least a second wavelength is emitted by the wavelength conversion element, e.g., green and/or yellow light. Depending on the embodiment, the third wavelength of light, such as green and/or red light can be emitted by the solid state light source and/or the wavelength conversion element. In some embodiments, the at least three wavelengths can be emitted by the wavelength conversion element or the solid state light source. In some embodiments, the solid state light source can emit overlapping, similar or the same wavelengths of light as the wavelength conversion material. For example, the solid state light source can comprise LEDs that emit a wavelength of light, e.g. red light, that overlaps or is substantially the same as light emitted by phosphors in the wavelength conversion material, e.g., red phosphor added to a yellow phosphor in the wavelength conversion material.

In some embodiments, the solid state light source comprises at least one additional LED that emits light having at least one different peak wavelength of light, and/or the wavelength conversion material comprises at least one additional phosphor or lumiphor emitting at least one different peak wavelength. Accordingly, the lighting unit emits light having at least four different peak wavelengths of light.

Depending on the embodiment, the solid state light source can comprise single or multiple strings of LEDs. The wavelength conversion element can include phosphors that are conformally coated on the solid state light source, dispensed over the solid state light source and/or positioned remote from the solid state light source as a distinct wavelength conversion element. For example a lighting unit using a wavelength conversion material that is coated or dispensed on individual LEDs in a solid state light source is described in U.S. patent application Ser. No. 12/975,820 to van de Ven et al., entitled "LED Lamp with High Color Rendering Index," assigned to Cree, Inc. and incorporated herein by reference. The wavelength conversion element can include phosphor particles coated on an inside and/or outside surface of a phosphor carrier and/or embedded or integral with a phosphor carrier. The diffuser element can include diffuser particles coated on an inside and/or outside surface of the diffuser and/or embedded within or integral with the diffuser. In some embodiments, the diffuser comprises structures or features, such as scouring or roughening.

Depending on the embodiment, different arrangements are possible relative to the relationship between the LED light sources and the wavelength conversion material. In some embodiments, a remote wavelength conversion element covers all of the LED light sources. In other embodiments, a remote wavelength conversion element covers some of the LED light sources but not all of the LED light sources. For example, a remote wavelength conversion element covers the LEDs emitting the same or similar wavelengths of light, e.g., blue light, but not other LEDs emitting another wavelength of light, e.g., red light. In some embodiments, at least a first remote wavelength conversion element covers a first set of LEDs, and at least a second wavelength converting element covers a second set of LEDs. Depending on the embodiment, the lighting unit can comprise LEDs that are optically coupled to a coated wavelength conversion material, a dispensed wavelength conversion material and/or a remote wavelength conversion material. Other arrangements are possible between the LEDs and the wavelength conversion material.

In some embodiments of the invention, the LED assembly includes LED packages emitting blue light and with others emitting red light. In some embodiments, the LED assembly of the LED lamp includes an LED array with at least two groups of LEDs, wherein one group, if illuminated, would emit light having dominant wavelength from 440 to 480 nm, and another group, if illuminated, would emit light having a dominant wavelength from 605 to 630 nm. The phosphor carrier can be arranged to absorb and re-emit light from one or both of the two wavelength spectrum and can have one or more phosphors, each of with can absorb light and re-emit a different wavelength of light (e.g. wavelength downconversion). Some lamp embodiments can comprise a plurality of LEDs emitting blue and red light, with the phosphor carrier comprising a yellow phosphor that absorbs blue light and re-emits yellow or green light, with a portion of the blue light passing through the phosphor carrier. The red light from the red LED(s) passes through the yellow/green phosphor while experiencing little or no absorption, such that the lamp emits a white light combination of blue, yellow/green and red. In still other embodiments, blue and red LED(s) the phosphor carrier can comprise yellow/green phosphor, and a red phosphor to contribute to the red component of the lamp lighting and to assist in dispersing the LED light.

In some embodiments, the LEDs can comprise two groups, with one group of LEDs being interconnected in a first serial string, and the other group of LEDs interconnected in a second serial string. This is only one of the many ways that the LEDs can be interconnected and it is understood that the LEDs can be arranged in many different parallel and serial interconnect combinations.

The lamps according to the present invention can emit light with a high color rendering index (CRI), such as or higher in some embodiments. In some other embodiments, the lamps can emit light with CRI of 90 or higher. The lamps can also produce light having a correlated color temperature (CCT) from 2500K to 3500K. In other embodiments, the light can have a CCT from 2700K to 3300K. In still other embodiments, the light can have a CCT from about 2725K to about 3045K. In some embodiments, the light can have a CCT of about 2700K or about 3000K. In still other embodiments, where the light is dimmable, the CCT may be reduced with dimming. In such a case, the CCT may be reduced to as low as 1500K or even 1200K. In some embodiments, the CCT can be increased with dimming. Depending on the embodiment, other output spectral characteristics can be changed based on dimming.

It should be noted that other arrangements of LEDs can be used with embodiments of the present invention. The same number of each type of LED can be used, and the LED packages can be arranged in varying patterns. A single LED of each type could be used. Additional LEDs, which produce additional colors of light, can be used. By using one or more LEDs emitting one or more additional colors and/or a wavelength conversion material comprising one or more additional phosphors or lumiphors, the CRI of the lighting unit can be increased. Lumiphors can be used with all the LED modules. A single lumiphor can be used with multiple LED chips and multiple LED chips can be included in one, some or all LED device packages. A further detailed example of using groups of LEDs emitting light of different wavelengths to produce substantially while light can be found in issued U.S. Pat. No. 7,213,940, which is incorporated herein by reference.

Some lamp embodiments according to the present invention can comprise a first group of solid state light emitters and a first group of lumiphors, with the first group of lumiphors including at least one lumiphor. The lamps also include a second group of solid state light emitters, with the second group of solid state light emitters including at least one solid state light emitter and at least a first power line. Each of the first group of solid state light emitters and each of the second group of solid state light emitters can be electrically connected to said first power line. Each of said first group of solid state light emitters, if illuminated, can emit light having a dominant wavelength in the range of from 430 nm to 480 nm. Each of said first group of lumiphors, if excited, can emit light having a dominant wavelength in the range of from about 555 nm to about 585 nm. Each of the second group of solid state light emitters, if illuminated, can emit light having a dominant wavelength in the range of from 600 nm to 630 nm.

If current is supplied to the first power line a combination of (1) light exiting the lighting device which was emitted by the first group of solid state light emitters, (2) light exiting the lighting device which was emitted by the first group of lumiphors, and (3) light exiting the lighting device which was emitted by the second group of solid state light emitters would, in an absence of any additional light, produce a mixture of light having x, y coordinates on a 1931 CIE Chromaticity Diagram. The coordinates define a point that is within ten MacAdam ellipses of at least one point on the blackbody locus on a 1931 CIE Chromaticity Diagram. This combination of light also produces a sub-mixture of light having x, y color coordinates which define a point which is within an area on a 1931 CIE Chromaticity Diagram enclosed by first, second, third, fourth and fifth connected line segments defined by first, second, third, fourth and fifth points. The first point can have x, y coordinates of 0.32, 0.40, the second point can have x, y coordinates of 0.36, 0.48, the third point can have x, y coordinates of 0.43, 0.45, the fourth point can have x, y coordinates of 0.42, 0.42, and the fifth point can have x, y coordinates of 0.36, 0.38.

The present invention also provides LED lamps with relative geometries of features such as the LED heat dissipation devices or heat sinks that allow for lamp emission patterns that meet the requirements of the ENERGY STAR® Program Requirements for Integral LED Lamps, amended Mar. 22, 2010, herein incorporated by reference. The relative geometries allow light to disperse within 20% of mean value from 0 to 135 degrees with greater that 5% of total luminous flux in the 135 to 180 degree zone (measurement at 0, 45 and 90 azimuth angles). The relative geometries include the LED assembly mounting width, height, head dissipation devices width and unique downward chamfered angle. Combined with a globe shaped phosphor carrier or a reflective umbrella and diffuser dome, the geometries will allow light to disperse within these stringent ENERGY STAR® requirements. The present invention can reduce the surface areas needed to dissipate LED and power electronics thermal energy and still allow the lamps to comply with ANSI A19 lamp profiles.

The present invention also provides for lamps with enhanced emission efficiencies, with some lamps according to the present invention emitting with an efficiency of 65 or more lumens per watt (LPW). In other embodiments the lamps can emit light at an efficiency of 80 or more LPW. In all these embodiments the lamp can emit light with a more desirable color temperature (e.g. 3000K or less or in some embodiments 2700K or less) and a more desirable color rendering index (e.g. 90 or greater CRI).

Some lamp embodiments according to the present invention can emit light of 700 lumens or greater, while others can emit light of 750 lumens or greater. Still other lamp embodiments can emit 800 lumens or greater, with some of these emitting this light from 10 watts or less. These emissions can provide the desired brightness while providing the additional advantage of being able to pass less stringent statutory (e.g. ENERGY STAR®) testing for lamps operating from less than 10 W. This can result in lamps that can be brought to market faster. This emission efficiency can be the result of many factors, such as the maximized fin area for the heat sink, optimized optics resulting in blocking of a minimal amount of light, and the use of a remote conversion material which can result in higher efficacy (80 lumens per watt or greater) than emitters having a conformal coated conversion material.

Although embodiments can include emitters with conformal coated wavelength converter material. Accordingly, embodiments of the lighting unit according to aspects of the present invention can be used to provide LED-based replacement A-Lamp for standard incandescent 60 Watt incandescent light bulbs that can meet ENERGY STAR® performance requirements. Other embodiments can provide LED replacement A-Lamp lighting units for higher wattage incandescent bulbs, such as standard 75 Watt or 100 Watt incandescent A19 light bulbs. In other embodiments, the lighting unit could replace standard 40 Watt incandescent A19 bulbs. Other embodiments of the lighting unit according to aspects of the present invention can be used to replace other standard shaped incandescent or fluorescent lights.

Different lamp embodiments can also comprise components arranged such that the lamps exhibit a relatively long lifetime. In some embodiments the lifetime can be 25,000 hours or more, while in other embodiments it can be 40,000 hours or more. In still other embodiments the lifetime can be 50,000 hours or more. These extended lifetimes can be at operating efficiency of, for example, lumens per watt or more, and can be at different temperatures such as 25° C. and/or 45° C. This lifetime can be measured using a number of different methods. The first can be simply running the lamps for their lifetime until they fail. This can, however, often require extended periods of time that make this method impractical in certain circumstances. Another acceptable method is calculating the lamp lifetime by using the lifetime of each component used in lamp. This information is often provided by the component manufacturers, and often lists operating lifetime under different operating conditions, such as temperature. This data can then be utilized using known methods to calculate the lifetime of the lamp. A third acceptable method is to accelerate the lifetime of the lamp by operating it under elevated conditions such as higher temperature or elevated power or switching signals. This can cause early lamp failure, with this data then utilized in known methods to determine the operating lifetime of the lamp under normal operating conditions.

Different embodiments of the present invention can also comprise safety features that protect against the exposure of certain electrical features or elements in the event that one or both of the diffuser dome and phosphor globe are broken. These safety features can reduce and/or eliminate the danger of electrical shock from coming in contact with these electrical features, and in some embodiments these safety features can comprise different arrangements of electrically insulating materials covering the electrical features.

The present invention provides a unique combination of features and characteristics that allow for long lifetime and efficient operation in a simple and relatively inexpensive arrangement. The lamp can operate at an efficacy of 80 lumens per watt or better, while still producing a CRI of 80 and higher, or 90 and higher. In some embodiments, this efficacy can be achieved at less than 10 watts. This can be provided in a lamp having LEDs as its light source, and a double dome diffuser and conversion material arrangement, while still fitting in an A19 size envelope and emitting a uniform light distribution in compliance with ENERGY STAR® requirements. Lamps with this arrangement can also emit light having a temperature of 3000K and less, or 2700K or less.

The present invention is described herein with reference to certain embodiments, but it is understood that the invention can be embodied in many different forms and should not be construed as limited to the embodiments set forth herein. In particular, the present invention is described below in regards to certain lamps having one or multiple LEDs or LED chips or LED packages in different configurations, but it is understood that the present invention can be used for many other lamps having many different configurations. The embodiments below are described with reference to LED of LEDs, but it is understood that this is meant to encompass LED chips and LED packages. The components can have different shapes and sizes beyond those shown and different numbers of LEDs can be included. It is also understood that the embodiments described below utilize co-planar light sources, but it is understood that non co-planar light sources can also be used. It is also understood that the lamp's LED light source may be comprised of one or multiple LEDs, and in embodiments with more than one LED, the LEDs may have different emission wavelengths. Similarly, some LEDs may have adjacent or contacting phosphor layers or regions, while others may have either adjacent phosphor layers of different composition or no phosphor layer at all.

The present invention is described herein with reference to conversion materials, wavelength conversion materials, remote phosphors, phosphors, phosphor layers and related terms. The use of these terms should not be construed as limiting. It is understood that the use of the term remote phosphors, phosphor or phosphor layers is meant to encompass and be equally applicable to all wavelength conversion materials.

Some of the embodiments described herein comprise a remote phosphor and a separate remote diffuser arrangement, with some being in a double dome arrangement. It is understood that in other embodiments there can be a single dome like structure having both the conversion and diffusing properties, or there can be more than two domes with different combinations of conversion materials and diffusers. The conversion material and diffusers can be provided in respective domes, or the conversion material and diffusers can be together on one or more of the domes. The term dome, should not be construed as limited to any particular shape. The term can encompass many different three dimensional shapes, including but not limited to bullet or globe shaped, or elongated.

The present invention is described herein with reference to conversion materials, phosphor layers and phosphor carriers and diffusers being remote to one another. Remote in this context refers to being spaced apart from and/or to not being on or in direct thermal contact. It is further understood that when discussing dominant wavelengths, there is range or width of wavelengths surrounding a dominant wavelength, so that when discussing a dominant wavelength the present invention is meant to cover a range of wavelengths around that wavelength.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

FIG. 4 shows one embodiment of a lamp 50 according to the present invention that comprises a heat sink structure 52 having an optical cavity 54 with a platform 56 for holding a light source 58. Although this embodiment and some embodiments below are described with reference to an optical cavity, it is understood that many other embodiments can be provided without optical cavities. These can include, but are not limited to, light sources being on a planar surface of the lamp structure or on a pedestal. The light source 58 can comprise many different emitters with the embodiment shown comprising an LED. Many different commercially available LED chips or LED packages can be used including but not limited to those commercially available from Cree, Inc. located in Durham, N.C. It is understood that lamp embodiments can be provided without an optical cavity, with the LEDs mounted in different ways in these other embodiments. By way of example, the light source can be mounted to a planar surface in the lamp or a pedestal can be provided for holding the LEDs.

The light source 58 can be mounted to the platform using many different known mounting methods and materials with light from the light source 58 emitting out the top opening of the cavity 54. In some embodiments light source 58 can be mounted directly to the platform 56, while in other embodiments the light source can be included on a submount or printed circuit board (PCB) that is then mounted to the platform 56. The platform 56 and the heat sink structure 52 can comprise electrically conductive paths for applying an electrical signal to the light source 58, with some of the conductive paths being conductive traces or wires. Portions of the platform 56 can also be made of a thermally conductive material and in some embodiments heat generated during operation can spread to the platform and then to the heat sink structure.

The heat sink structure 52 can at least partially comprise a thermally conductive material, and many different thermally conductive materials can be used including different metals such as copper or aluminum, or metal alloys. Copper can have a thermal conductivity of up to 400 W/m-k or more. In some embodiments the heat sink can comprise high purity aluminum that can have a thermal conductivity at room temperature of approximately 210 W/m-k. In other embodiments the heat sink structure can comprise die cast aluminum having a thermal conductivity of approximately 200 W/m-k. The heat sink structure 52 can also comprise other heat dissipation features such as heat fins 60 that increase the surface area of the heat sink to facilitate more efficient dissipation into the ambient. In some embodiments, the heat fins 60 can be made of material with higher thermal conductivity than the remainder of the heat sink. In the embodiment shown the fins 60 are shown in a generally horizontal orientation, but it is understood that in other embodiments the fins can have a vertical or angled orientation. In still other embodiments, the heat sink can comprise active cooling elements, such as fans, to lower the convective thermal resistance within the lamp. In some embodiments, heat dissipation from the phosphor carrier is achieved through a combination of convection thermal dissipation and conduction through the heat sink structure 52. Different heat dissipation arrangements and structures are described in U.S. Patent Application Ser. No. 61/339,516, to Tong et al., entitled "LED Lamp Incorporating Remote Phosphor with Heat Dissipation Features and Diffuser Element," also assigned to Cree, Inc. application and is incorporated herein by reference.

Reflective layers 53 can also be included on the heat sink structure 52, such as on the surface of the optical cavity 54. In those embodiments not having an optical cavity the reflective layers can be included around the light source. In some embodiments the surfaces can be coated with a material having a reflectivity of approximately 75% or more to the lamp visible wavelengths of light emitted by the light source 58 and/or wavelength conversion material ("the lamp light"), while in other embodiments the material can have a reflectivity of approximately 85% or more to the lamp light. In still other embodiments the material can have a reflectivity to the lamp light of approximately 95% or more.

The heat sink structure 52 can also comprise features for connecting to a source of electricity such as to different electrical receptacles. In some embodiments the heat sink structure can comprise a feature of the type to fit in conventional electrical receptacles. For example, it can include a feature for mounting to a standard Edison socket, which can comprise a screw-threaded portion which can be screwed into an Edison socket. In other embodiments, it can include a standard plug and the electrical receptacle can be a standard outlet, or can comprise a GU24 base unit, or it can be a clip and the electrical receptacle can be a receptacle which receives and retains the clip (e.g., as used in many fluorescent lights). These are only a few of the options for heat sink structures and receptacles, and other arrangements can also be used that safely deliver electricity from the receptacle to the lamp 50.

The lamps according to the present invention can comprise a power supply or power conversion unit that can comprise a driver to allow the bulb to run from an AC line voltage/current and to provide light source dimming capabilities. In some embodiments, the power supply can be housed in a cavity/housing within the lamps heat sink (one embodiment shown below in FIG. 42) can comprise an offline constant-current LED driver using a non-isolated quasi-resonant flyback topology. The LED driver can fit within the lamp and in some embodiments can comprise a 25 cubic centimeter volume or less, while in other embodiments it can comprise an approximately 22 cubic centimeter volume or less and still in other embodiments 20 cubic centimeters or less. In some embodiments the power supply can be non-dimmable but is low cost. It is understood that the power supply used can have different topology or geometry and can be dimmable as well. Embodiments having a dimmer can exhibit many different dimming characteristics such as phase cut dimmable down to 5% (both leading and trailing edge). In some dimming circuits according to the present invention, the dimming is realized by decreasing the output current to the LEDs.

The power supply unit can comprise many different components arranged on printed circuit boards in many different ways. The power supply can operate from many different power sources and can exhibit may different operating characteristics. In some embodiments the power supply can be arranged to operate from a 120 volts alternating current (VAC) ±10% signal while providing a light source drive signal of greater than 200 milliamps (mA) and/or greater than 10 volts (V). In other embodiments the drive signal can be greater than 300 mA generate power and/or greater than 15V. In some embodiments the drive signal can be approximately 400 mA and/or approximately 22V.

The power supply can also comprise components that allow it to operate with a relatively high level of efficiency. One measure of efficiency can be the percentage of input energy to the power supply that is actually output as light from the lamp light source. Much of the energy can be lost through the operation of the power supply. In some lamp embodiments, the power supply can operate such that more than 10% of the input energy to the power supply is radiated or output as light from the LEDs. In other embodiments more than 15% of the input energy is output as LED light. In still other embodiments, approximately 17.5% of input energy is output as LED light, and in others approximately 18% or greater input energy is output as LED light.

A thermal potting material or other suitable thermally conductive material can be included around the power supply for protection and to assist in radiating heat away from the power supply components. In the embodiment where the power supply is in the heat sink cavity, the thermal potting material can fill all or part of the cavity such that it surrounds the power supply. Many different thermally conductive materials can be used that exhibit some or all of the characteristics of being safe, electrically insulating, thermally conductive, having low thermal expansion, and viscous enough that it would not run out of cracks in the heat sink cavity prior to being cured. Some embodiments can use potting compounds comprising epoxy and fiberglass such as those available from Dow Corning, Inc.

A phosphor carrier 62 is included over the top opening of the cavity 54 and a dome shaped diffuser 76 is included over the phosphor carrier 62. In the embodiment shown, the phosphor carrier covers the entire opening and the cavity opening is shown as circular and the phosphor carrier 62 is a circular disk. It is understood that the cavity opening and the phosphor carrier can be many different shapes and sizes. It is also understood that the phosphor carrier 62 can cover less than the entire cavity opening. As further described below, the diffuser 76 is arranged to disperse the light from the phosphor carrier and/or LED into the desired lamp emission pattern and can comprise many different shapes and sizes depending on the light it receives from and the desired lamp emission pattern.

Embodiments of phosphor carriers according to the present invention can be characterized as comprising a conversion material and thermally conductive light transmitting material, but it is understood that phosphor carriers can also be provided that are not thermally conductive. The light transmitting material can be transparent to the light emitted from the light source 58 and the conversion material should be of the type that absorbs the wavelength of light from the light source and re-emits a different wavelength of light. In the embodiment shown, the thermally conductive light transmitting material comprises a carrier layer 64 and the conversion material comprises a phosphor layer 66 on the phosphor carrier. As further described below, different embodiments can comprise many different arrangements of the thermally conductive light transmitting material and conversion material.

When light from the light source 58 is absorbed by the phosphor in the phosphor layer 66 it is re-emitted in isotropic directions with approximately 50% of the light emitting forward and 50% emitting backward into the cavity 54. In prior LEDs having conformal phosphor layers, a significant portion of the light emitted backwards can be directed back into the LED and its likelihood of escaping is limited by the extraction efficiency of the LED structure. For some LEDs the extraction efficiency can be approximately 70%, so a percentage of the light directed from the conversion material back into the LED can be lost. In the lamps according to the present invention having the remote phosphor configuration with LEDs on the platform 56 at the bottom of the cavity 54 a higher percentage of the backward phosphor light strikes a surface of the cavity instead of the LED. Coating these surfaces with a reflective layer 53 increases the percentage of light that reflects back into the phosphor layer 66 where it can emit from the lamp. These reflective layers 53 allow for the optical cavity to effectively recycle photons, and increase the emission efficiency of the lamp. It is understood that the reflective layer can comprise many different materials and structures including but not limited to reflective metals or multiple layer reflective structures such as distributed Bragg reflectors. Reflective layers can also be included around the LEDs in those embodiments not having an optical cavity.

The carrier layer 64 can be made of many different materials having a thermal conductivity of 0.5 W/m-k or more, such as quartz, silicon carbide (SiC) (thermal conductivity ~120 W/m-k), glass (thermal conductivity of 1.0-1.4 W/m-k) or sapphire (thermal conductivity of ~40 W/m-k). In other embodiments, the carrier layer 64 can have thermal conductivity greater than 1.0 W/m-k, while in other embodiments it can have thermal conductivity of greater than 5.0 W/m-k. In still other embodiments it can have a thermal conductivity of greater that 10 W/m-k. In some embodiments the carrier layer can have thermal conductivity ranging from 1.4 to 10 W/m-k. The phosphor carrier can also have different thicknesses depending on the material being used, with a suitable range of thicknesses being 0.1 mm to 10 mm or more. It is understood that other thicknesses can also be used depending on the characteristics of the material for the carrier layer. The material should be thick enough to provide sufficient lateral heat spreading for the particular operating conditions. Generally, the higher the thermal conductivity of the material, the thinner the material can be while still providing the necessary thermal dissipation. Different factors can impact which carrier layer material is used including but not limited to cost and transparency to the light source light. Some materials may also be more suitable for larger diameters, such as glass or quartz. These can provide reduced manufacturing costs by formation of the phosphor layer on the larger diameter carrier layers and then singulation into the smaller carrier layers. In some embodiments, the phosphor carrier can comprise a polymer or plastic material with the phosphor coated on the inside surface and/or outside surface of the phosphor carrier and/or embedded or mixed in with the polymer or plastic.

Many different phosphors can be used in the phosphor layer 66 with the present invention being particularly adapted to lamps emitting white light. As described above, in some embodiments the light source 58 can be LED based and can emit light in the blue wavelength spectrum. The phosphor layer can absorb some of the blue light and re-emit yellow. This allows the lamp to emit a white light combination of blue and yellow light. In some embodiments, the blue LED light can be converted by a yellow conversion material using a commercially available YAG:Ce phosphor, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG).

Other yellow phosphors that can be used for creating white light when used with a blue emitting LED based emitter include but not limited to:

$Tb_{3-x}RE_xO_{12}$:Ce(TAG); RE=Y, Gd, La, Lu; or $Sr_{2-x-y}Ba_xCa_ySiO_4$:Eu.

The phosphor layer can also be arranged with more than one phosphor either mixed in with the phosphor layer 66 or as a second phosphor layer on the carrier layer 64. In some embodiments, each of the two phosphors can absorb the LED light and can re-emit different colors of light. In these embodiments, the colors from the two phosphor layers can be combined for higher CRI white of different white hue (warm white). This can include light from yellow phosphors above that can be combined with light from red phosphors. Different red phosphors can be used including:

$Sr_xCa_{1-x}$S:Eu, Y; Y=halide;

$CaSiAlN_3$:Eu; or $Sr_{2-y}Ca_ySiO_4$:Eu

Other phosphors can be used to create color emission by converting substantially all light to a particular color. For example, the following phosphors can be used to generate green light:

$SrGa_2S_4$:Eu;

$Sr_{2-y}Ba_ySiO_4$:Eu; or $SrSi_2O_2N_2$:Eu.

The following lists some additional suitable phosphors used as conversion particles phosphor layer 66, although others can be used. Each exhibits excitation in the blue and/or UV emission spectrum, provides a desirable peak emission, has efficient light conversion, and has acceptable Stokes shift:

Yellow/Green $(Sr,Ca,Ba)(Al,Ga)_2S_4$:$Eu^{2+}$ $Ba_2(Mg,Zn)Si_2O_7$:$Eu^{2+}$ $Gd_{0.46}Sr_{0.31}Al_{1.23}O_xF_{1.38}$:$Eu^{2+}_{0.06}$ $(Ba_{1-x-y}Sr_xCa_y)SiO_4$:Eu $Ba_2SiO_4$:$Eu^{2+}$ $Lu_3Al_5O_{12}$ doped with $Ce^{3+}$ $(Ca,Sr,Ba)Si_2O_2N_2$ doped with $Eu^{2+}$ $CaSc2O4$:$Ce^{3+}$ $(Sr,Ba)2SiO4$:$Eu^{2+}$ Red $Lu_2O_3$:$Eu^{3+}$ $(Sr_{2-x}La_x)(Ce_{1-x}Eu_x)O_4$ $Sr_2Ce_{1-x}Eu_xO_4$ $Sr_{2-x}Eu_xCeO_4$ $SrTiO_3$:$Pr^{3+}$,$Ga^{3+}$ $CaAlSiN_3$:$Eu^{2+}$ $Sr_2Si_5N_8$:$Eu^{2+}$ Different sized phosphor particles can be used including but not limited to particles in the range of 10 nanometers (nm) to 30 micrometers (µm), or larger. Smaller particle sizes typically scatter and mix colors better than larger sized particles to provide a more uniform light. Larger particles are typically more efficient at converting light compared to smaller particles, but emit a less uniform light. In some embodiments, the phosphor can be provided in the phosphor layer 66 in a binder, and the phosphor can also have different concentrations or loading of phosphor materials in the binder. A typical concentration being in a range of 30-70% by weight. In one embodiment, the phosphor concentration is approximately 65% by weight, and is preferably uniformly dispersed throughout the remote phosphor. The phosphor layer 66 can also have different regions with different conversion materials and different concentrations of conversion material.

Different materials can be used for the binder, with materials preferably being robust after curing and substantially transparent in the visible wavelength spectrum. Suitable materials include silicones, epoxies, glass, inorganic glass, dielectrics, BCB, polymides, polymers and hybrids thereof, with the preferred material being silicone because of its high transparency and reliability in high power LEDs. Suitable phenyl- and methyl-based silicones are commercially available from Dow® Chemical. The binder can be cured using many different curing methods depending on different factors such as the type of binder used. Different curing methods include but are not limited to heat, ultraviolet (UV), infrared (IR) or air curing. In some embodiments, the binder can comprise a polymeric material or plastic.

Phosphor layer 66 can be applied using different processes including but not limited to spin coating, sputtering, printing, powder coating, electrophoretic deposition (EPD), electrostatic deposition, among others. As mentioned above, the phosphor layer 66 can be applied along with a binder material, but it is understood that a binder is not required. In still other embodiments, the phosphor layer 66 can be separately fabricated and then mounted to the carrier layer 64.

In one embodiment, a phosphor-binder mixture can be sprayed or dispersed over the carrier layer 64 with the binder then being cured to form the phosphor layer 66. In some of these embodiments the phosphor-binder mixture can be sprayed, poured or dispersed onto or over the a heated carrier layer 64 so that when the phosphor binder mixture contacts the carrier layer 64, heat from the carrier layer 64 spreads into and cures the binder. These processes can also include a solvent in the phosphor-binder mixture that can liquefy and lower the viscosity of the mixture making it more compatible with spraying. Many different solvents can be used including but not limited to toluene, benzene, zylene, or OS-20 commercially available from Dow Corning®, and different concentration of the solvent can be used. When the solvent-phosphor-binder mixture is sprayed or dispersed on the heated carrier layer 64 the heat from the carrier layer 64 evaporates the solvent, with the temperature of the carrier layer impacting how quickly the solvent is evaporated. The heat from the carrier layer 64 can also cure the binder in the mixture leaving a fixed phosphor layer on the carrier layer. The carrier layer 64 can be heated to many different temperatures depending on the materials being used and the desired solvent evaporation and binder curing speed. A suitable range of temperature is 90 to 150° C., but it is understood that other temperatures can also be used. Various deposition methods and systems are described in U.S. Patent Application Publication No. 2010/0155763, to Donofrio et al, entitled "Systems and Methods for Application of Optical Materials to Optical Elements," and also assigned to Cree, Inc.

The phosphor layer 66 can have many different thicknesses depending at least partially on the concentration of phosphor material and the desired amount of light to be converted by the phosphor layer 66. Phosphor layers according to the present invention can be applied with concentration levels (phosphor loading) above 30%. Other embodiments can have concentration levels above 50%, while in still others the concentration level can be above 60%. In some embodiments the phosphor layer can have thicknesses in the range of 10-100 microns, while in other embodiments it can have thicknesses in the range of 40-50 microns.

The methods described above can be used to apply multiple layers of the same of different phosphor materials and different phosphor materials can be applied in different areas of the carrier layer using known techniques, such as masking processes. Other embodiments can comprise uniform and/or non-uniform distribution of phosphors in the phosphor carrier, such as with different phosphor layer thicknesses and/or different phosphor material concentrations along the carrier.

There can be multiple areas of different types of phosphors that can emit the same or different colors of light, such as by having distinct regions of different phosphors. Some of these arrangements can give the phosphor carrier a patterned appearance, with some of the patterns including but not limited to striped, dotted, crisscrossed, zigzagged or any combination of these. In still other embodiments, there can be multiple remotely separated phosphors (e.g. domes) that can have different types of phosphor materials. Each of these remote phosphors can have one or multiple phosphors that can be arranged in the many different ways described above.

The methods described above provide some thickness control for the phosphor layer 66, but for even greater thickness control the phosphor layer can be ground using known methods to reduce the thickness of the phosphor layer 66 or to even out the thickness over the entire layer. This grinding feature provides the added advantage of being able to produce lamps emitting within a single bin on the CIE chromaticity graph. Binning is generally known in the art and is intended to ensure that the LEDs or lamps provided in groups that emit light within an acceptable color range. The LEDs or lamps can be tested and sorted by color or brightness into different bins, generally referred to in the art as binning. Each bin typically contains LEDs or lamps from one color and brightness group and is typically identified by a bin code. White emitting LEDs or lamps can be sorted by chromaticity (color) and luminous flux (brightness). The thickness control of the phosphor layer provides greater control in producing lamps that emit light within a target bin by controlling the amount of light source light converted by the phosphor layer. Multiple phosphor carriers 62 with the same thickness of phosphor layer 66 can be provided. By using a light source 58 with substantially the same emission characteristics, lamps can be manufactured having nearly the same emission characteristics that in some instances can fall within a single bin. In some embodiments, the lamp emissions fall within a standard deviation from a point on a CIE diagram, and in some embodiments the standard deviation comprises less than a 10-step McAdams ellipse. In some embodiments the emission of the lamps falls within a 4-step McAdams ellipse centered at CIExy(0.313, 0.323).

The phosphor carrier 62 can be mounted and bonded over the opening in the cavity 54 using different known methods or materials such as thermally conductive bonding materials or a thermal grease. Conventional thermally conductive grease can contain ceramic materials such as beryllium oxide and aluminum nitride or metal particles such colloidal silver. In other embodiments the phosphor carrier can be mounted over the opening using thermal conductive devices such as clamping mechanisms, screws, or thermal adhesive hold phosphor carrier 62 tightly to the heat sink structure to maximize thermal conductivity. In one embodiment a thermal grease layer is used having a thickness of approximately 100 µm and thermal conductivity of k=0.2 W/m-k. This arrangement provides an efficient thermally conductive path for dissipating heat from the phosphor layer 66. As mentioned above, different lamp embodiments can be provided without cavity and the phosphor carrier can be mounted in many different ways beyond over an opening to the cavity.

During operation of the lamp 50 phosphor conversion heating is concentrated in the phosphor layer 66, such as in the center of the phosphor layer 66 where the majority of LED light strikes and passes through the phosphor carrier 62. The thermally conductive properties of the carrier layer 64 spreads this heat laterally toward the edges of the phosphor carrier 62 as shown by first heat flow 70. There the heat passes through the thermal grease layer and into the heat sink structure 52 as shown by second heat flow 72 where it can efficiently dissipate into the ambient.

As discussed above, in the lamp 50 the platform 56 and the heat sink structure 52 can be thermally connected or coupled. This coupled arrangement results in the phosphor carrier 62 and that light source 58 at least partially sharing a thermally conductive path for dissipating heat. Heat passing through the platform 56 from the light source 58 as shown by third heat flow 74 can also spread to the heat sink structure 52. Heat from the phosphor carrier 62 flowing into the heat sink structure 52 can also flow into the platform 56. In other embodiments, the phosphor carrier 62 and the light source 58 can have separate thermally conductive paths for dissipating heat, with these separate paths being referred to as "decoupled".

It is understood that the phosphor carriers can be arranged in many different ways beyond the embodiment shown in FIG. 4. The phosphor layer can be on any surface of the carrier layer or can be mixed in with the carrier layer. The phosphor carriers can also comprise scattering layers that can be included on or mixed in with the phosphor layer or carrier layer. It is also understood that the phosphor and scattering layers can cover less than a surface of the carrier layer and in some embodiments the conversion layer and scattering layer can have different concentrations in different areas. It is also understood that the phosphor carrier can have different roughened or shaped surfaces to enhance emission through the phosphor carrier.

As mentioned above, the diffuser 75 is arranged to disperse light from the phosphor carrier and LED into the desired lamp emission pattern, and can have many different shapes and sizes. In some embodiments, the diffuser also can be arranged over the phosphor carrier to mask the phosphor carrier when the lamp is not emitting. The diffuser can have materials to give a substantially white appearance to give the bulb a white appearance when the lamp is not emitting.

Many different diffusers with different shapes and attributes can be used with lamp 50 as well as the lamps described below, such as those described in U.S. Provisional Patent Application No. 61/339,515, titled "LED Lamp With Remote Phosphor and Diffuser Configuration", file on Mar. 3, 2010, which is incorporated herein by reference. Diffuser can also take different shapes, including but not limited to generally asymmetric "squat" as in U.S. patent application Ser. No. 12/901,405, titled "Non-uniform Diffuser to Scatter Light Into Uniform Emission Pattern," filed on Oct. 8, 2010, incorporated herein by reference.

The lamps according to the present invention can comprise many different features beyond those described above. Referring again to FIG. 4, in those lamp embodiments having a cavity 54 can be filled with a transparent heat conductive material to further enhance heat dissipation for the lamp. The cavity conductive material could provide a secondary path for dissipating heat from the light source 58. Heat from the light source would still conduct through the platform 56, but could also pass through the cavity material to the heat sink structure 52. This would allow for lower operating temperature for the light source 58, but presents the danger of elevated operating temperature for the phosphor carrier 62. This arrangement can be used in many different embodiments, but is particularly applicable to lamps having higher light source operating temperatures compared to that of the phosphor carrier. This arrangement allows for the heat to be more efficiently spread from the light source in applications where additional heating of the phosphor carrier layer can be tolerated.

As discussed above, different lamp embodiments according to the present invention can be arranged with many different types of light sources. In one embodiment eight or nine LEDs can be used that are connected in series with two wires to a circuit board. The wires can then be connected to the power supply unit described above. In other embodiments, more or less than eight or nine LEDs can be used and as mentioned above, commercially available LEDs from Cree, Inc. can used including eight XLamp® XP-E LEDs or four XLamp® XP-G LEDs. Different single string LED circuits are described in U.S. patent application Ser. No. 12/566,195, to van de Ven et al., entitled "Color Control of Single String Light Emitting Devices Having Single String Color Control, and U.S. patent application Ser. No. 12/704,730 to van de Ven et al., entitled "Solid State Lighting Apparatus with Compensation Bypass Circuits and Methods of Operation Thereof", both of which are incorporated herein by reference.

FIG. 5 shows still another embodiment of lamp 100 according to the present invention that comprises an optical cavity 102 within a heat sink structure 105. Like the embodiments above, the lamp 100 can also be provided without a lamp cavity, with the LEDs mounted on a surface of the heat sink 105 or on a three dimensional or pedestal structures having different shapes. A planar LED based light source 104 is mounted to the platform 106, and a phosphor carrier 108 is mounted to the top opening of the cavity 102, with the phosphor carrier 108 having any of the features of those described above. In the embodiment shown, the phosphor carrier 108 can be in a flat disk shape (e.g., a remote two dimensional wavelength conversion element) and comprises a thermally conductive transparent material and a phosphor layer. It can be mounted to the cavity with a thermally conductive material or device as described above. The cavity 102 can have reflective surfaces to enhance the emission efficiency as described above.

Light from the light source 104 passes through the phosphor carrier 108 where a portion of it is converted to a different wavelength of light by the phosphor in the phosphor carrier 108. In one embodiment the light source 104 can comprise blue emitting LEDs and the phosphor carrier 108 can comprise a yellow phosphor as described above that absorbs a portion of the blue light and re-emits yellow light. The lamp 100 emits a white light combination of LED light and yellow phosphor light. Like above, the light source 104 can also comprise many different LEDs emitting different colors of light and the phosphor carrier can comprise other phosphors to generate light with the desired color temperature and rendering.

The lamp 100 also comprises a shaped diffuser dome 110 mounted over the cavity 102 that includes diffusing or scattering particles such as those listed above. The scattering particles can be provided in a curable binder that is formed in the general shape of dome. In the embodiment shown, the dome 110 is mounted to the heat sink structure 105 and has an enlarged portion at the end opposite the heat sink structure 105. Different binder materials can be used as discussed above such as silicones, epoxies, glass, inorganic glass, dielectrics, BCB, polymides, plastics, polymers and hybrids thereof. In some embodiments white scattering particles can be used with the dome having a white color that hides the color of the phosphor in the phosphor carrier 108 in the optical cavity. This gives the overall lamp 100 a white appearance that is generally more visually acceptable or appealing to consumers than the color of the phosphor. In one embodiment the diffuser can include white titanium dioxide particles that can give the diffuser dome 110 its overall white appearance.

The diffuser dome 110 can provide the added advantage of distributing the light emitting from the optical cavity in a more uniform pattern. As discussed above, light from the light source in the optical cavity can be emitted in a generally Lambertian pattern and the shape of the dome 110 along with the scattering properties of the scattering particles causes light to emit from the dome in a more omnidirectional emission pattern. An engineered dome can have scattering particles in different concentrations in different regions or can be shaped to a specific emission pattern.

In the United States, the ENERGY STAR® program, run jointly by the U.S. Environmental Protection Agency and the U.S. Department of Energy promulgates a standard for integrated LED lamps, the measurement techniques for both color and angular uniformity are described in the ENERGY STAR® Program Requirements, which is incorporated above by reference. For a vertically oriented lamp, luminous intensity is measured in vertical planes 45 and 90 degrees from an initial plane. It shall not differ from the mean intensity by more than 20% for the entire 0-135 degree zone for the lamp, with zero defined as the top of the envelope. Additionally, 5% of the total flux from the lamp shall be in the 135-180 degree zone.

In some embodiments, including those described below, the dome can be engineered so that the emission pattern from the lamp complies with the omnidirectional emission criteria of the ENERGY STAR® Program Requirements for Integral LED Lamps, amended Mar. 22, 2010, which is incorporated herein by reference. One requirement of this standard met by the lamps herein is that the emission uniformity must be within 20% of mean value from 0 to 135° viewing. Another is that greater than 5% of total flux from the lamp must be emitted in the 135-180° emission zone, with the measurements taken at 0, 45, 90° azimuthal angles. As mentioned above, the different lamp embodiments described herein can also comprise A-type (e.g. A19) retrofit LED bulbs that meet the ENERGY STAR® standards. The present invention provides lamps that are efficient, reliable and cost effective. In some embodiments, the entire lamp can comprise five components that can be quickly and easily assembled.

Like the embodiments above, the lamp 100 can comprise a mounting mechanism 112 connected to the heat sink 105, of the type to fit in conventional electrical receptacles. In the embodiment shown, the lamp 100 includes a screw-threaded portion 112 for mounting to a standard Edison socket. Like the embodiments above, the lamp 100 can include standard plug and the electrical receptacle can be a standard outlet, or can comprise a GU24 base unit, or it can be a clip and the electrical receptacle can be a receptacle which receives and retains the clip (e.g., as used in many fluorescent lights). The heat sink structure can also comprise an internal cavity or housing holding power supply or power conversion unit components as described above.

As mentioned above, the space between some of the features of the lamp 160 can be considered mixing chambers, with the space between the light source 106 and the phosphor carrier 108 comprising a first light mixing chamber. The space between the phosphor carrier 108 and the diffuser 110 can comprise a second light mixing chamber, with the mixing chamber promoting uniform color and intensity emission for the lamp. The same can apply to the embodiments below having different shaped phosphor carriers and diffusers. In other embodiments, additional diffusers and/or phosphor carriers can be included forming additional mixing chambers, and the diffusers and/or phosphor carriers can be arranged in different orders.

Different lamp embodiments according to the present invention can have many different shapes and sizes. FIG. 6 shows another embodiment of a lamp 120 according to the present invention that is similar to the lamp 100 and similarly comprises an optical cavity 122 in a heat sink structure 125 with a light source 124 mounted to the platform 126 in the optical cavity 122. Like above, the heat sink structure need not have an optical cavity, and the light sources can be provided on other structures beyond a heat sink structure. These can include planar surfaces or pedestals having the light source. A phosphor carrier 128 is mounted over the cavity opening with a thermal connection. The lamp 120 also comprises a diffuser dome 130 mounted to the heat sink structure 125, over the optical cavity. The diffuser dome 130 can be made of the same materials as diffusers described above, but in this embodiment the dome 130 is globe, oval or egg shaped to provide a different lamp emission pattern while still masking the color from the phosphor in the phosphor carrier 128.

It is understood that in other lamp embodiments the phosphor carriers can take many different shapes including different three-dimensional shapes. The term three-dimensional is meant to mean any shape other than planar as shown in the above embodiments. FIGS. 7 through 10 show different embodiments of three-dimensional phosphor carriers according to the present invention, but it is understood that they can also take many other shapes. As discussed above, when the phosphor absorbs and re-emits light, it is re-emitted in an isotropic fashion, such that the 3-dimensional phosphor carrier serves to convert and also disperse light from the light source. Like the diffusers described above, the different shapes of the 3-dimensional carrier layers can emit light in emission, patterns having different characteristics that depends partially on the emission pattern of the light source. The diffuser can then be matched with the emission of the phosphor carrier to provide the desired lamp emission pattern.

FIG. 7 shows a hemispheric shaped phosphor carrier 154 comprising a hemispheric carrier 155 and phosphor layer 156. The hemispheric carrier 155 can be made of the same materials as the carrier layers described above, and the phosphor layer can be made of the same materials as the phosphor layer described above, and scattering particles can be included in the carrier and phosphor layer as described above.

In this embodiment the phosphor layer 156 is shown on the outside surface of the carrier 155 although it is understood that the phosphor layer can be on the carrier's inside layer, mixed in with the carrier, or any combination of the three. In some embodiments, having the phosphor layer on the outside surface may minimize emission losses. When emitter light is absorbed by the phosphor layer 156 it is emitted omnidirectionally and some of the light can emit backwards and be absorbed by the lamp elements such as the LEDs. The phosphor layer 156 can also have an index of refraction that is different from the hemispheric carrier 155 such that light emitting forward from the phosphor layer can be reflected back from the inside surface of the carrier 155. This light can also be lost due to absorption by the lamp elements. With the phosphor layer 156 on the outside surface of the carrier 155, light emitted forward does not need to pass through the carrier 155 and will not be lost to reflection. Light that is emitted back will encounter the top of the carrier where at least some of it will reflect back. This arrangement results in a reduction of light from the phosphor layer 156 that emits back into the carrier where it can be absorbed.

The phosphor layer 156 can be deposited using many of the same methods described above. In some instances the three-dimensional shape of the carrier 155 may require additional steps or other processes to provide the necessary coverage. In the embodiments where a solvent-phosphor-binder mixture is sprayed and the carrier can be heated as described above and multiple spray nozzles may be needed to provide the desired coverage over the carrier, such as approximate uniform coverage. In other embodiments, fewer spray nozzles can be used while spinning the carrier to provide the desired coverage. Like above, the heat from the carrier 155 can evaporate the solvent and helps cure the binder.

In still other embodiments, the phosphor layer can be formed through an emersion process whereby the phosphor layer can be formed on the inside or outside surface of the carrier 155, but is particularly applicable to forming on the inside surface. The carrier 155 can be at least partially filled with, or otherwise brought into contact with, a phosphor mixture that adheres to the surface of the carrier. The mixture can then be drained from the carrier leaving behind a layer of the phosphor mixture on the surface, which can then be cured. In one embodiment, the mixture can comprise polyethylen oxide (PEO) and a phosphor. The carrier can be filled and then drained, leaving behind a layer of the PEO-phosphor mixture, which can then be heat cured. The PEO evaporates or is driven off by the heat leaving behind a phosphor layer. In some embodiments, a binder can be applied to further fix the phosphor layer, while in other embodiments the phosphor can remain without a binder.

Like the processes used to coat the planar carrier layer, these processes can be utilized in three-dimensional carriers to apply multiple phosphor layers that can have the same or different phosphor materials. The phosphor layers can also be applied both on the inside and outside of the carrier, and can have different types having different thickness in different regions of the carrier. In still other embodiments different processes can be used such as coating the carrier with a sheet of phosphor material that can be thermally formed to the carrier.

In lamps utilizing the carrier 155, an emitter can be arranged at the base of the carrier so that light from the emitters emits up and passes through the carrier 155. In some embodiments the emitters can emit light in a generally Lambertian pattern, and the carrier can help disperse the light in a more uniform pattern.

FIG. 8 shows another embodiment of a three dimensional phosphor carrier 157 according to the present invention comprising a bullet-shaped carrier 158 and a phosphor layer 159 on the outside surface of the carrier. The carrier 158 and phosphor layer 159 can be formed of the same materials using the same methods as described above. The different shaped phosphor carrier can be used with a different emitter to provide the overall desired lamp emission pattern. FIG. 9 shows still another embodiment of a three dimensional phosphor carrier 160 according to the present invention comprising a globe-shaped carrier 161 and a phosphor layer 162 on the outside surface of the carrier. The carrier 161 and phosphor layer 162 can be formed of the same materials using the same methods as described above.

FIG. 10 shows still another embodiment phosphor carrier 163 according to the present invention having a generally globe shaped carrier 164 with a narrow neck portion 164. Like the embodiments above, the phosphor carrier 164 includes a phosphor layer 166 on the outside surface of the carrier 164 made of the same materials and formed using the same methods as those described above. In some embodiments, phosphor carriers having a shape similar to the carrier 164 can be more efficient in converting emitter light and re-emitting light from a Lambertian pattern from the light source, to a more uniform emission pattern.

Figure 13:
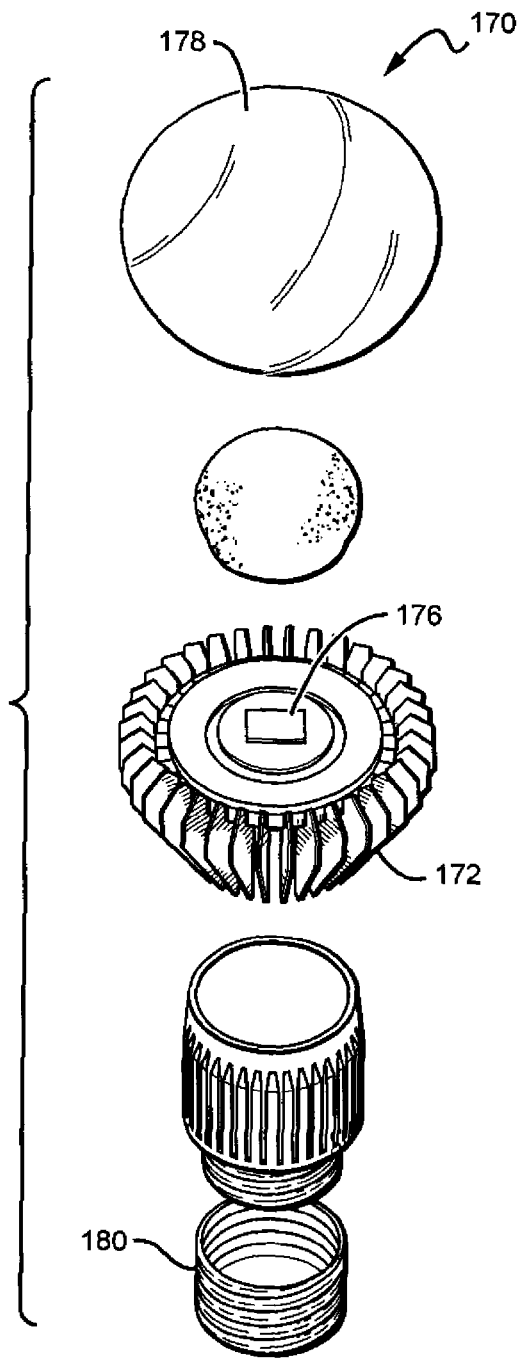
FIG. 13 is an exploded view of the lamp shown in FIG. 11.

FIGS. 11 through 13 show another embodiment of a lamp 170 according to the present invention having a heat sink structure 172, optical cavity 174, light source 176, diffuser dome 178 and a screw-threaded portion 180. These features can be made of the same materials using the same methods as the similar features described above. This embodiment also comprises a three-dimensional wavelength conversion element 182 (e.g., a phosphor carrier that includes a thermally conductive transparent material and at least one phosphor layer). Depending on the embodiment, the wavelength conversion element comprises a phosphor layer(s) on an inside, outside and/or embedded within the phosphor carrier. In this embodiment, the wavelength conversion element is on (e.g., mounted to the heat sink structure 172 and thermally coupled or connected to the heat sink structure 172. In other embodiments, an electrically insulating element (not shown) can be between the heat sink structure and the wavelength conversion element, and the wavelength conversion element can be retained by the electrically insulating element. The electrically insulating element can include opening(s) over the light source 176 (e.g., LEDs) to allow the light to pass through while covering the heat sink structure 172 to protect against electrical shock. In some embodiments, the electrically insulating element can also act as a reflector. In this embodiment, the phosphor carrier 182 is globe or sphere shaped and the emitters are arranged so that light from the light source passes through the phosphor carrier 182 where at least some of it is converted.

The three dimensional shape of the phosphor carrier 182 provides natural separation between it and the light source 176. Accordingly, the light source 176 is not mounted in a recess in the heat sink that forms the optical cavity. Instead, in this embodiment, the light source 176 is mounted on the top surface of the heat sink structure 172, with the optical cavity 174 formed by the space between the phosphor carrier 182 and the top of the heat sink structure 172. This arrangement can allow for a less Lambertian emission from the optical cavity 174 because there are no optical cavity side surfaces to block and redirect sideways emission. In other embodiments, the light source 176 is on a mounting element (not shown), such as a printed circuit board, metal core board or other element on which the light source is mounted. In some embodiments, the mounting element can include other electronics, such as compensation and/or control circuitry (not shown), and is thermally coupled to the heat sink structure 172. The compensation and/or control circuitry can include a microprocessor, application specific integrated circuitry or other processing circuitry that is electrically coupled to the power supply unit and the light source 176. In some embodiments, the control circuitry or portions thereof can be located within the heat sink cavity/housing with the power supply unit and/or mounted on a surface of the mounting element opposite from the LEDs. The compensation and/or control circuitry can comprises circuitry as described in U.S. patent application Ser. No. 12/566,195, to van de Ven et al., entitled "Color Control of Single String Light Emitting Devices Having Single String Color Control, and U.S. patent application Ser. No. 12/704,730 to van de Ven et al., entitled "Solid State Lighting Apparatus with Compensation Bypass Circuits and Methods of Operation Thereof", both of which have been incorporated above by reference.

In embodiments of the lamp 170 utilizing blue emitting LEDs for the light source 176 and yellow and red phosphor combination in the phosphor carrier. This can cause the phosphor carrier 182 to appear yellow or orange, and the diffuser dome 178 masks this color while dispersing the lamp light into the desired emission pattern. In lamp 170, the conductive paths for the platform and heat sink structure are coupled, but it is understood that in other embodiments they can be decoupled.

Figure 14:
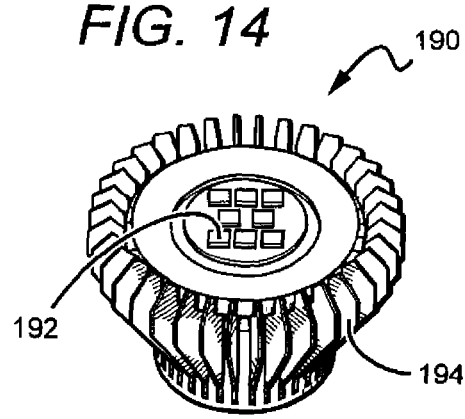
FIG. 14 is a perspective view of one embodiment of a lamp according to the present invention.
Figure 15:
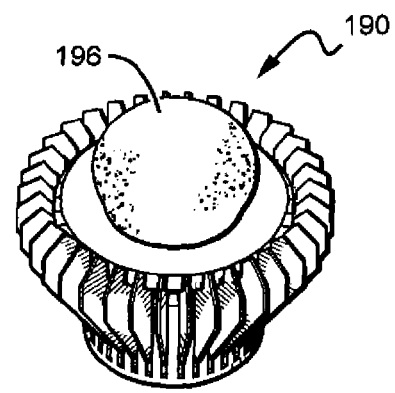
FIG. 15 is a perspective view of the lamp in FIG. 14 with a phosphor carrier.

FIG. 14 shows one embodiment of a lamp 190 according to the present invention comprising an eight LED light source 192 mounted on a heat sink 194 as described above. The emitters can comprise many different types of LEDs that can be coupled together in many different ways and in the embodiment shown are serially connected. It is noted that in this embodiment the emitters are not mounted in an optical cavity, but are instead mounted on top planar surface of the heat sink 194. FIG. 15 shows the lamp 190 shown in FIG. 14 with a globe shaped phosphor carrier 196 mounted over the light source 192 shown in FIG. 14. The lamp 190 shown in FIG. 15 can be combined with the diffuser 198 as described above to form a lamp with dispersed light emission.

As mentioned above, the phosphor carriers can comprise multiple conversion materials, such as yellow/green and red phosphors. These phosphors can provide the yellow/green light components for the white light lamp emission. In different embodiments, however, these light components can be provided directly from LED chips instead of through phosphor conversion. These different arrangements can provide certain advantages, including but not limited to lamps that require lower operating power and can be less expensive by eliminating the need for certain phosphors. In other embodiments, certain of these color components can be provided directly from the different color LED chips. For example, the red component of the emission can be provided directly from red emitting LEDs as described in U.S. Provisional Patent Application Ser. No. 61/424,670 to Yuan et al., titled "LED Lamp With Remote Phosphor and Diffuser Configuration Utilizing Red Emitters," which is incorporated herein by reference.

Figure 16:
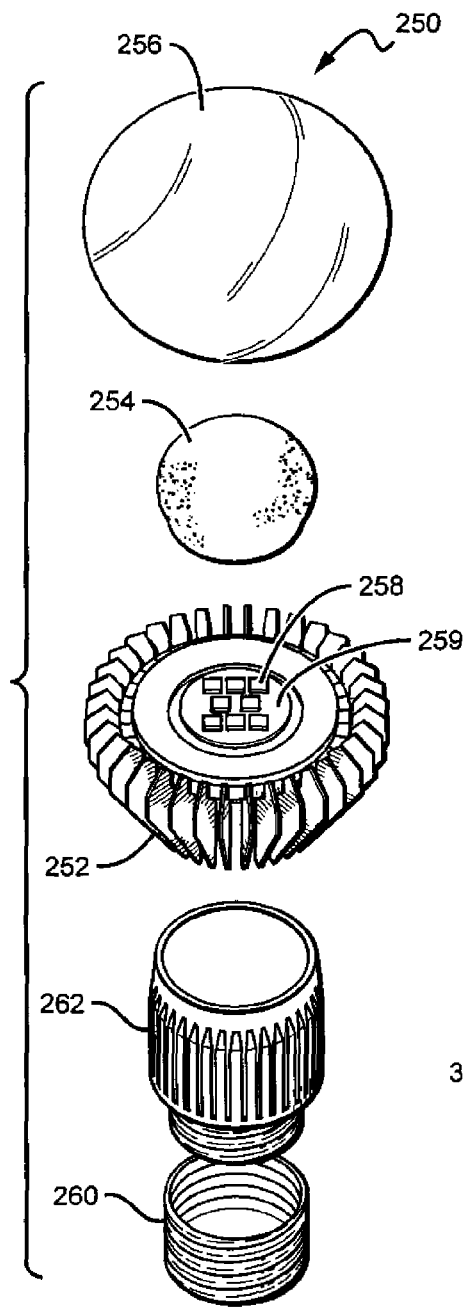
FIG. 16 is exploded view of one embodiment of a lamp according to the present invention.
Figure 17:
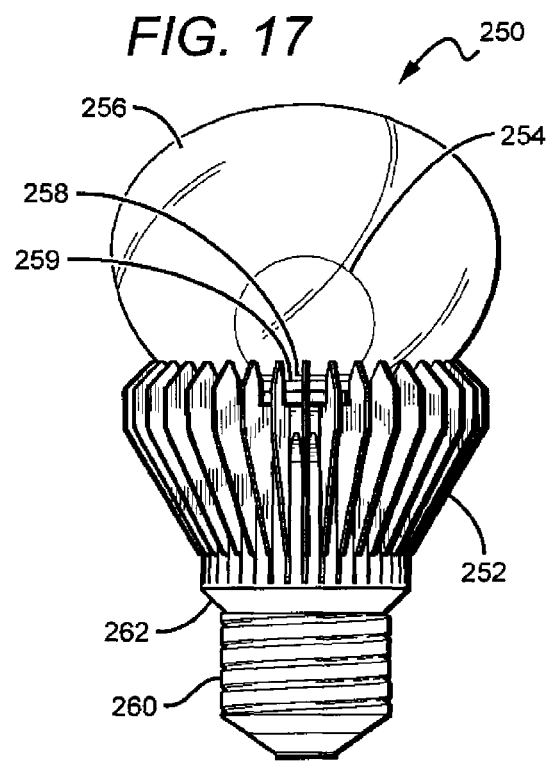
FIG. 17 is sectional view of the lamp shown in FIG. 16.

FIGS. 16 and 17 show another embodiment of a lamp 250 according to the present invention similar to those shown and described in U.S. Provisional Patent Application Ser. No. 61/339,515, filed on Mar. 3, 2010, and titled "Lamp With Remote Phosphor and Diffuser Configuration." and U.S. patent application Ser. No. 12/901,405, filed on Oct. 8, 2010, and titled "Non-uniform Diffuser to Scatter Light Into Uniform Emission Pattern," both of which are incorporated herein by reference.

The lamp 250 comprises a heat sink 252, with a dome shaped phosphor carrier 254 and dome shaped diffuser 256 that can be made of the same materials using the same methods described above. It also comprises LEDs 258 that in this embodiment are mounted on a planar surface 259 of the heat sink 252 with the phosphor carrier and diffuser over the LED chips 258. The LED chips 258 and phosphor carrier 254 can comprise any of the arrangements and characteristics described above, such as some embodiments having a red and blue emitting LED chips. The phosphor carrier can comprise one or more of the phosphor materials described above, but preferably comprises a phosphor that absorbs blue light and emits yellow light so that the lamp emits a white light combination of blue, red and yellow.

The lamp 250 can comprise a mounting mechanism 259 of the type to fit in conventional electrical receptacles. In the embodiment shown, the lamp 250 includes a screw-threaded portion 260 for mounting to a standard Edison socket. Like the embodiments above, the lamp 250 can include standard plug and the electrical receptacle can be a standard outlet, or can comprise a GU24 base unit, or it can be a clip and the electrical receptacle can be a receptacle which receives and retains the clip (e.g., as used in many fluorescent lights).

The lamps according to the present invention can comprise a power supply or power conversion unit as described above that can be arranged in a cavity or housing within the heat sink. As above, these can comprise a driver to allow the bulb to run from an AC line voltage/current and to provide light source dimming capabilities. In some embodiments, the power supply can comprise an offline constant-current LED driver using a non-isolated quasi-resonant flyback topology. The LED driver can fit within the lamp 250, such as in body portion 262. In some embodiments the power supply can be non-dimmable but is relatively low cost. It is understood that the power supply used can have many different topologies or geometries and can be arranged in many different ways.

The different lamp components can have many different shapes and can arranged in many different ways. In particular, the heat sinks can be arranged in many different ways to meet the desired size, thermal management characteristics, and desired emission characteristics. As shown in FIG. 3, the relatively specific and constrained envelope available for A19 standard sizes can result in limited options for different shapes and sizes of heat sinks. This is particularly true for LED lamps having features to allow them to meet certain emission characteristics, such as the ENERGY STAR® program as described above.

Figure 18:
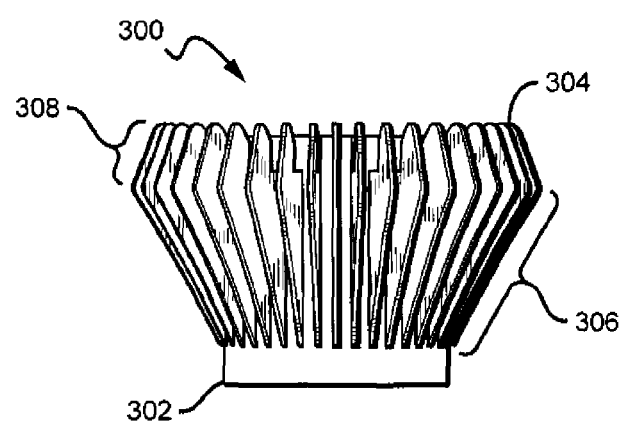
FIG. 18 is a side view of one embodiment of a heat sink according to the present invention.
Figure 19:
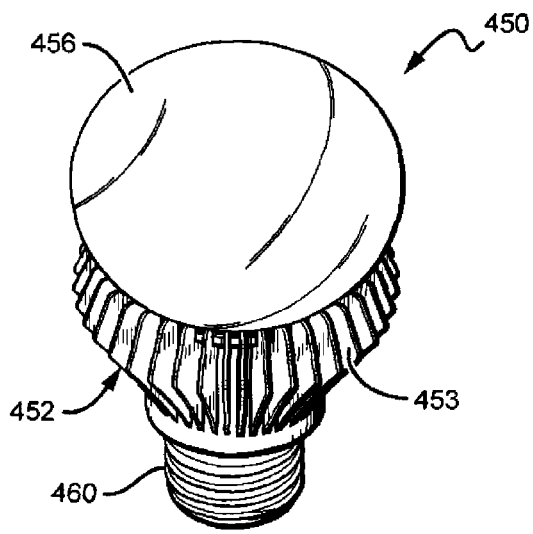
FIG. 19 is a perspective view of one embodiment of a lamp according to the present invention.

FIG. 18 shows one embodiment of a heat sink 300 according to a heat sink according to the present invention, that is capable of having LEDs, phosphor carrier and diffuser dome being mounted on it to form a lamp. The heat sink 300 can be made of the same thermally conductive materials discussed above. The heat sink 300 can be used in many different lamps, but is particularly sized to fit within A19 envelope requirements, while having angled surfaces that allow for the lamp to emit light within the ENERGY STAR® emission requirements.

The heat sink 300 can have a cylindrical shaped core/housing 302 to house a power control unit as discussed above. It can also have heat fins 304 designed to conduct heat away from the lamps heat generating components, such as the LEDs, power electronics, etc. The heat fins 304 can have many different shapes and sizes and can be made of many of the thermally conductive materials described above. There can also be many different numbers of heat sink fins 304 in different embodiments, with some embodiments having between 20 and 60 heat fins. Other embodiments can have 30 to 50 heat fins, while other embodiments can have 35 to 40 heat fins. In one embodiment, the heat sink 452 can have approximately 38 heat fins. The number of heat sink fins 304 can be reduced, but this can result in a corresponding reduction in surface area to dissipate heat. When fewer fins are used, larger fins can be used, but this can result in an unacceptable amount of light being blocked by the fins or can result in fins that fall outside of the A19 envelope.

The heat fins 304 can each have substantially the same shape, although in other embodiments they can have different shapes. Each of the heat fins 304 can have a lower portion 306 that is sized and angled away from the center of the heat sink 304 in a manner that allows the heat sink to fit in the middle angled portion of the A19 envelope. In the embodiment shown, the lower portion 306 is angled at approximately 150 degrees from vertical (or 60 degrees from horizontal), but it is understood that the fins can have many other angles. In particular, the lower portion can have fins that at angles greater than 150° to vertical. The top portion 308 of the heat sink can be angled back toward the center of the heat sink 300, with this angle being chosen depending on desired emission characteristics. In some embodiments, a lamp utilizing this heat sink can be arranged to emit light meeting the ENERGY STAR® emission characteristics as described above. In particular and as further described below, the top portion 308 can be angled so as not to block too much light emitted from the lamp in the downward direction, while still providing the desired surface area for heat dissipation.

Figure 20:
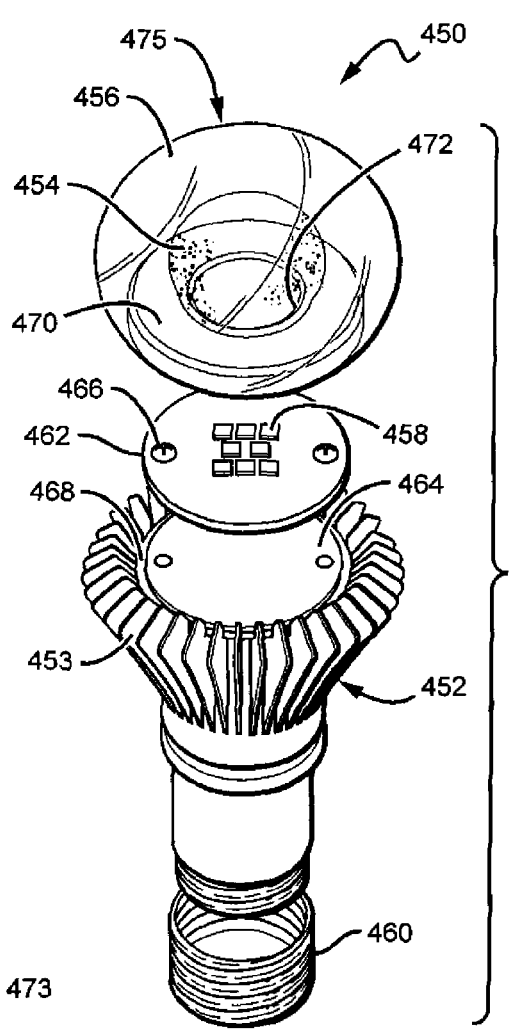
FIG. 20 is a perspective exploded view of the embodiment shown in FIG. 19.
Figure 21:
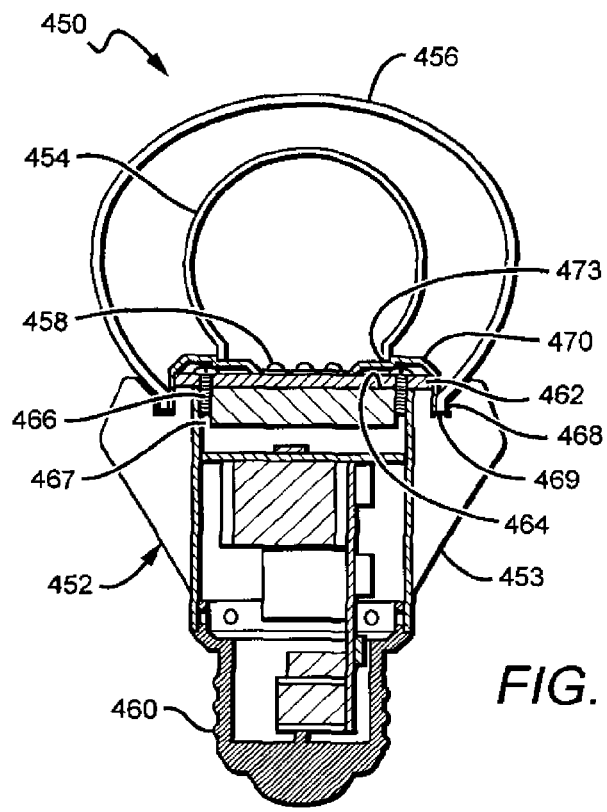
FIG. 21 is a sectional view of the embodiment shown in FIG. 19.

FIGS. 19 through 22 show one embodiment of a lamp 450 according to the present invention utilizing a heat sink 452 with heat sink fins 453 similar to the ones shown in FIG. 18. The internal components of the lamp 450 are best shown in FIGS. 20 and 21. Like the embodiments above the lamp 450 comprises a dome shaped phosphor carrier 454 and dome shaped diffuser 456. It also comprises LEDs 458 that in this embodiment are mounted on a planar surface of the heat sink 452 with the phosphor carrier and diffuser 454. 456 over the LED 458. As with the other LED lamps described herein, the LED chips 458, diffuser 456, and phosphor carrier 454 can comprise any of the shapes, arrangements and characteristics described above, such as some embodiments having a red and blue emitting LED chips. The phosphor carrier 454 can comprise one or more of the phosphor materials described above, some embodiments comprising a phosphor that absorbs blue light and emits yellow light so that the lamp emits a white light combination of blue, red and yellow.

The lamp 450 can comprise a mounting mechanism of the type to fit in conventional electrical receptacles, such as a threaded portion 460 for turning into to a standard Edison socket, as well as the alternative mounting mechanisms mentioned above. The dome shaped diffuser can be many different shapes and sizes and in the embodiment shown is "squat shaped" and can have different amounts of diffuser in different section, both as described in U.S. patent application Ser. No. 12/901,405, incorporated above.

The LEDs 458 are mounted on a printed circuit board 462 using conventional mounting methods, with the PCB 462 mounted to the heat sink platform 464 using mounting screws 466 that pass through the PCB 462 and turn into screw holes 467 in the head sink platform 464. It is understood that many other embodiments can utilize different mounting methods and mechanisms. The phosphor carrier 454 is also mounted to the platform 464 and over the LEDs 458 such that light from the LEDs passes through the phosphor carrier 454. A channel 468 is provided around the platform 464, with lower edge of the diffuser dome 456 resting in the channel 468. The phosphor carrier 454 and diffuser dome 456 can be mounted in place using known mounting materials and methods. In this embodiment, the diffuser dome rests in the channel 468 below the LEDs 458 and the wavelength conversion element 454 rests in the channel 473 above the LEDs 458. Depending on the embodiment, the relative mounting positions of the wavelength conversion element 454, the diffuser dome 458, the LEDs 458 and/or the top surfaces of the heat sink 452 can vary.

By providing a channel 468, the diffuser dome 456 can be arranged lower in the heat sink 452. This can provide a number of advantages. This can result in overlap between the diffuser dome 456 and the heat sink fins 453 to promote heat dissipation. This arrangement can allow the diffuser dome 456 to be lower also to assist in allowing the lamp 450 to fit within the desired length, such as those provided in A19 envelope. This also results in the lower edge of the diffuser dome 456 being below the lower edge of the phosphor carrier 454, such that the phosphor carrier is essentially raised within this diffuser dome 456. This places the phosphor carrier 454 closer to the center of the diffuser dome 456, which can promote uniform distribution from the lamp 450. There can be factors that present a practical limit the distance the phosphor carrier 454 can be raised in relation to the diffuser dome 456. For example, if the phosphor carrier 454 is raised too close to the diffuser dome 456, the yellow from the phosphor carrier 454 may be visible through the diffuser dome 456.

This can be esthetically unpleasing to some lamp users. In different embodiments the phosphor carrier 454 can be raised different amounts in relation to the diffuser dome 456. In some embodiments, the lower edge of the phosphor globe can be raised between 0 and 30 mm, while in other embodiments it can be raised in the range of 5 to 15 mm. In still other embodiments it can be raised approximately 10 mm.

The lamp 450 is also arranged to pass certain industry drop and break tests. The PCB 462 can comprise electrical conductors, traces or components that if exposed could present a danger of electrical shock. To meet these break tests, the lamp 450 can be arranged such that if one or both of the diffuser dome 456 and phosphor carrier 454 are broken, such as from dropping, there are no exposed components that present a danger of electrical shock. To reduce and/or prevent this danger, the lamp 450 comprises an electrically insulating layer 470 covering portions of the PCB 462. The insulating layer can be arranged to cover electrical conductors, traces or electrical components that carry electrical signals. Many different insulating materials can be used, including but not limited to different plastics such as polycarbonates. The insulating layer can be formed separately from the lamp and mounted in place, or it can be formed directly on the lamp once the PCB 462 is mounted in place.

A window 472 can be provided on the insulating layer 470, with the LEDs 458 arranged in the window 472 so that the layer 470 does not block emission from the LEDs. The edges of the window 472 can be angled, which provides the additional advantage of a surface arranged to reflect sideways emitted LED light up towards the phosphor carrier where it can contribute to useful lamp emission.

The insulating layer 470 further comprises an insulating layer ledge or channel 473 sized to hold the lower edge of the phosphor carrier 454. The phosphor carrier 454 can be quickly and easily arranged in its desired location by being placed and mounted to the insulating layer and within the ledge 470, with the ledge aligning the phosphor carrier 454 in the proper location. The insulating layer 470 extends into the heat sink channel 468 where it is aligned and held in place in the channel 468 between the diffuser dome 456 and the surface of the channel 468. The insulating layer 470 can also comprise a second insulating layer ledge or channel 473 to hold the lower end of the diffuser dome 456, with the ledge or channel 473 allowing for the diffuser dome 456 to be quickly and easily placed and mounted to the insulating layer 470 in the proper location over the phosphor carrier 454 and LEDs 458.

Different embodiments of insulating layers according to the present invention can be arranged to provide for efficient lamp manufacturing. In some embodiments, the insulating layer 470 can be formed separate from the lamp 450, and the insulating layer, phosphor carrier 454, and diffuser dome 456 can be assembled separately into a double dome unit 475 (shown in FIG. 20). The double dome unit can be quickly and easily mounded and aligned to the heat sink, with the second insulating layer ledge or channel 473 in the heat sink ledge 468. The unit 475 can then be mounted in place using known methods and materials. By providing a separate double dome unit 475, lamps according to the present invention can also be arranged such that the units 475 can be removable and replaceable. This can be particularly desirable in case of failure or damage to the unit 475, or to allow access to other portions of the lamp for repair or replacement, such as the PCB 462. It is understood that other embodiments can comprise a separate unit having the phosphor carrier 454 and insulating layer separately formed, and then mounted to the heat sink 452. The diffuser dome 456 can then be mounted to the insulating layer 470, over the phosphor carrier 454. These arrangements can also allow for the units to be binned by emission characteristics, much in the same way that LEDs are binned.

In some embodiments, the electrically insulating element 470, the wavelength conversion element 454 and/or the diffuser dome 456 comprise mechanical coupling or retention mechanisms, such as snaps or mating protrusions and notches, such that the double dome unit 475 can be readily put together as a single unit, for example snap fit. As such, units with different optical characteristics can be readily replaced and/or installed when manufacturing different LED bulbs with different optical characteristics. Additionally, consumers could replace the double dome unit 475 on an existing LED bulb if different characteristics are desired by the consumer. In some embodiments, the electrically insulating element 470 can comprise mechanical coupling mechanisms that enable the double dome unit 475 to be easily and mechanically mounted by hand, e.g. with snaps or mating protrusions, to the heat sink or housing of the LED bulb. In these embodiments, these mechanical mounting or retention features are described relative to the electrically insulating element 470, but these features can be provided by a separate element or along with the electrically insulating element that are not electrically insulating. Having the wavelength conversion element 454 and/or the diffuser dome 456 as an integral arrangement or connected together as a unit could provide manufacturing advantages. For example, the optical characteristics of the unit could be measured, and the unit can be binned such as in regions of a 1931 CIE diagram. Accordingly, the units can be selected and mated with a solid state light source to achieve a lighting unit with desired optical characteristics and can allow for consistent manufacturing of lamps and/or bulbs with the same or similar emission characteristics. This can help accelerate consumer satisfaction with lamps according to the present invention.

Figure 22:
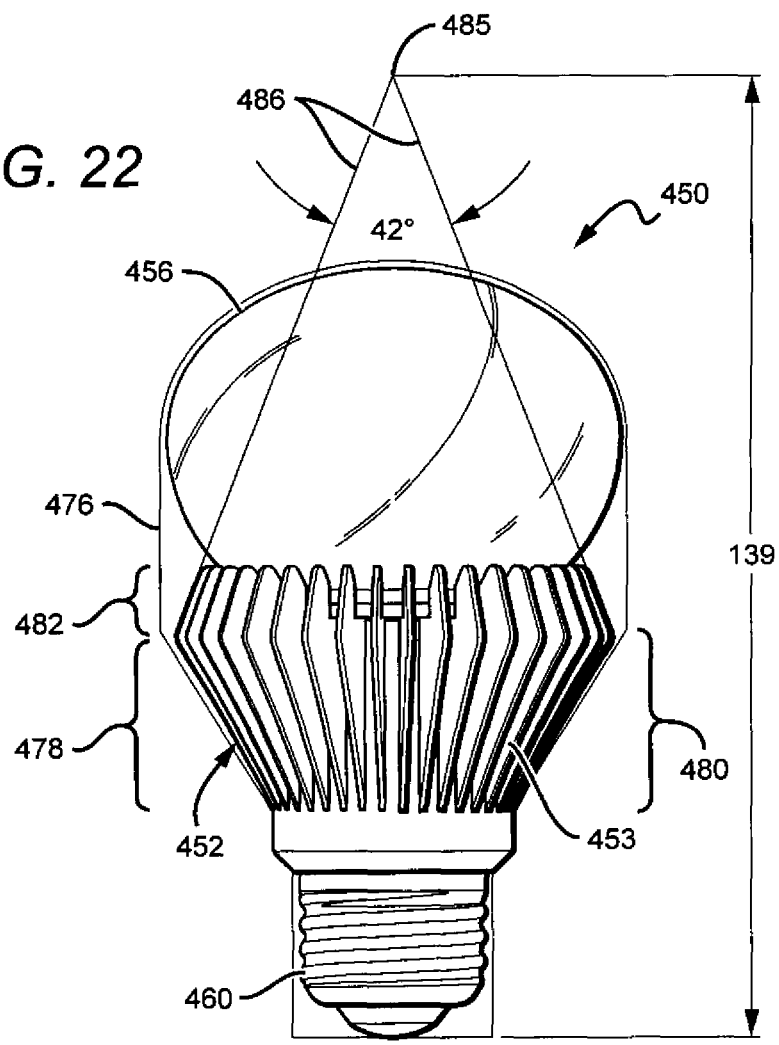
FIG. 22 is a side view of the embodiment shown in FIG. 19.

Referring now to FIG. 22, the lamp 450 is shown with the A19 envelope/profile 476 around it, with the lamp 450 being sized and shaped to fit within the A19 envelope 476. In particular the lower portion 478 of the head sink 452 is located, sized and shaped to fit in the angled middle portion 480 of the envelope. The shape and mounting of the diffuser dome, heat sink and Edison connector allows for the lamp to be sized so that its overall length is within the A19 envelope.

The upper portion 482 of the heat sink 452 is can have many different angles, with the angle shown providing the desired heat management, while still allowing for uniform emission compliant with ENERGY STAR® performance requirements. That is, the heat sink should provide the desired surface area to dissipate heat, while at the same time not blocking an excess of light emitting from the diffuser dome 456. In the embodiment shown, the angle can be measured from intersection point 485 above the heat sink where the lines 486 coincident with the angled surfaces intersect. The angle between the two lines 486 can be one way to measure the angle of the heat fin surfaces in the upper portion. In the embodiment shown, the intersection point 485 is 139 mm above the lowest point of the lamp 450. This corresponds to a measured angle of approximately 42 degrees between the upper angled surfaces 480. It is understood that many other measured angle can be used, such as angles of 60 degrees or less, 50 degrees or less, and/or degrees or less. In these different embodiments, the coincident lines intersect at different points above the heat sink 450. In other embodiments, different angle measurement methods can be used.

Some embodiments can be further characterized by the heat sink 452 not being wider than the diffuser dome 456 as shown. This further helps the lamp 450 stay within the A19 envelope, while still not blocking light from the diffuser dome 456.

As discussed above, lamp embodiments according to the present invention can be provide emission distributions in compliance with ENERGY STAR® requirements. Heat sink structures that enable ENERGY STAR® light compliance rely on a balance between number of fins, fin thickness, distance the fins extend up the profile of the emission surface (e.g. the diffuser dome), and the angle of the fin with respect to the vertical axis of the lamp. For embodiments arranged to fit ANSI standard profiles of A-type lamps (A19, A21, A23) while still providing sufficient heat sink area required for specified L70 lifetime, these parameters can directly impact the size, shape, number and location for the heat sink fins. For example, in the present embodiment of heat sink fins 453, the greater the distance the fins 453 extend up the profile of the emission surface, the greater the angle of the fins with respect to the vertical axis, and potentially the less obstructed area is allowable by the fins (e.g. fewer fins or thinner fins), which can allow the lamp 450 to achieve the ENERGY STAR® light distribution. It is understood that the heat fin embodiments shown in the attacked figures and discussed above are only some embodiments of heat sink fin arrangements that can meet the desired lamp emission and size requirements.

Figure 23:
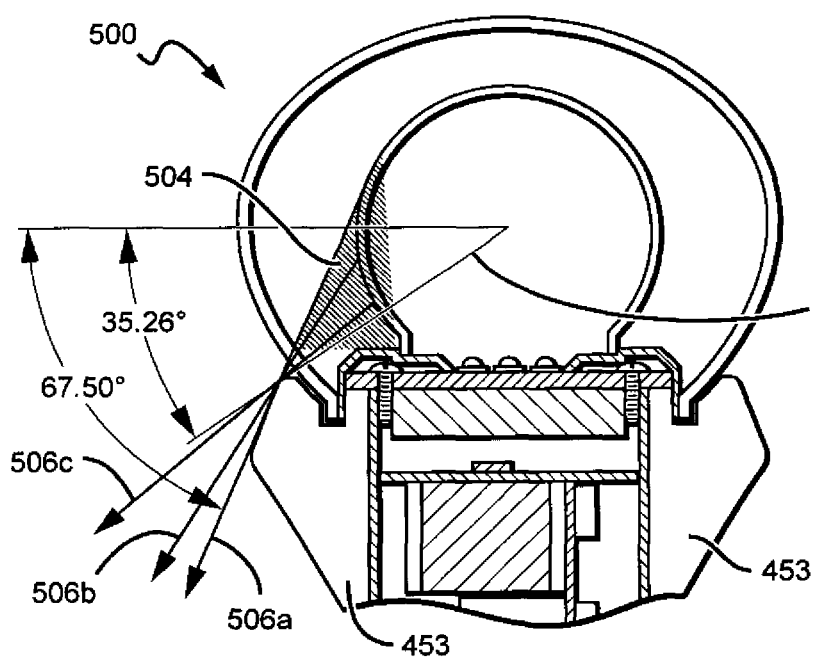
FIG. 23 is a sectional view of a portion of the lamp shown in FIG. 18.
Figure 24:
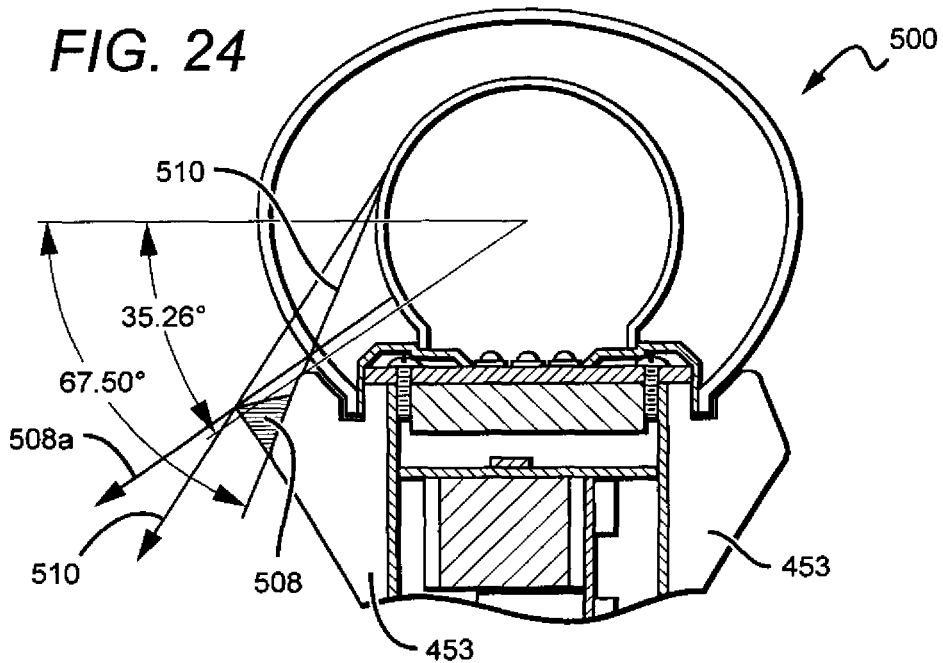
FIG. 24 is another sectional view a portion of the lamp shown in FIG. 18, with a different heat sink fin arrangement.

FIGS. 23 and 24 illustrate the impact the relative geometries of the lamp can have on the lamp's emission characteristics. Referring first to FIG. 23 a lamp 500 is shown that is similar to lamp 450 shown in FIGS. 19 through 22, and for the same or similar features the same reference numbers from above will be used in describing this figure.

Referring first to FIG. 23, a central line 502 is included from the center of the phosphor carrier 454 to the tip of the heat fin 453. If the lamp had a light source that acted more as a conventional filament emitting from the center of the lamp the light would emit from the center of the lamp in all direction, with some of the light emitting along central line 502. For light emitting in this fashion, adding surface area to the top area of the heat sink fin 453 would have little impact on the lamps emission profile. However, the phosphor globes as described herein acts more as volumetric emitters, with the entire surface emitting light in a roughly Lambertian fashion. The first triangle 504 illustrates a certain globe surface area. For emissions at angles less than 67.5 degrees below horizontal the light can at least partially be blocked by the heat sink fins 453 and may have little impact on the downward light distribution. For emission areas in the first triangle 504 that emit above the 67.5 degree angle, the light contributes to the overall lamp emission.

The first, second and third arrows 506a, 506b and 506c show different emission angles from different locations within the first triangle on the phosphor carrier 454 and can illustrate the impact more fin surface area can have on light emitting from these different locations. First arrow 506a illustrates light emitting from areas high on the phosphor carrier 454, with these areas having the greatest potential contribution to downward light distribution because of the geometry of the lamp 500 components, including but not limited to the phosphor carrier 454, diffuser dome 456 and heat sink 452. As shown by second and third arrows 506b and 506c, emission areas lower on the globe provide increasingly less contribution to the downward distribution of from the lamp. Emission from the lower portion of the globe contributes very little to downward emission from the lamp, while emission from higher on the globe contributes significantly to downward emission from the lamp 500.

Referring now to FIG. 24, the lamp 500 is shown with a second triangle 508 represents additional surface area added to the heat sink fins. For emission from the lower portion of the globe added surface area has little impact on the amount of light blocked by the heat fins 453, but emission from these areas contributes little to downward emission from the lamp. By contrast light emitted from higher on the glove is great impacted. As can be seen from arrow 510, the angles at which light can emit unimpeded is raised compared to first arrow 508a, which shows the upper angle from FIG. 23. This in turn reduces the amount of light that emits downward unimpeded. This can cause the lamp to miss the ENERGY STAR® emission characteristics. As an alternative, greater fin surface area can be added lower on the fins, but this can cause the size of the heat sink to exceed the A19 envelope. The angles provided in the different embodiments described above provide an angle to allow for the lamps to remain with the A19 envelope and with the desired uniform emission, while still allowing for heat sink fins with the necessary surface area to dissipate heat from the lamp.

It is understood that the diffuser dome can take many different shapes to provide the dynamic relationship between the phosphor carrier and the diffuser dome that result in the desired lamp emission characteristics. In some embodiments, the shape of the diffuser dome can be at least partially dependent on the shape of the phosphor carrier to achieve the desired lamp size and emission characteristics. FIGS. 25 through 28 show the dimensions for one embodiment of a squat diffuser dome 560 according to the present invention.

As discussed above and in the patent applications incorporated herein, diffuser domes according to the present invention can have different regions that scatter and transmit different amounts of light from the lamp light source to help produce the desired lamp emission pattern. In some embodiments, the different regions that scatter and transmit different amounts of light can be achieved by coating the diffuser dome with different amounts of diffusing materials at different regions. This can in turn modify the output beam intensity profile of a light source to provide improved emission characteristics as described above.

In some embodiments, the invention can rely on the combination of the diffuser element (i.e. diffuser dome) and diffuser coating scattering properties to produce the desired far-field intensity profile of the lamp. In different embodiments, the diffuser thickness and location may be dependent upon different factors such as the diffuser dome geometry, the light source arrangement, and the pattern of light emitting from the phosphor carrier.

In one embodiment, the diffuser dome can be arranged to convert the emission intensity profile of a two-dimensional LED, LED array, a flat phosphor conversion layer, or a three dimensional phosphor carrier, into a broader beam profile such as that associated with incandescent A19 lamp sizes and Department of Energy (DOE) ENERGY STAR® emission characteristics. This can enable the fabrication of LED-based efficient and cost effective replacements for conventional incandescent light bulbs.

Partial and/or non-uniform coatings have been found to produce broad beam intensity profiles which are desirable for incandescent replacement and satisfy ENERGY STAR® compliance for a uniform luminous intensity distribution. The non-uniform coatings can also offer the capability to achieve ENERGY STAR® compliance regardless of the heat sink and diffuser globe geometry. In general sense, the proper placement of a sufficient, partial coating on either a clear or uniformly-coated diffuser dome can manipulate the scattering and intensity profile of light photons passing through the diffuser dome to preferred angles. In the case of ENERGY STAR® compliance, one arrangement could be to redirect light photons such that the emission intensity at high angles is greater than 120°. These arrangements can provide for lamps using inexpensive two-dimensional light sources, while at the same time meeting the A19 size and ENERGY STAR® emission standards. The partial coatings of the embodiments can exist as coatings that cover a percentage of the diffuser and have only a singular lighter region, or the coatings can lie as a ring or band along a specific region of the diffuser.

Figure 29:
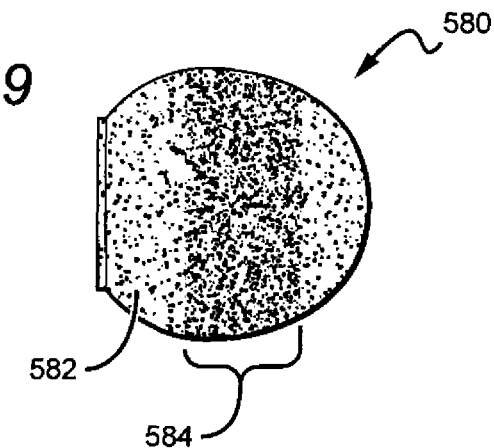
FIG. 29 is a side view of another embodiment of a diffuser dome according to the present invention.

FIG. 29 shows one embodiment of a diffuser dome 580 having a uniform coating 582 covering the majority of its surface and a thicker band coating 584 having more diffusing material. In the embodiment shown, the thicker band coating 584 spans around the diffuser dome 580 at a particular range of viewing angles, with the band coating 584 preventing more light from escaping in that specific region, causing it to depart at either higher or lower angles.

Figure 30:
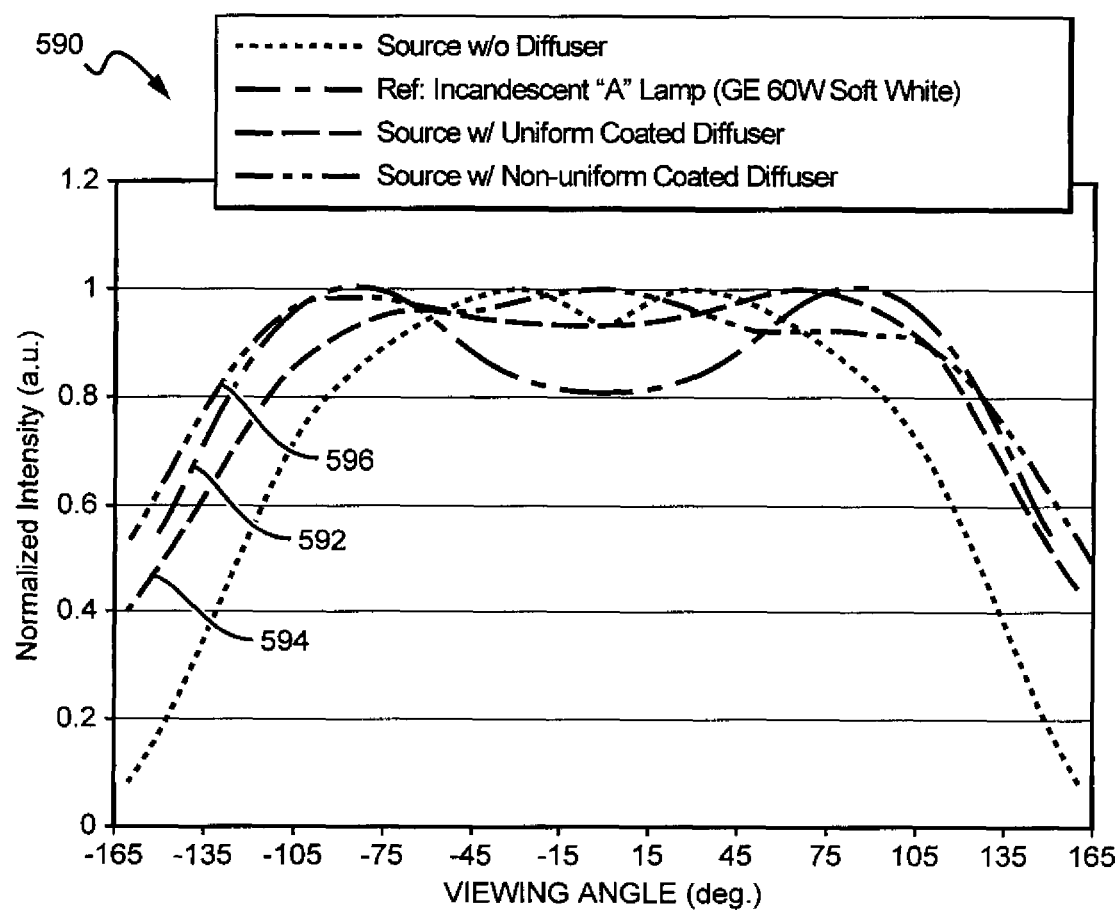
FIG. 30 is a graph showing comparison emission profiles for a lamp according to the present invention.

FIG. 30 is a graph 590 showing emission intensity profiles for a typical incandescent lamp 592, LED lamps with diffuser domes having uniform diffusion properties 594, and LED lamps with diffuser domes having bands (or areas) with more diffusing material 596. Profile 594 shows that the low viewing angle or axial light intensity of the uniform coating is lower than the intensities at angles between 45 to 105°. Referring now to profile 596, the intensities between 45 and 105° are less than that of the axial light. As a result of this intensity shift, the light is more intense at angles greater than 105°. The profile 596 shows that the lamps with non-uniform coatings can provide a luminous distribution that is equivalent to, and in some cases better than, an incandescent lamp.

Figures 31, 32, 34:
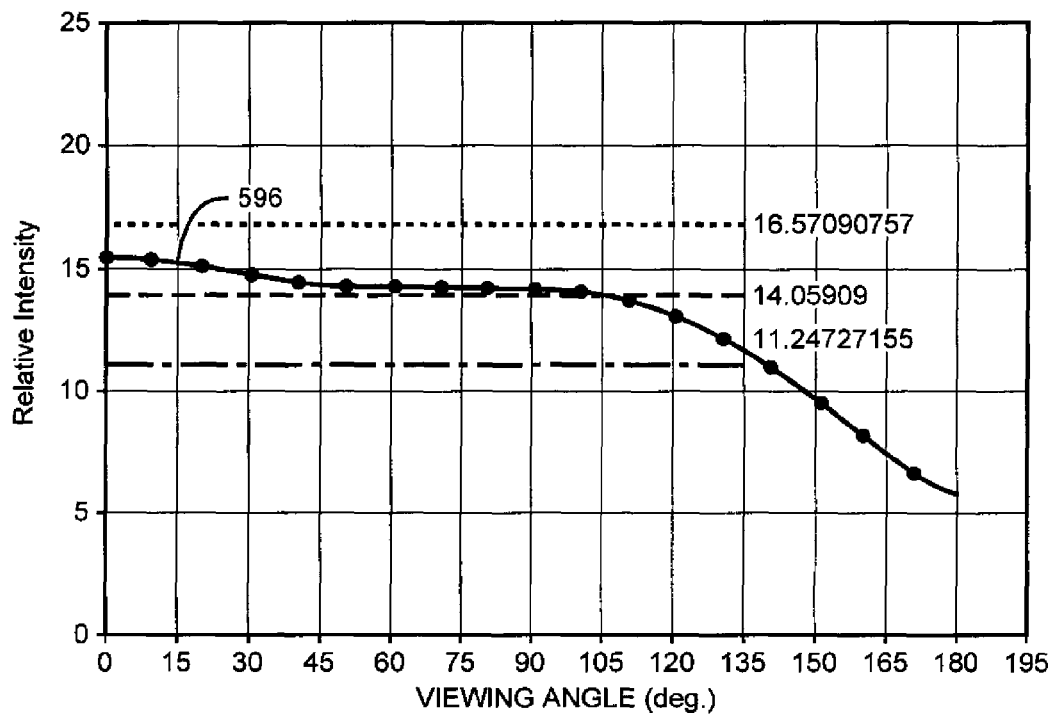
FIG. 31 is a graph showing an emission profile for a lamp according to the present invention.
FIG. 32 is a table showing the emission characteristics for one embodiment of a lamp according to the present invention.
FIG. 34 is a table showing the emission characteristics for one embodiment of a lamp according to the present invention.

FIG. 31 shows a closer view emission profile 596 shown in FIG. 30, showing the emission intensity versus viewing angle curves for LED lamp having a diffuser with a non-uniform coating (i.e. bands or areas of greater diffusers). FIG. 32 is a table listing the ENERGY STAR® compliance data in comparison to the performance of the lamp emitting the profile shown in FIG. 31. One of the factors relevant to ENERGY STAR® compliance is the minimum-to-average ratio. Some lamps with uniform coating can reach values near up to 26%. By comparison emission profile shown in FIG. 30 is able to achieve a value around 17% and complies with the "less than 20%" requirement. Placement of the band coating with additional diffusing material in the correct position on or within the diffuser dome, which is between 45 and 105°, in this case, provides the desired broadened emission profile.

Figure 33:
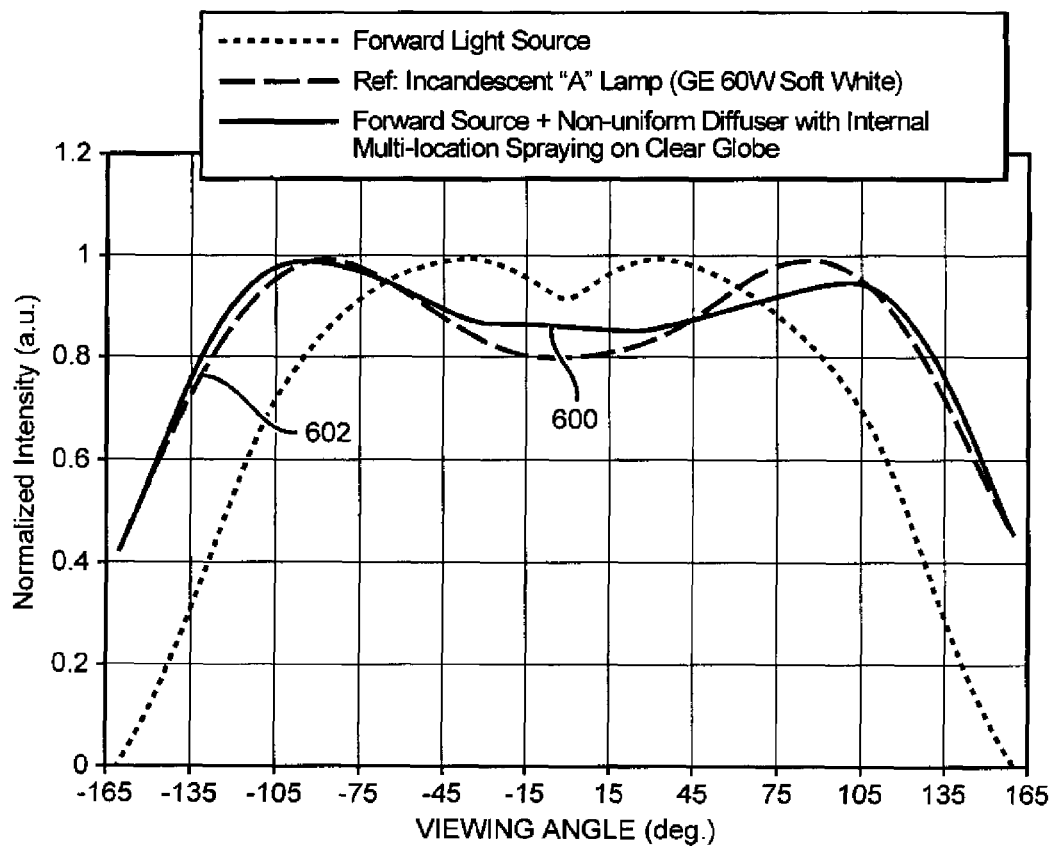
FIG. 33 is a graph showing emission profiles for certain lamp embodiments according to the present invention.

As mentioned above, the additional diffusers can be provided in many different bands or areas on the diffuser dome. Another embodiment of the invention comprises a non-uniform coating that can include multiple partial coats. The partial coats can be applied using any methods described in the present application, with one method being spray-coating onto a diffuser dome. One coat of an additional diffuser can be deposited near the middle of the diffuser globe, such as in a viewing angle range of approximately 45 to 105°. A second coat of an additional diffuser can then be deposited at the top of the diffuser dome to cover viewing angles of 0 to approximately 45°. These combined coatings block most of the light photons between 0 and 105°, allowing more light to pass through the diffuser dome at higher angles. Referring now to FIG. 33, the emission intensity profile 600 of a lamp having a diffuser dome with this two part coating compared to that of a profile 602 from a typical incandescent lamp. The profiles are very similar and as shown in the table 610 in FIG. 34 this two part non-uniform configuration achieves ENERGY STAR® compliance.

It is noted that experiments of some embodiments have shown that application of a thin first band offered some decrease in the minimum-to-average ratio (for example, 30% to 27%). By thickening the first band further the ratio was lowered more from 27% to 24%. It was also determined through experimentation that once the additional diffuser was applied at the top of the diffuser dome (in the range of approximately 0 to 45°), minimum-to-average ratios of 13 to 19% were achieved. This is only one of a number of different diffuser band arrangements that can be utilized according to the present invention to produce the desired lamp emission characteristics.

Different embodiments of diffusers according to the present invention can comprise varying scattering properties along any direction of the interior and exterior surfaces. In some embodiments the diffuser can comprise a transparent material (substrate) comprising a scattering film on its inside surface having varying scattering properties. Others can comprise a transparent globe having a scattering film on its interior and/or exterior surface and/or embedded within the diffuser element 580. The scattering films can have many different thicknesses depending at least partially on the film/binder material used, type of scattering material, and the density of scattering material in the film. In some embodiments, the transparent globe can have a scattering film thickness ranging from 0.1 to 1000 microns, with the film being on the interior and/or exterior of the globe. In embodiments using a cellulose-based binder, the film thicknesses can range from 0.1 to 100 microns, with the film being on the interior and/or exterior of the globe. In some embodiments using cellulose based binders, alumina based scattering particles can be used with some particles having a diameter of 0.1 to 4.0 microns.

In still other embodiments, the diffuser can comprise a transparent globe and the scattering films can comprise a methyl silicone based binder, with the films being on the interior and/or the exterior of the globe. The films in these embodiments can range in thickness from 0.1 to 700 microns, and can comprise scattering particles made of different materials. Some embodiments can comprise alumina scattering particles, with these embodiments having particle thicknesses in the range of 0.1 to 4.0 microns.

The thicknesses of the films can be greater than those described above and can utilize different binder and particle materials. As discussed, the diffuser dome and diffusers can comprise any materials described above and can be applied using any of the methods described above. In some embodiments the binder material for the diffuser can be an organic polymer, such as ethyl cellulose, nitrocellulose or poly(ethylene oxide) or an inorganic polymeric system, such as, silicone or ethyl polysilicate. In still other embodiments the binder can comprise an enamel. In some embodiments the diffuser can comprise scattering particles of alumina, silica, titania, titanium dioxide, or combinations thereof, with some embodiments having particle sizes ranging from 0.1 to 1.0 microns. In some embodiments the diffuser globe material may be a borosilicate glass, a soda lime glass or polycarbonate thermoplastic. One embodiment can comprise alumina particles approximately 0.5 to 0.8 microns in diameter dispersed in an ethyl cellulose binder. The solvents for a solution containing the alumina particles and ethyl cellulose can be ethyl acetate, ethyl alcohol, isopropyl alcohol, ethylene glycol monoethyl ether acetate and dibutyl phthalate. The ranges described above can be applicable to lamps with the desired emission efficiency, such as greater than 85%. Having thicker layers may result in lower lamp emission efficiency.

Figure 35:
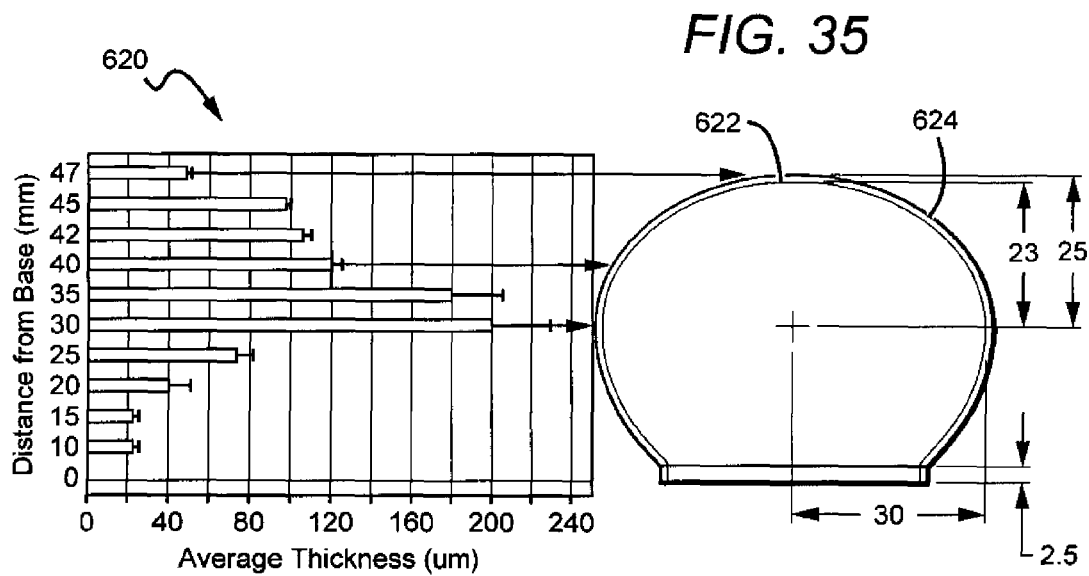
FIG. 35 is a graph showing one embodiment of diffuser layer thicknesses in a diffuser according to the present invention.

FIG. 35 is a graph 620 showing the thickness variations for one embodiment of a non-uniform scattering film 622 on the inside surface of a squat diffuser 624 as described above. The thicknesses of the film 622 are measured at different heights and range from approximately 21 microns and a height of 10 mm, to a thickness of approximately 200 microns and a height of 30 mm. The thickness of the film is approximately 44 microns at the top of the diffuser. It is understood that these thicknesses can vary depending on many factors as discussed above, such as diffuser shape, binder material, type of scattering particle, etc.

FIGS. 36 through 41 show different embodiments of diffuser domes having different diffuser layers arranged in different ways according to the present invention. These are only provided as examples and it is understood that many different arrangements can be provided pursuant to the present invention.

FIG. 36 shows a diffuser dome 630 having a uniform external diffuser coating 632, and an external partial coating 634 on the uniform coating 632. The partial coating 634 can be applied using many different methods such as by spraying or dip-coating. FIG. 37 shows a diffuser dome 640 with a uniform internal diffusing coating 642 and a partial external coating 644 that can be applied using different methods such as spraying or dip-coating. FIG. 38 shows a diffuser dome 650 having a uniform external coating 652, and a partial internal coating 654. FIG. 39 shows a diffuser dome 660 with a uniform external coating 662 and a partial internal coating 664 with varying thicknesses. FIG. 40 shows a clear or transparent diffuser dome 670 having a partial internal coating 672 having varying thicknesses. FIG. 41 also shows a clear or transparent diffuser dome 680 having multiple internal coatings 682,684 all or some of which can have varying thicknesses.

Although much of the discussion above is directed to varying the diffusing characteristics in areas of the diffuser dome, it is understood that the remote phosphor (phosphor carrier) can have areas of differing concentrations of conversion material. This can also assist in producing the desired emission profile as well as the desired light characteristics. In some embodiments, the phosphor carrier can have increased conversion material at or around the top, although the increase can be in other areas. It is also understood that like the diffuser coating, the conversion material can be applied in on the phosphor carrier in any of the different internal and external coating combinations described above.

For both the diffuser dome and the phosphor carrier, the coating material can be mixed in to the material that forms the dome. This can allow for fabrication of the diffuser dome or phosphor carrier without the stops of depositing a diffuser or phosphor material. Both can be formed to the desired shape with the desired material integral to the dome. This can be particularly applicable to forming a diffuser dome and/or phosphor carrier from readily available and easy to use materials such as plastics. This diffusing material and/or conversion material can also be arranged in different concentrations in different areas the dome material, and can also comprise different diffusing or conversion materials in different regions.

It is understood that the arrangements described above are equally applicable to lighting applications beyond the bulb-type described above. All or some of the features above are also applicable to area and tube-type lighting. That is, these different types of light can utilize remote conversion materials of different shape and remote diffusers of different shapes. As with the embodiments above, the remote diffusers can have areas with increased diffusing characteristics, or can have shapes that help produce the desire emission profile.

It is understood that lamps or bulbs according to the present invention can be arranged in many different ways beyond the embodiments described above. The embodiments above are discussed with reference to a remote phosphor but it is understood that alternative embodiments can comprise at least some LEDs with a conformal phosphor layer. This can be particularly applicable to lamps having light sources emitting different colors of light from different types of emitters. These embodiments can otherwise have some or all of the features described above.

Figure 42:
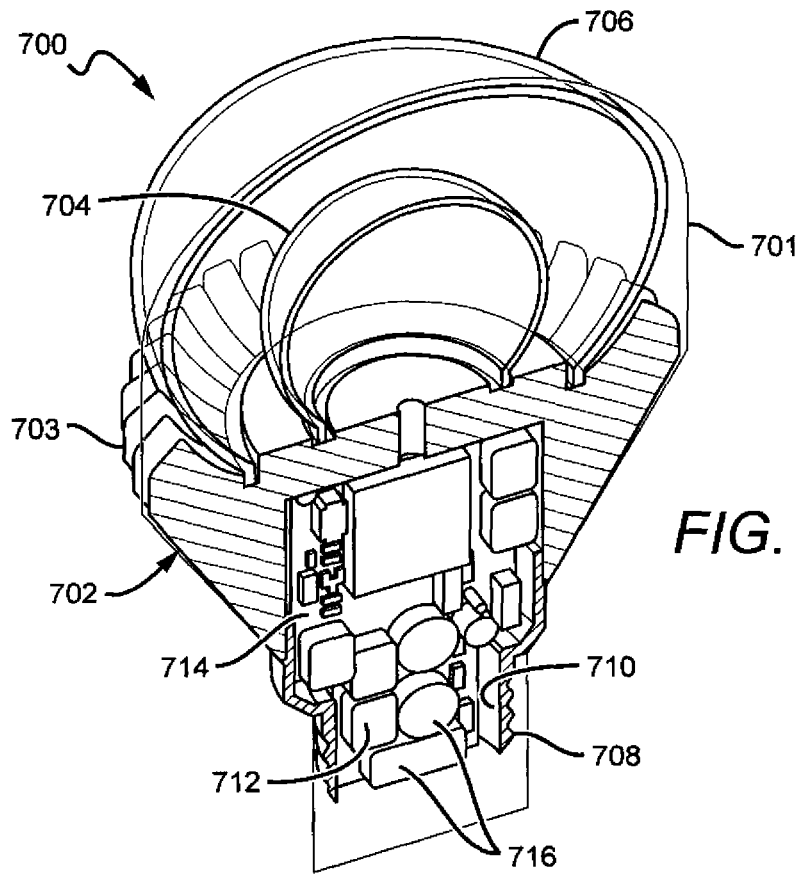
FIG. 42 is a sectional view of another embodiment of a lamp according to the present invention.
Figure 25:
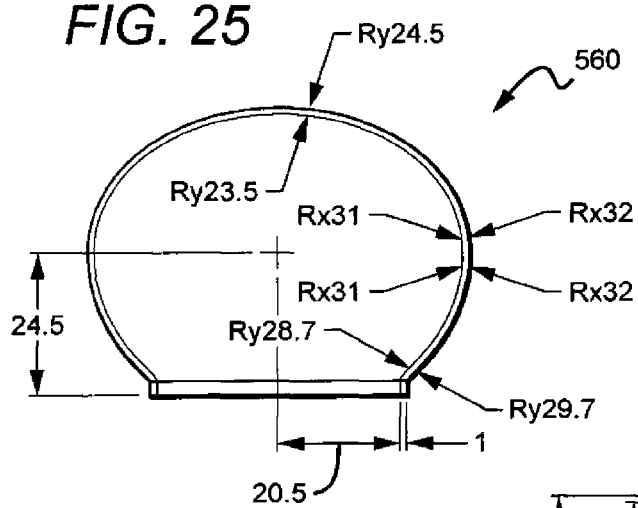
FIGS. 25 through 28 are side views of a diffuser dome according to the present invention.
Figure 26:
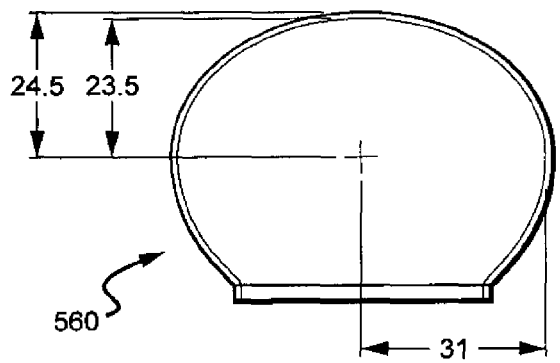
Figure 27:
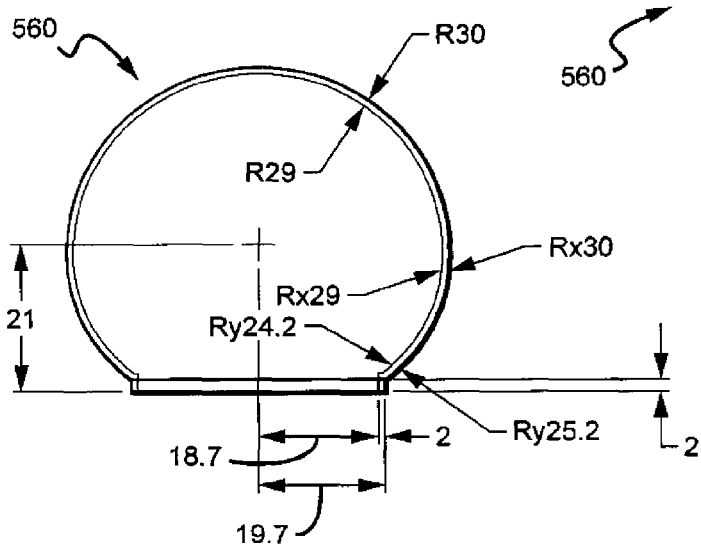
Figure 28:
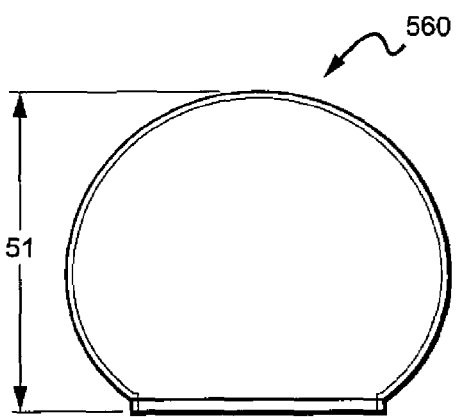

FIG. 42 shows another embodiment of a lamp 700 according to the present invention within an A19 size envelope 701. The lamp 700 utilizes a heat sink 702 with heat sink fins 703 similar to the ones shown above, but having a somewhat different shape. Like the embodiments above the lamp 700 comprises a dome shaped phosphor carrier 704 and dome shaped diffuser 706. Also like the embodiments above LEDs (not shown) can be mounted on a planar surface of the heat sink 702 with the phosphor carrier and diffuser 704, 706 over the LEDs. The LED chips, diffuser 706, and phosphor carrier 704 can comprise any of the shapes, arrangements and characteristics described above. The lamp 700 can also comprise a mounting mechanism 708 of the type to fit in conventional electrical receptacles, which in this embodiment can comprise a threaded portion for turning into to a standard Edison socket, as well as the alternative mounting mechanisms mentioned above. The dome shaped diffuser 706 can be many different shapes and sizes and in the embodiment shown is "squat shaped" and can have different amounts of diffuser in different sections as described above.

The heat sink 702 can comprise a cavity/housing 710 that houses the power supply unit 712. The power supply unit 710 can have any of the features, elements or characteristics of the power supply unit discussed above, including but not limited to a thermally conductive potting material. The power supply unit 712 comprises a PCB 714 holding a plurality of electronic elements 716 that convert the source power to an LED drive signal, and can also allow for dimming of light emitted by the lamp 700. The PCB 714 is shown in the lamp 700 as being mounted vertical within the cavity/housing 710, but it is understood that in other embodiments the PCB can be mounted in other ways and at different orientations, and the power supply unite 712 can comprise more than one PCB.

Although the present invention has been described in detail with reference to certain preferred configurations thereof, other versions are possible. For example, different features or aspects of LED bulbs of the present invention are described in relation to various embodiments, but it should be understood that each of those features or aspects could be incorporated and used analogously in relation to any of the embodiments described herein as would be understood by one of ordinary skill in the art. Therefore, the spirit and scope of the invention should not be limited to the versions described above.

We claim:

1. A lighting device, comprising:
  a light source on a first surface of a heat sink;
  a diffuser on a second surface of said heat sink and spaced apart from said light source, wherein said diffuser is widest at a point that is not adjacent to said heat sink, wherein said second surface is below said first surface; and
  a wavelength conversion material on said heat sink and between the light source and the diffuser and spaced apart from the light source and the diffuser, wherein said wavelength conversion element is widest at a point that is not adjacent to said heat sink, wherein said wavelength conversion material is a solid;
wherein said lighting device is configured to fit within the A19 envelope while emitting a substantially uniform emission pattern.

2. The lighting device of claim 1, emitting an emission pattern that complies with the ENERGY STAR® requirements.

3. The lighting device of claim 1, wherein said light source comprises one or more light emitting diodes.

4. The lighting device of claim 1, wherein said wavelength conversion material comprises a phosphor carrier comprising a thermally conductive material.

5. The lighting device of claim 1, wherein said diffuser comprises a diffuser dome.

6. The lighting device of claim 1, wherein said diffuser comprises a diffusing material, wherein said diffuser comprises one or more areas covered by a greater amount of diffusing material.

7. The lighting device of claim 1, wherein said diffuser disperses light from said light source and/or said wavelength conversion material.

8. The lighting device of claim 1, wherein said wavelength conversion material is three-dimensional.

9. The lighting device of claim 1, wherein said wavelength conversion material is planar.

10. The lighting device of claim 1, wherein said wavelength conversion material is substantially frusto-spherical.

11. The lighting device of claim 1, wherein said diffuser is substantially frusto-spherical.

12. The lighting device of claim 1, wherein said wavelength conversion material and said diffuser are substantially frusto-spherical such that said wavelength conversion material phosphor and diffuser provide a double-dome structure.

13. The lighting device of claim 1, wherein said diffuser at least partially conceals the appearance of said wavelength conversion material when said lighting device is not operating.

14. The lighting device of claim 13, wherein said diffuser exhibits a white appearance while said lighting device is not operating.

15. The lighting device of claim 1, providing a steady state lumen output of at least 800 lumens.

16. The lighting device of claim 1, providing a steady state lumen output of 65 lumens per watt or more.

17. The lighting device of claim 1, providing a steady state lumen output of 80 lumens per watt or more.

18. The lighting device of claim 16, operating from less than 10 watts.

19. The lighting device of claim 1, providing a steady state output of 800 lumens at 10 watts or less.

20. The lighting device of claim 1, further comprising a layer to cover electrically conducting features below said diffuser dome and wavelength conversion material.

21. The lighting device of claim 1, wherein said light sources are mounted on a printed circuit board that is mounted to said heat sink, further comprising a layer to cover electrically conducting features on said PCB.

22. The lighting device of claim 1, emitting light with a color rendering index (CRI) of greater than 80.

23. The lighting device of claim 1, emitting light with a color rendering index (CRI) of greater than 90.

24. The lighting device of claim 1, wherein the light emitted from the diffuser comprises a spatial uniformity that is within 20% of a mean value within a range of viewing angles.

25. The lighting device of claim 24, wherein said range of viewing angles is 0 to 135°.

26. The lighting device of claim 24, comprising greater than 5% of total luminous flux in the 135 to 180° viewing angles.

27. The lighting device of claim 1, wherein the lower edge of a frusto-spherical phosphor carrier is higher than the lower edge of said diffuser dome.

28. A lighting device, comprising:
a light source on a heat sink;
a diffuser on said heat sink and spaced apart from said light source; and
a wavelength conversion material on said heat sink and between the light source and the diffuser and spaced away from the light source and the diffuser, wherein said heat sink comprises a plurality of heat fins each comprising a lower angled portion that angles out from the central axis of said lighting device, and an upper portion that angles back toward said central axis and begins below where said fins meet the rest of said lighting device, emitting a substantially uniform emission pattern.

29. The lighting device of claim 28, configured to fit an A19 size envelope.

30. The lighting device of claim 28, wherein said diffuser comprises a diffuser dome and said heat fins do not extend beyond outer lateral edge of said diffuser dome.

31. The lighting device of claim 28, wherein said wavelength conversion material and said diffuser are substantially frusto-spherical such that said phosphor carrier and diffuser form a double-dome structure.

32. The lighting device of claim 28, wherein said heat sink comprise 20 to 60 heat fins.

33. The lighting device of claim 28, wherein said heat sink comprises 30 to 50 heat fins.

34. The lighting device of claim 28, wherein said heat sink comprises approximately 38 heat fins.

35. The lighting device of claim 28, wherein said lower section comprises an angle of 150° or more from said lighting device central axis.

36. The lighting device of claim 28, wherein said upper section comprises a measured angle of 60° or less.

37. The lighting device of claim 28, wherein said upper section comprises a measured angle of 50° or less.

38. The lighting device of claim 28, wherein said upper section comprises a measured angle of approximately 42°.

39. A solid state lamp, comprising solid state light source emitting light with an efficacy of 80 lumens per watt or more, and fitting within an A19 size envelope;
wherein said lamp further comprises a heat sink;
wherein said lamp comprises a diffuser on said heat sink;
wherein said heat sink comprises a plurality of fins, wherein each of said fins comprises an upper portion angling away from said lamp and a lower portion angling toward said lamp.

40. A solid state lamp, comprising solid state light source emitting light with an efficacy of 80 lumens per watt or more, and comprising an emission pattern compliant with ENERGY STAR® performance requirements;
said lamp further comprising a diffuser on a heat sink and spaced apart from said light source and a conversion material between said light source and said diffuser, wherein said diffuser is widest at a point that is not adjacent to said heat sink;
wherein said heat sink comprises a plurality of fins, each of said fins comprising an angled upper surface angling away from said heat sink and an angled lower surface angling back toward said heat sink;

wherein no two angled upper surfaces form an angle of more than 45°.

41. A solid state lamp, comprising solid state light source emitting light with an efficacy of 80 lumens per watt or more from 10 watts or less;
   said lamp further comprising a diffuser on a heat sink and spaced apart from said light source and a conversion material between said light source and said diffuser, wherein said diffuser is widest at a point that is not adjacent to said heat sink;
   wherein said heat sink comprises a plurality of fins comprising a first section angled away from said solid state lamp connected to a second section angled toward said solid state lamp.

42. A solid state lamp, comprising solid state light source emitting light with an efficacy of 80 lumens per watt or more, and comprising a color temperature of 3000 Kelvin or less;
   said lamp further comprising a diffuser on a heat sink wherein said diffuser is widest at a point that is not adjacent to said heat sink;
   said lamp further comprising a wavelength conversion element on said heat sink wherein said wavelength conversion element is widest at a point that is not adjacent to said heat sink, wherein said wavelength conversion material is a solid;
   wherein said solid state lamp comprises one or more light sources;
   wherein said one or more light sources emit a single color of light;
   wherein said solid state lamp emits light having a normalized intensity of greater than 0.8 at angles greater than +120 degrees and less than −120 degrees, wherein said angles are measured from a point on said diffuser, said point on a side of said diffuser opposite said heat sink.

43. The lamp of claim 42, emitting light comprising a color temperature of 2700 Kelvin or less.

44. A solid state lamp, comprising solid state light source emitting light with an efficacy of 80 lumens per watt or more, and comprising a lifetime of greater than 25,000 hours or more at an operating temperature of 25° C. or more;
   said lamp further comprising a diffuser on a heat sink wherein said diffuser is widest at a point that is not adjacent to said heat sink;
   said lamp further comprising a wavelength conversion element on said heat sink wherein said wavelength conversion element is a solid element which is widest at a point that is not adjacent to said heat sink;
   wherein said solid state lamp emits light having a normalized intensity of greater than 0.8 at angles greater than +120 degrees and less than −120 degrees, wherein said angles are measured from a point on said diffuser, said point on a side of said diffuser opposite said heat sink;
   wherein said solid state lamp comprises one or more light sources;
   wherein said one or more light sources emit a single color of light.

45. A solid state lamp, comprising solid state light source emitting light with an efficacy of 80 lumens per watt or more, and comprising a lifetime of 50,000 hours or more at an operating temperature of 25° C. or more;
   said lamp further comprising a diffuser on a heat sink wherein said diffuser is widest at a point that is not adjacent to said heat sink;
   said lamp further comprising a wavelength conversion element on said heat sink wherein said wavelength conversion element is a solid element which is widest at a point that is not adjacent to said heat sink;
   wherein said solid state lamp emits light having a normalized intensity of greater than 0.8 at angles greater than +120 degrees and less than −120 degrees, wherein said angles are measured from a point on said diffuser, said point on a side of said diffuser opposite said heat sink;
   wherein said solid state lamp comprises one or more light sources;
   wherein said one or more light sources emit a single color of light.

* * * * *